US008941162B2

(12) United States Patent  
Sukekawa

(10) Patent No.: US 8,941,162 B2  
(45) Date of Patent: Jan. 27, 2015

(54) SEMICONDUCTOR DEVICE, METHOD FOR FORMING THE SAME, AND DATA PROCESSING SYSTEM

(75) Inventor: Mitsunari Sukekawa, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 0 days.

(21) Appl. No.: 13/270,574

(22) Filed: Oct. 11, 2011

(65) Prior Publication Data

US 2012/0091518 A1    Apr. 19, 2012

(30) Foreign Application Priority Data

Oct. 13, 2010    (JP) ................................. 2010-230746

(51) Int. Cl.
*H01L 27/108* (2006.01)
*H01L 49/02* (2006.01)

(52) U.S. Cl.
CPC .... *H01L 27/10814* (2013.01); *H01L 27/10823* (2013.01); *H01L 27/10855* (2013.01); *H01L 27/10876* (2013.01); *H01L 27/10885* (2013.01); *H01L 27/10891* (2013.01); *H01L 27/10894* (2013.01); *H01L 27/10897* (2013.01); *H01L 28/91* (2013.01)
USPC ............... 257/296; 257/306; 257/E27.088; 257/E27.091; 438/253

(58) Field of Classification Search
None
See application file for complete search history.

(56) References Cited

U.S. PATENT DOCUMENTS

| | | | |
|---|---|---|---|
| 6,303,429 B1 * | 10/2001 | Ishibashi et al. | 438/244 |
| 6,734,060 B2 * | 5/2004 | Nakamura et al. | 438/253 |
| 6,770,535 B2 | 8/2004 | Yamada et al. | |
| 7,473,952 B2 * | 1/2009 | Manger et al. | 257/296 |
| 7,772,632 B2 | 8/2010 | Haller et al. | |
| 8,053,307 B2 * | 11/2011 | Seo et al. | 438/238 |
| 8,063,425 B2 | 11/2011 | Kim et al. | |
| 8,450,786 B2 | 5/2013 | Kim et al. | |
| 8,603,904 B2 | 12/2013 | Matsui | |
| 8,766,356 B2 | 7/2014 | Kim et al. | |
| 2001/0025973 A1 * | 10/2001 | Yamada et al. | 257/296 |
| 2004/0262661 A1 * | 12/2004 | Kim et al. | 257/303 |
| 2006/0244024 A1 * | 11/2006 | Manger et al. | 257/296 |
| 2008/0284029 A1 * | 11/2008 | Kim et al. | 257/758 |
| 2008/0296674 A1 * | 12/2008 | Graham et al. | 257/334 |
| 2010/0327407 A1 * | 12/2010 | Kang | 257/532 |
| 2011/0143509 A1 * | 6/2011 | Fujimoto | 438/270 |

FOREIGN PATENT DOCUMENTS

| | | |
|---|---|---|
| JP | 11-307626 | 11/1999 |
| JP | 2001-210801 | 8/2001 |
| JP | 2003-23104 | 1/2003 |
| JP | 2003-158201 | 5/2003 |
| JP | 2008-300843 | 12/2008 |
| JP | 2009-76912 | 4/2009 |
| JP | 2009-231799 | 10/2009 |
| JP | 2010-502008 | 1/2010 |

* cited by examiner

*Primary Examiner* — Julio J Maldonado
*Assistant Examiner* — Molly Reida
(74) *Attorney, Agent, or Firm* — Young & Thompson

(57) ABSTRACT

A semiconductor device includes a semiconductor substrate having a first groove, a word line in the first groove, and a buried insulating film in the first groove. The buried insulating film covers the word line. The buried insulating film comprises a silicon nitride film.

20 Claims, 60 Drawing Sheets

SEMICONDUCTOR DEVICE, METHOD FOR FORMING THE SAME, AND DATA PROCESSING SYSTEM

BACKGROUND OF THE INVENTION

1. Field of the Invention

The present invention generally relates to a semiconductor device, to a method for forming a semiconductor device, and to a data processing system.

Priority is claimed on Japanese Patent Application No. 2010-230746, filed Oct. 13, 2010, the content of which is incorporated herein by reference.

2. Description of the Related Art

In recent years, large-scale integrated (referred to as LSI hereinafter) circuits, in which a large number of MOS transistors are integrated onto one semiconductor chip have been adopted in the main parts of computers and electrical equipment. Among LSI devices, elements such as DRAMs (dynamic random-access memories) have seen a rapid shrinking of element size, accompanied by progressively shorter MOS transistor gate lengths. By integrating a large number of MOS transistors in a memory cell region 101, the distance between adjacent MOS transistors has also become short, and the shorter the gate length becomes, the greater is a deterioration of transistor characteristics by the short channel effect of the MOS transistor.

Japanese Unexamined Patent Application, First Publication, No. JP-A-2008-300843 discloses that a MOS transistor (buried-gate MOS transistor) is formed to have a word line that functions as a gate electrode is buried into a groove formed within a semiconductor substrate in order to suppress this type of MOS transistor short-channel effect. The upper part of the word line on the inside of the groove is buried with an insulating film. Because in a buried-gate MOS transistor there is an impurity diffusion layer at the surface part of the active region between word lines, it is possible to establish physically an effective channel length (gate length) having a given length. For this reason, buried-gate MOS transistors have structures that can be applied to the reduction of the size of cell transistors in DRAMs.

Japanese Unexamined Patent Application, First Publication, No. JP-A-11-307626 discloses a method of filling the inside of a groove with a silicon oxide film using the spin-coating method, which is known as a method for burying the inside of a groove with an insulating film.

SUMMARY

In one embodiment, a semiconductor device may include, but is not limited to, a semiconductor substrate having a first groove, a word line in the first groove, and a buried insulating film in the first groove. The buried insulating film covers the word line. The buried insulating film includes a silicon nitride film.

In another embodiment, a semiconductor device may include, but is not limited to, a semiconductor substrate, a first word line, a first buried insulating film, and a first insulating film. The semiconductor substrate has a first groove. The first word line is disposed in the first groove. The first buried insulating film is disposed in the first groove. The first buried insulating film covers the first word line. The first insulating film is disposed over the first buried insulating film. A material of the first insulating film is different from a material of the first buried insulating film.

In still another embodiment, a semiconductor device may include, but is not limited to, a semiconductor substrate and a plurality of memory cells. The semiconductor substrate has a memory cell region. The memory cell region includes a plurality of active regions and a plurality of buried gate grooves extending across the plurality of active regions. Each of the memory cells includes a capacitor and a transistor coupled to the capacitor. The transistor includes first and second diffusion regions, a gate electrode, a buried insulating film, a contact plug, and a bit line. The first and second diffusion regions are disposed in the active regions. The gate electrode is disposed in the buried gate groove. The gate electrode is disposed between the source and drain regions. The gate electrode has an upper surface which is lower than top surfaces of the first and second diffusion regions. The buried insulating film includes a silicon nitride film. The buried insulating film is disposed in the buried gate groove. The buried insulating film coves the gate electrode. The contact plug is disposed over the semiconductor substrate. The contact plug is coupled to the capacitor. The contact plug is coupled to the first diffusion region. The contact plug is in contact with the buried insulating film. The bit line is disposed over the semiconductor substrate. The bit line is coupled to the second diffusion region. The contact plug is in contact with the buried insulating film.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Figure 1:
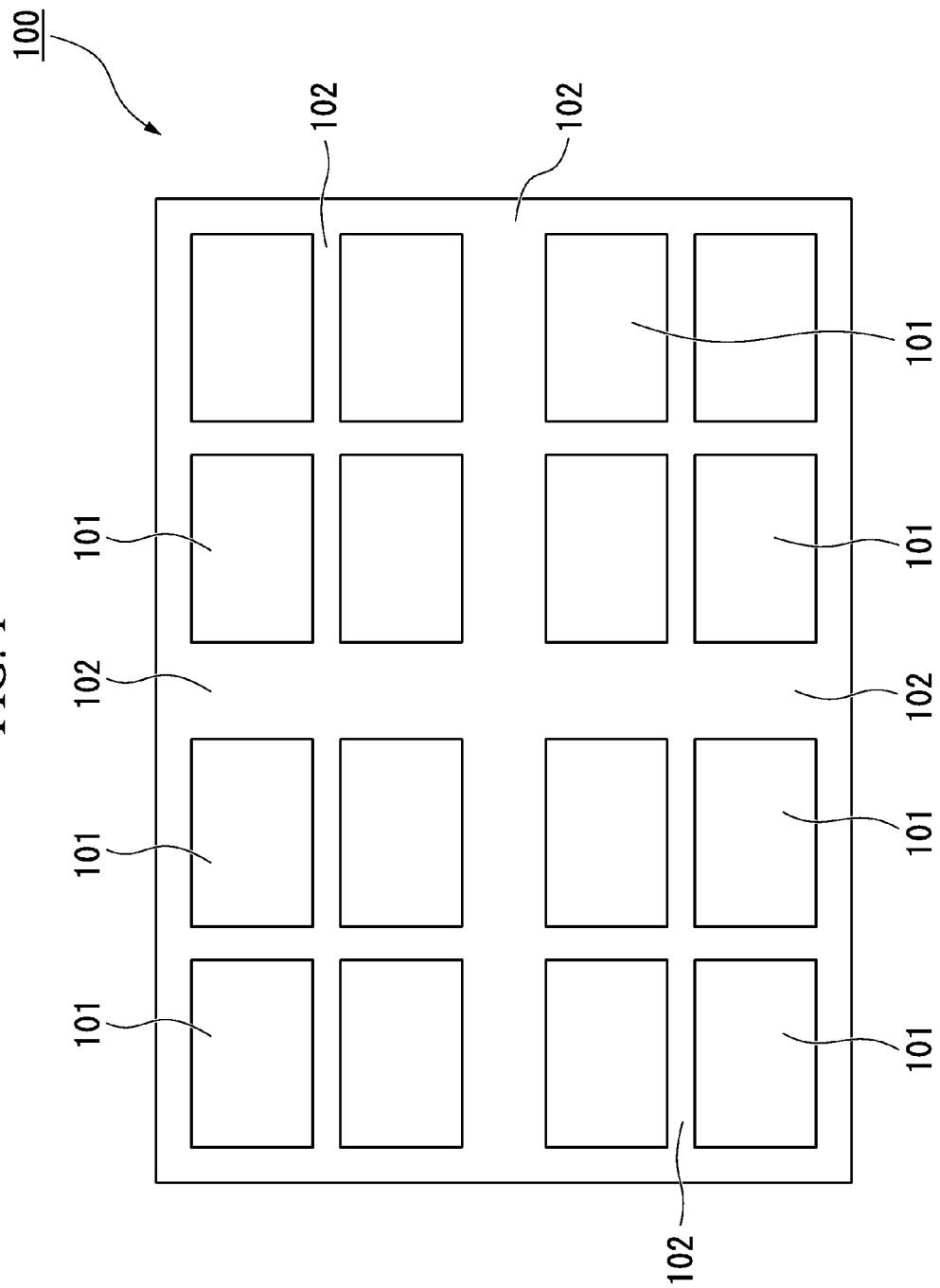
FIG. 1 is a fragmentary plan, view illustrating a semiconductor device in accordance with one embodiment of the present invention.

Before describing the present invention, the related art will be explained in order to facilitate the understanding of the present invention.

The inventor of the present application investigated the manufacturing process in the case in which a buried-gate MOS transistor having a constitution such as shown in Japanese Unexamined Patent Application, First Publication, No. JP-A-2008-300843 is formed as a transistor in a memory cell. It was found that shorts tend to occur between a contact plug that is connected to an impurity diffusion layer and a word line. A contact plug that is connected to the impurity diffusion layer is normally formed as follows. A contact aperture is formed by dry etching. Then, a wet etching process using hydrofluoric acid is done to remove a naturally formed oxide layer and the like, to show the clean bottom surface of the contact aperture. A conductor is buried into the inside of the contact aperture. When forming the contact aperture, because an interlayer insulating film (silicon oxide) that is exposed at the side surface part of the contact aperture is also exposed to chemicals for the wet etching process, there can be a large amount of etching of parts of the interlayer insulating film when the contact aperture is formed. If the interlayer insulating film is greatly etched, this can expose the upper surface of the word line, and can cause shorting between the contact plug and the word line.

Also, although the insulating film made of silicon oxide that is formed by the spin-coating method as in Japanese Unexamined Patent Application. First Publication, No. JP-A-11-307626 can easily fill between microfine gaps, it is easily etched by wet etching using hydrofluoric acid or the like. For this reason, with the method disclosed in Japanese Unexamined Patent Application, First Publication, No. JP-A-11-307626, if the upper part of a word line on the inside of a groove is buried by an insulating film, there is a tendency for a large amount of etching of the insulating film to occur when forming the contact aperture.

One method that can be envisioned for preventing the etching of the insulating film that is made of a silicon oxide film is the method of forming the insulating film using plasma CVD. However, although the etching speed of a silicon oxide film formed by plasma CVD is slower than that of a silicon oxide film formed by spin coating, it is not possible to prevent exposure of the word line completely.

For this reason, with the method for manufacturing a buried-gate MOS transistor in the related art, a reduced reliability of the semiconductor device and reduced manufacturing yield are concerned.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a semiconductor device may include, but is not limited to, a semiconductor substrate having a first groove, a word line in the first groove, and a buried insulating film in the first groove. The buried insulating film covers the word line. The buried insulating film includes a silicon nitride film.

In some cases, the semiconductor device may further include, but is not limited to, a first diffusion region in the semiconductor substrate. The first diffusion region is adjacent to the buried insulating film. A top surface of the first diffusion region is higher than the word line.

In some cases, the semiconductor device may include, but is not limited to, a top surface of the buried insulating film being substantially the same level as the top surface of the first diffusion region.

In some cases, the semiconductor device may further include, but is not limited to, a second diffusion region in the semiconductor substrate. The second diffusion region is adjacent to the buried insulating film. The buried insulating film is disposed between the first and second diffusion regions.

In some cases, the semiconductor device may further include, but is not limited to, a contact plug coupled to the first diffusion region. The contact plug partially overlaps the buried insulating film.

In some cases, the semiconductor device may include, but is not limited to, the contact plug being in contact with a part of the first diffusion region and with a first part of the buried insulating film.

In some cases, the semiconductor device may further include, but is not limited to, a capacitor coupled to the contact plug.

In some cases, the semiconductor device may further include, but is not limited to, a bit line coupled to the second diffusion region, the bit line partially overlapping the buried insulating film.

In some cases, the semiconductor device may include, but is not limited to, the bit line being in contact with a part of the second diffusion region and with a second part of the buried insulating film.

In some cases, the semiconductor device may include, but is not limited to, the silicon nitride film including first films on inner wall surfaces of the groove and a second film between the first films.

In another embodiment, a semiconductor device may include, but is not limited to, a semiconductor substrate, a first word line, a first buried insulating film, and a first insulating film. The semiconductor substrate has a first groove. The first word line is disposed in the first groove. The first buried insulating film is disposed in the first groove. The first buried insulating film covers the first word line. The first insulating film is disposed over the first buried insulating film. A material of the first insulating film is different from a material of the first buried insulating film.

In some cases, the semiconductor device may further include, but is not limited to, a bit line, a contact plug, a second insulating film, and a third insulating film. The bit line is disposed over the semiconductor substrate. The contact plug is disposed over the semiconductor substrate. The second insulating film and a third insulating film are disposed over the first buried insulating film. The first, second, and third insulating films are positioned between the bit line and the contact plug. At least one of the bit line and the contact plug partially overlaps the first buried insulating film. A material of the second insulating film and the third insulating film is the same as the material of the first buried insulating film.

In some cases, the semiconductor device may further include, but is not limited to, a second word line, a second buried insulating film, a fourth insulating film, and a fifth insulating film. The second word line is disposed in a second groove. The substrate has the second groove. The second buried insulating film is disposed in the second groove. The second buried insulating film covers the second word line. The fourth insulating film is disposed over the buried insulating film. The fifth insulating film is disposed over the fourth insulating film. A material of the fourth insulating film and the fifth insulating film is the same as a material of the second buried insulating film.

In some cases, the semiconductor device may further include, but is not limited to, a bit line, a contact plug, a second insulating film, and a third insulating film. The bit line is disposed over the semiconductor substrate. The contact plug is disposed over the semiconductor substrate. The second insulating film and the third insulating film are positioned between the bit line and the contact plug. The first insulating film is disposed between bit line and the contact plug. At least one of the bit line and the contact plug partially overlaps the buried insulating film on the first word line. A material of the second insulating film and the third insulating film is the same as the material of the first buried insulating film.

In some cases, the semiconductor device may include, but is not limited to, the following elements. The first buried insulating film and the second buried insulating film are made of the same material comprising silicon nitride. The first insulating film comprises a silicon oxide. The second insulating film and the fourth insulating film are made of the same material comprising silicon nitride. The third insulating film and the fifth insulating film are made of the same material comprising silicon nitride.

In still another embodiment, a semiconductor device may include, but is not limited to, a semiconductor substrate and a plurality of memory cells. The semiconductor substrate has a memory cell region. The memory cell region includes a plurality of active regions and a plurality of buried gate grooves extending across the plurality of active regions. Each of the memory cells includes a capacitor and a transistor coupled to the capacitor. The transistor includes first and second diffusion regions, a gate electrode, a buried insulating film, a contact plug, and a bit line. The first and second diffusion regions are disposed in the active regions. The gate electrode is disposed in the buried gate groove. The gate electrode is disposed between the source and drain regions. The gate electrode has an upper surface which is lower than top surfaces of the first and second diffusion regions. The buried insulating film includes a silicon nitride film. The buried insulating film is disposed in the buried gate groove. The buried insulating film coves the gate electrode. The contact plug is disposed over the semiconductor substrate. The contact plug is coupled to the capacitor. The contact plug is coupled to the first diffusion region. The contact plug is in contact with the buried insulating film. The bit line is disposed over the semiconductor substrate. The bit line is coupled to the second diffusion region. The contact plug is in contact with the buried insulating film.

In some cases, the semiconductor device may include, but is not limited to, a top surface of the silicon nitride film being substantially the same level as top surfaces of the first and second diffusion regions.

In some cases, the semiconductor device may include, but is not limited to, the silicon nitride film including first films on inner wall surfaces of the groove and a second film between the first films.

In some cases, the semiconductor device may further include, but is not limited to, a peripheral circuit region adjacent to the memory cell region and a planer MOS transistor in the peripheral circuit region. The planer MOS transistor includes a peripheral gate insulating film over the peripheral circuit region and a peripheral gate electrode on the peripheral gate insulating film.

In some cases, the semiconductor device may further include, but is not limited to, an interlayer insulating film, a contact pad, and a local, wiring. The interlayer insulating film is disposed over the memory cell region and the peripheral circuit region. The contact pad is disposed in the interlayer insulating film over the memory cell region. The contact pad couples the capacitor and the contact plug. The local wiring is disposed over the interlayer insulating film over the peripheral circuit region. The local wiring and the contact pad are made of the same conductive material.

Hereinafter, a semiconductor device according to an embodiment of the invention will be described in detail with reference to the drawings. As a convenience, in assisting an understanding of the features, the drawings used in the following descriptions sometimes show such features enlarged, and the dimensional ratios and the like of constituent elements are not necessarily the same as in actuality. Also, the raw materials and dimensions and the like given as examples in the following descriptions are only examples, and the present invention is not restricted thereto, it being possible to embody arbitrarily variations within a scope that does not change the essence thereof.

First Embodiment

With reference to FIG. 1, a semiconductor chip that is an example of a semiconductor device (DRAM) 100 according to a first embodiment will be described. FIG. 1 is a fragmentary plan view illustrating a semiconductor device in accordance with one embodiment of the present invention. Because FIG. 1 is a plan view for the purpose of describing the positional relationship between memory cell regions 101 and a peripheral circuit region 102 of the semiconductor device 100, the illustrations of specific constituent elements of the semiconductor device 100 have been omitted.

As shown in FIG. 1, the semiconductor device 100 is generally constituted by the memory cell regions 101 and the peripheral circuit region 102 that is formed so as to surround the memory cell regions 101.

The memory cell regions 101 are regions in which a plurality of memory cells that include MOS transistors and capacitors to be described later are arranged in accordance with a prescribed rule.

The peripheral circuit region 102 is a region in which, for example, circuit blocks such as an input/output circuit which input/output signals from/to the outside of the semiconductor chip are disposed. Specifically, the circuit blocks include the provision of circuit blocks other than the memory cell array, such as a sense amplifier circuit, a word line drive circuit, a decoder circuit, and the input/output circuits which input/output signals from/to the outside of the semiconductor chip, which are not shown. The peripheral circuit region 102 is formed so as to surround each memory region 101.

By virtue of this constitution, the semiconductor device 100 functions as a DRAM (dynamic random-access memory).

Figure 2:
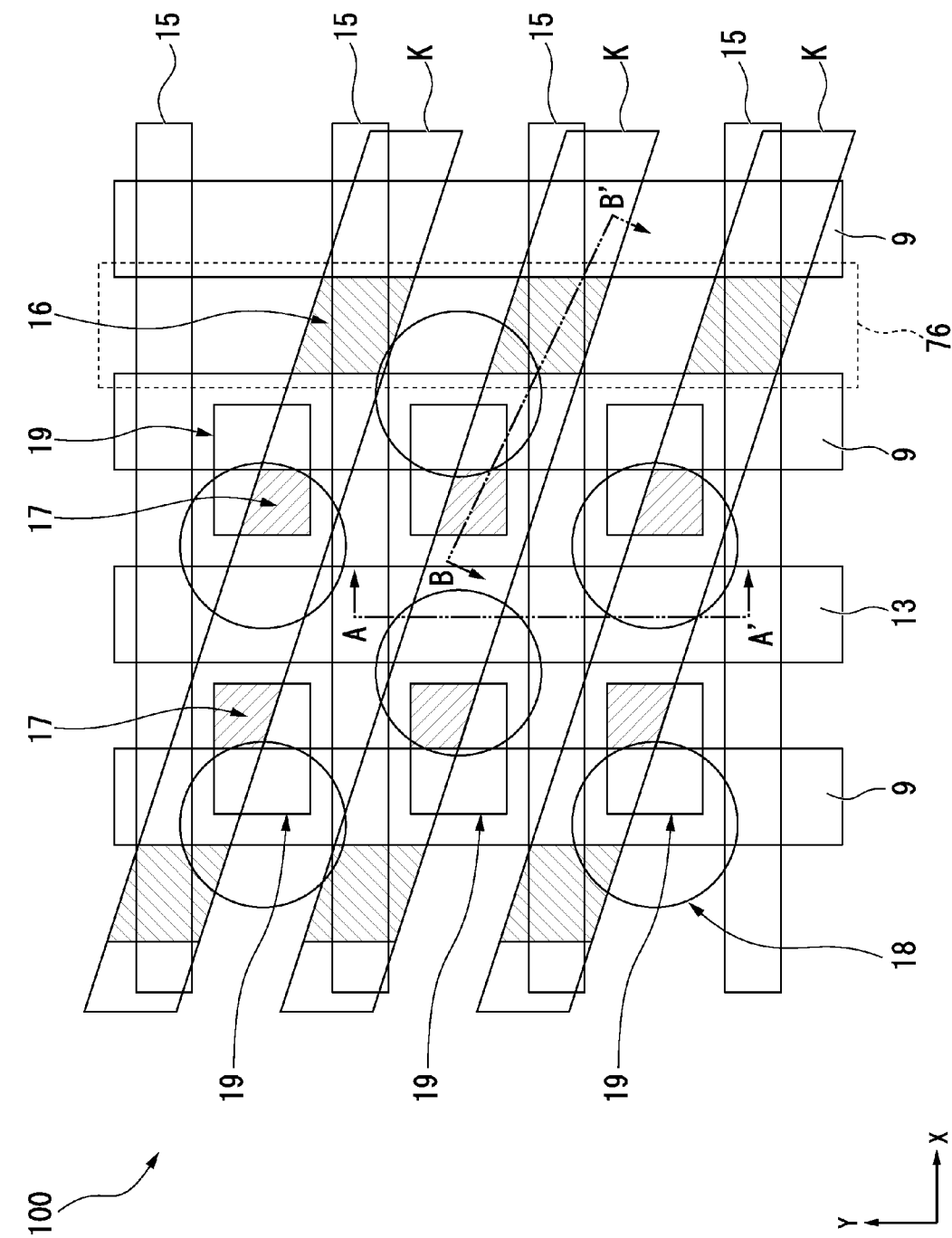
FIG. 2 is a fragmentary plan view illustrating examples of elements of a memory cell which is provided with the semiconductor device in accordance with one embodiment of the present invention.

The above-noted memory cell region 101 will be described, using FIG. 2. FIG. 2 is a fragmentary plan view illustrating examples of elements of a memory cell which is provided with the semiconductor device in accordance with one embodiment of the present invention. As shown in FIG. 2, the semiconductor device 100 of the present embodiment has an arrangement of $6F^2$ cells (where F is the minimum process dimension).

A memory cell region 101 in the semiconductor device 100 includes a plurality of active regions K in the shape of bands, defined by isolation regions 4, at a prescribed interval. The active regions K are formed on a surface layer of a semiconductor substrate 50, which will be described later. The active regions K extend at a prescribed angle with respect to the direction of extension of each of the word lines 9 and each of the bit lines 15. The plan view condition and arrangement direction of the active regions K are not limited to those shown in FIG. 2.

A first word line 9, which serves as a gate electrode, and a second word line 13 for element isolation are buried in the semiconductor substrate 50 at a prescribed interval in a prescribed direction (the Y direction in FIG. 2) so as to cross the active regions K. The second word line 13 is a shield wiring that is applied with a prescribed fixed voltage and is used for element isolation. The second word line 13 does not function as a selection wiring of the MOS transistors disposed at each memory cell. As will be described later, because the first and second word lines are formed in the same processes, the shield wiring for element isolation in the present embodiment is noted as the second word line as a convenience.

Also, the plurality of first word lines 9 extend in the Y direction and so as to be mutually distanced in the X direction. In the structure of the present embodiment, as shown in FIG. 2, two first word lines 9 and one second word line 13 are arranged in this sequence alternately in the X direction. The memory cells are formed in the respective regions in which the first word line 9 and the active region K intersect.

A plurality of bit lines 15 are disposed at a prescribed interval in the direction that is perpendicular to the direction of the first word lines 9 and the second word lines 13 (the X direction in FIG. 2).

A bit line connection region 16 is delineated and formed at a part of the active region K positioned below each of the bit lines 15.

A capacitor contact plug formation region 17 is delineated and formed between mutually adjacent bit lines 15 in the Y direction and also in the part of the region between the adjacent first word lines 9 and second word lines 13 in the X direction overlapped with the region K. The capacitor contact plug formation region 17, seen in a plan view, straddles across one part of the first word line 9, one part of the isolation region 4, and one part of the active region K.

Capacitor contact pads 18, which will be described in detail, are formed at positions that are staggered in the Y direction with respect to the capacitor contact plug formation region 17. The capacitor contact plug 18 is disposed between the bit lines 15. The capacitor contact plugs 18 are disposed repeatedly in a staggered manner, so that the center part of the capacitor contact plug 18 is on every other first word line 9 in the Y direction, or the center part of the capacitor contact plug 18 is on the upper side of every other first word line 9 in the Y direction.

A plurality of memory cells are formed in the overall memory cell region 101, and each of the memory cells is provided with a capacitor element (not shown). Capacitor contact plugs 19 thereof, as shown in FIG. 2, are disposed at a prescribed interval within the memory cell region 101 so as to not mutually overlap.

The capacitor contact plug 19 is, for example, rectangular when seen in plan view. The capacitor contact plug 19 seen in plan view is formed so as to straddle one part of the capacitor contact plug formation region 17, one part of the first word line 9, one part of an STI region, and one part of the active region K. One part of the capacitor contact plug 19 is positioned over each of the first word lines 9. The other part of the capacitor contact plug 19 is in a region between adjacent bit lines 15, and disposed above a location between the first word line 9 and the second word line 13. The other part of the capacitor contact plug 19 is connected to a capacitor 47.

Figure 3A:
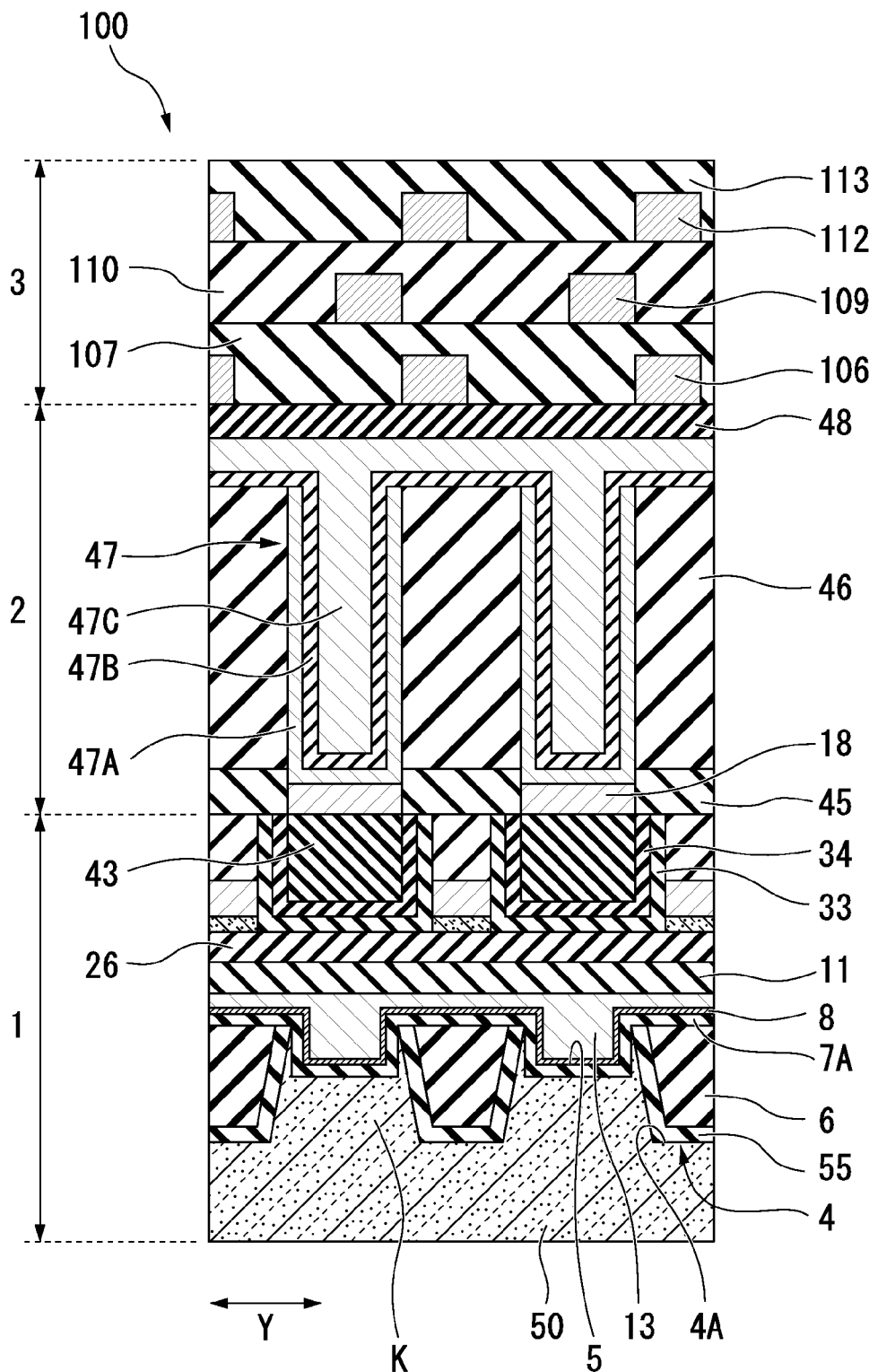
FIG. 3A is a fragmentary cross sectional elevation view, taken along an A-A' line of FIG. 2, illustrating the semiconductor device in accordance with one embodiment of the present invention.
Figure 3B:
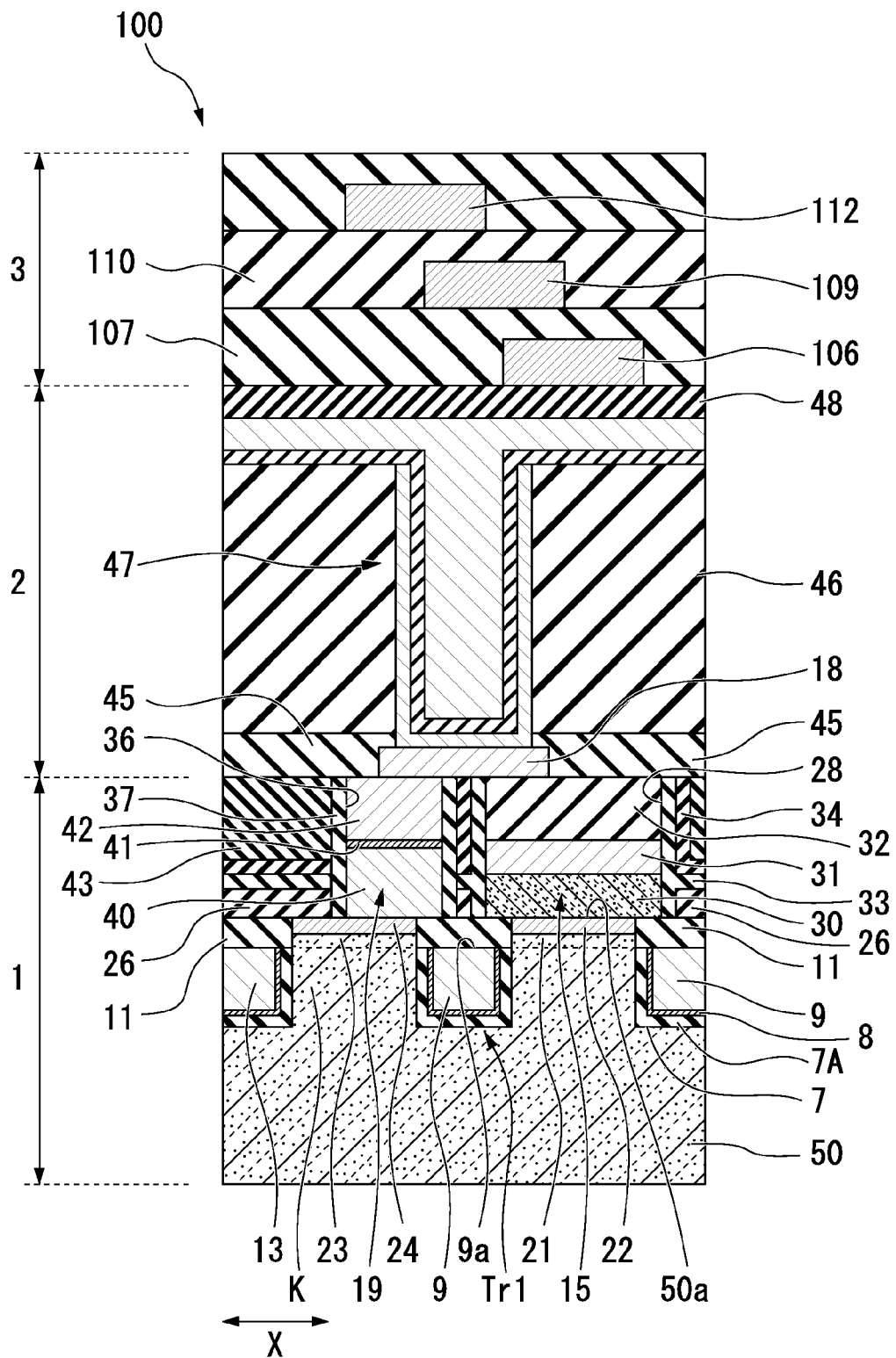
FIG. 3B is a fragmentary cross sectional elevation view, taken along a B-B' line of FIG. 2, illustrating the semiconductor device in accordance with one embodiment of the present invention.

With reference to FIG. 3, the memory cells included in the semiconductor device 100 of the present embodiment will be described. FIG. 3A is a fragmentary cross sectional elevation view, taken along an A-A' line of FIG. 2, illustrating the semiconductor device in accordance with one embodiment of the present invention. FIG. 3B is a fragmentary cross sectional elevation view, taken along a B-B' line of FIG. 2, illustrating the semiconductor device in accordance with one embodiment of the present invention. The memory cell in the present embodiment may include, but is not limited to, a transistor formation layer 1, a capacitor formation layer 2, and a wiring layer 3.

The transistor formation layer 1 is the region in which a buried-gate MOS transistor (first MOS transistor) Tr1 is formed. In transistor formation layer 1, the semiconductor substrate 50, the first MOS transistor Tr1, the bit line 15, and the capacitor contact plug 19 are included.

The semiconductor substrate 50 is, for example, a p-type silicon substrate. On the surface (one surface) of the semiconductor substrate 50, the active region K and the isolation region 4 are formed. The isolation region 4 is constituted by an STI element separation film 55 made of a silicon oxide film so as to cover the inner surface of an element isolation groove 4A, and an element isolation insulating film 6 made of a silicon nitride film formed so as to bury the inside of the element isolation groove 4A.

The active region K is delineated and formed by the element isolation region 4 and extends in the form of a line. For this reason, the deformation of the pattern at the edge part of the active region that occurs in an active region disposed as an isolated island pattern in a semiconductor device in the related art is avoided. Therefore, it is possible to form the active region with the desired shape and with high-resolution lithography.

The first word line 9 is made of a high melting point metal such as tungsten (W). The first word line 9 extends in the Y direction of FIG. 2. The plurality of first word lines 9 are disposed at a prescribed interval in the X direction shown in FIG. 3. The first word line 9 is buried at the bottom part of the groove 7 while an inner layer 8 including a titanium nitride (TiN) or the like and a first gate insulating film (cell gate insulating film) 7A are interposed between the first word line 9 and a surface of the groove 7. The region in which the groove 7 and the active region K overlap each other functions as the channel region of the first MOS transistor Tr1.

An upper surface 9a of the first word line 9 is positioned below the upper surface 50a of the semiconductor substrate 50. A buried insulating film 11 covers the first word line 9 and buries the groove 7.

The buried insulating film 11 is laminated so that an upper surface of the buried insulating film 11 is substantially flush with an upper surface 50a of the semiconductor substrate 50.

The buried insulating film 11 may include, for example, a silicon nitride ($Si_3N_4$) film formed by LP-CVD (low-pressure CVD). By forming the buried insulating film 11 by silicon nitride, it is possible to reliably stop its corrosion by etching.

As shown in FIG. 3A, a channel trench 5 that is shallower than the element isolation groove 4A is formed in the region (active region K) between the element isolation grooves 4A adjacent in the Y direction. The second word line 13 is formed, on the inner surface of the channel trench 5 and on the upper surface of the element isolation groove 4A that is adjacent to the channel trench 5 while the first gate insulating film 7A and the inner surface layer 8 are interposed between the second word line 13 and the inner surface of the channel trench 5 or the upper surface of the element isolation groove 4A. The second word line 13 has the same structure as the first word line 9.

As shown in FIG. 3B, the first word line 9 and the second word line 13 are disposed so as to be adjacent, with a prescribed interval therebetween in the X direction. The second word line 13 is buried at the bottom part of the groove 7 while the first gate insulating film 7A and the inner surface layer 8 are interposed between the second word line 13 and the surface of the groove 7.

The buried insulating film 11 is formed over the second word line 13. The first word line 9 and the buried insulating film 11 shown in FIG. 3A are formed in the same steps as the second word line 13 and the buried insulating film 11 shown in FIG. 3B in the manufacturing method to be described later.

The second word line 13 is formed in the same steps with the first word line 9. The second word line 13 electrically isolates a source region and a drain region (high-concentration impurity diffusion layers 22 and 24 formed on both sides of the second word lines 13 shown in FIG. 3B) of each of the adjacent first MOS transistors Tr1 in the active region K formed as a line. For example, by fixing the second word line 13 to a prescribed electrical potential (for example –0.1 V), it is possible to electrically isolate adjacent memory cells.

As shown in FIG. 2, the plurality of first word lines 9 are formed so as to extend in the Y direction while being mutually distanced from one another in the X direction. According to the present embodiment, as shown in FIG. 3B, two first word lines 9 and one second word line 13 are alternately disposed in the X direction in this sequence.

By way of further describing the transistor formation layer 1 based on FIGS. 3A and 3B, a first low-concentration impurity diffusion layer 21 and a first high-concentration impurity diffusion layer 22 are formed sequentially from the deep side in the above-noted active region K as shown in FIG. 3B. The active region K is on the upper surface 50a side of the semiconductor substrate 50 positioned between the first word lines 9 adjacent in the X direction. A second low-concentration impurity diffusion layer 23 and a second high-concentration impurity diffusion layer 24 are formed sequentially from the deep side in the above-noted active region K. The active region K is on the upper surface 50a side of the semiconductor substrate 50 positioned between the first word line 9 and the second word line 13 adjacent in the X direction.

In the region shown in FIG. 3A, a first interlayer insulating film 26 covers the buried insulating film 11. In the region shown in FIG. 3B, the first interlayer insulating film 26 covers the upper surface 50a of the semiconductor substrate 50. That is the first interlayer insulating film 26 covers the first high-concentration impurity diffusion layers 22 and 24 and the buried insulating film 11.

In a region between grooves 7 that are adjacent in the X direction in FIG. 3B, a first contact aperture 28 is formed in the first interlayer insulating film 26. A bit line 15 is formed over the first interlayer insulating film 26 so as to extend in a direction that is perpendicular to the first word line 9 shown in FIG. 2. The bit line 15 is formed on the bottom part of the first contact aperture 28. The bit line 15 is formed so that a part thereof overlaps with the buried insulating film 11, and also so as to connect with the first high-concentration impurity diffusion layer 22 below the first contact aperture 28. In the first contact aperture 28, a region in which the first bit line 15 exists and in which the first high-concentration impurity diffusion layer 22 exists below the first bit line 15 is the bit line connection region 16 shown in FIG. 2.

The bit line 15 has a three-layer structure including a bottom part conductive film 30, a metal film 31, and an upper part insulating film 32. The bottom part conductive film 30 is made of polysilicon. The metal film 31 is made of a high melting point metal such as tungsten. The upper part insulating film 32 is made of a silicon nitride film or the like. An insulating film 33 made of a silicon nitride film or the like and a liner film 34 are formed at both sides of the first bit line 15 in the width direction shown in FIG. 3B and above the first interlayer insulating film 26 shown in FIG. 3A so as to be positioned at both sides of the bit line 15 in the width direction. More specifically, the bottom part conductive film 30, as discussed in the description of the manufacturing method later, is made of impurity-doped polysilicon that is doped with an impurity such as phosphorus (P).

A second contact aperture 36, which is rectangular when seen in plan view, is formed in a region that is between bit lines 15 adjacent in the Y direction in FIG. 2 and that is also between a region above the first word line 9 and the second word line 13 adjacent to the first word line 9. The capacitor contact plug 19, which is surrounded by a side wall 37 of a silicon nitride film or the like is formed on the inside of the second contact aperture 36.

Therefore, a part of the second contact aperture 36 which overlaps with the active region K corresponds to the capacitor contact plug connection region 17 shown in FIG. 2.

As shown in FIG. 3B, the capacitor contact plug 19 has a three-layer structure having a bottom part conductive film 40 made of polysilicon or the like, a silicide layer 41 made of CoSi or the like, and a metal film 42 made of tungsten or the like.

The upper surfaces of the bit line 15 and the capacitor contact plug 19 are formed at substantially the same height. In the region of the semiconductor substrate 50 on which the bit line 15 and the capacitor contact plug 19 are not formed, a buried insulating film 43 is formed to a height that is substantially the same as the upper surfaces of the bit line 15 and the capacitor contact plug 19.

In the capacitor formation layer 2 shown in FIG. 3A and FIG. 3B, as shown in FIG. 2, a capacitor contact pad 18 that is substantially round when seen in plan view is formed over each of the capacitor contact plugs 19 so as to be staggered when seen in plan view, so that there is partial overlap. The capacitor contact pad 18 is covered by a stopper film 45. A third interlayer insulating film 46 is formed over the stopper film 45. Each of the capacitors 47 is formed inside the third interlayer insulating film 46, so that they are each positioned above the capacitor contact pads 18.

As shown in FIG. 3A and FIG. 3B, the capacitor 47 in the present embodiment includes a cup-shaped lower electrode 47A, a capacitor insulating film 47B, and an upper electrode 47C. The cup-shaped lower electrode 47A is formed so as to make contact with the capacitor contact pad 18. The capacitor insulating film 47B is formed to extend outwardly over the third interlayer insulating film 46 from the inner surface of the lower electrode 47A. The upper electrode 47C is formed so as to fill the inside of the lower electrode 47A on the inside of the capacitor insulating film 47B and to extend outwardly up to the upper surface side of the capacitor insulating film 47B.

The upper surface of the upper electrode 47C is covered by a fourth interlayer insulating film 48.

The structure of the capacitor 47 according to the present embodiment is one example and, in addition to the structure of the present embodiment, other capacitor structures such as a crown type or a pedestal type (pillar type) may be disposed, such as are generally applied to DRAM memory cells.

The wiring layer 3 is provided over the capacitor formation layer 2. In the present embodiment, a first wiring 106, a second wiring 109, and a third wiring 112 are provided as the three-layer metal wirings.

The first wiring 106 is formed over the fourth interlayer insulating film 48. A fifth interlayer insulating film 107 is formed so as to cover the first wiring 106 and the fourth interlayer insulating film 48. The second wiring 109 is formed over the fifth interlayer insulating film 107. A sixth interlayer insulating film 110 is formed so as to cover the second wiring 109 and the fifth interlayer insulating film 107. The third wiring 112 is formed over the sixth interlayer insulating film 110. A protective film 113 is formed so as to cover the third wiring 112 and the sixth interlayer insulating film 110.

Figure 4:
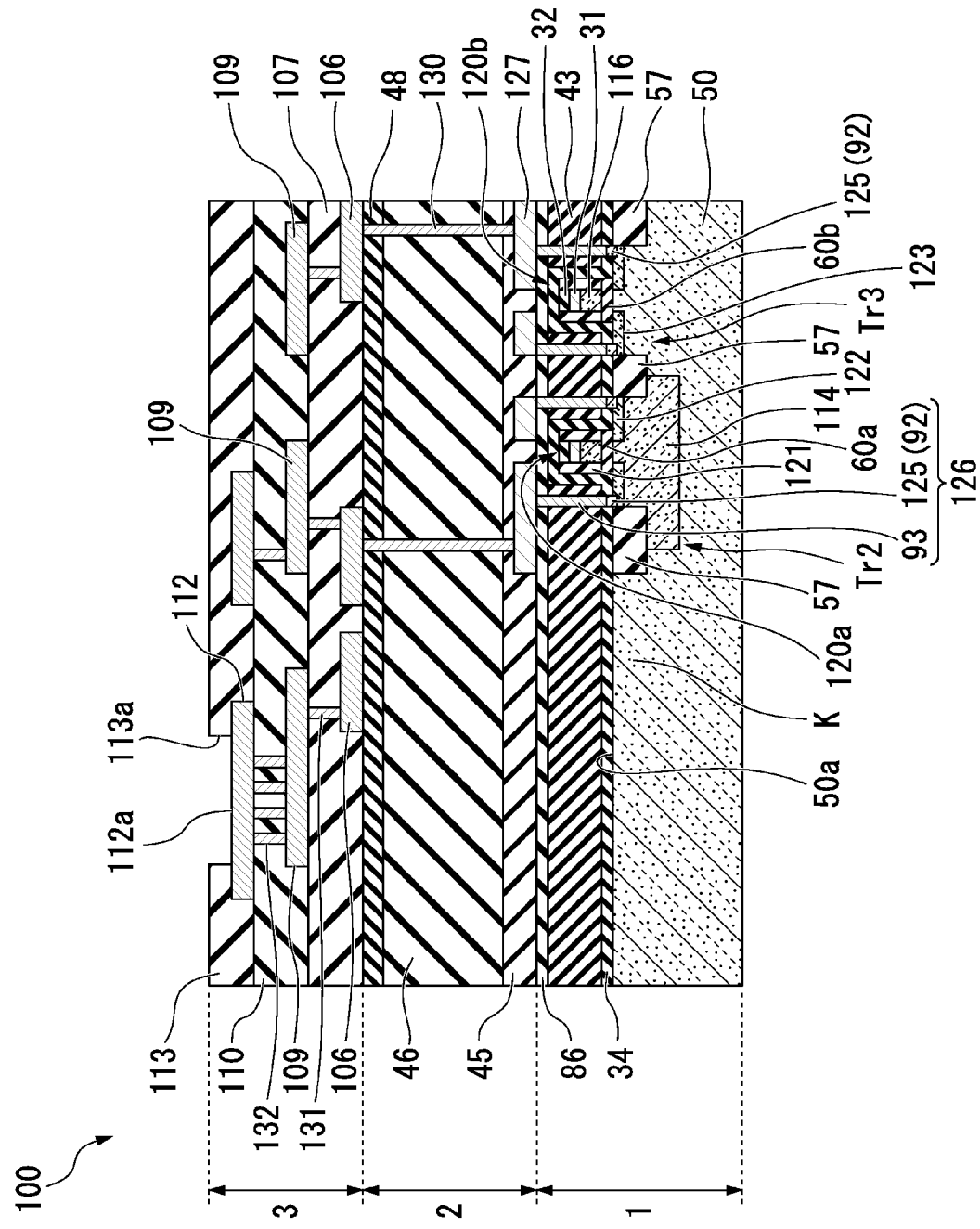
FIG. 4 is a fragmentary cross sectional elevation view illustrating the semiconductor device in accordance with one embodiment of the present invention.

The peripheral circuit region 102 of the semiconductor device 100 according to the first embodiment will be described with reference to FIG. 4. As shown in FIG. 4, the peripheral circuit region 102 of the semiconductor device 100 of the present embodiment is generally constituted by the transistor formation layer 1, the capacitor formation layer 2 of the memory cells, and the wiring layer 3.

A second MOS transistor Tr2, and a third MOS transistor Tr3 of a conductivity type differing from that of the second MOS transistor Tr2 are formed on the semiconductor substrate 50 in the transistor formation layer 1.

The semiconductor substrate 50 is made, for example, of a p-type silicon substrate.

A silicon oxide film 57, which is the isolation region, is buried into the upper surface 50a side of the semiconductor substrate 50, thereby delineating the active region K.

The second MOS transistor Tr2 is a planar type p-channel transistor, and has a second gate electrode 120a.

The second gate electrode 120a is formed on the active region K while a second gate insulating film 60a is interposed therebetween. The second gate electrode 120a is constituted as a laminate of a second gate polysilicon film 116 (film that is the integration of a bottom part conducting film 30, which will be described later, and a first gate polysilicon film 115 in the peripheral circuit region 102), a metal film 31, and a silicon nitride film 32. The region in proximity to the upper surface of the active region K that is positioned below the second gate electrode 120a while the second gate insulating film 60a interposed therebetween functions as the channel region of the second MOS transistor Tr2.

A nitride film side wall 121 made of a silicon nitride film is formed on the side surface of the second gate electrode 120a.

A first impurity diffusion layer 114, into which an n-type impurity (phosphorus or the like) is diffused is formed in a region of the active region K in which the second MOS transistor Tr2 is formed. The first impurity diffusion layer 114 functions as an n-type well.

A p-type second impurity diffusion layer 122 is formed on the inside of the first impurity diffusion layer 114 (n-type well) in the area surrounding the second gate electrode 120a. The second impurity diffusion layer 122 functions as the source region or drain region of the second MOS transistor Tr2.

The third MOS transistor Tr1 is a planar type n-channel transistor, and has a third gate electrode 120b of a conductivity type differing from that of the second gate electrode 120a. In this case, the second gate electrode 120a is formed to be p-type and the third gate electrode 120b is formed to be n-type.

The third gate electrode 120b is formed on the active region K while the third gate insulating film 60b is interposed therebetween. The region in proximity to the upper surface of the active region K that positioned below the third gate electrode 120b while the third gate insulating film 60b is interposed therebetween functions as the channel region of the third gate electrode 120b. The nitride film side wall 121 made of a silicon nitride film is formed on the side surface of the third gate electrode 120b.

An n-type third impurity diffusion layer 123 is formed inside the active region K in the area surrounding the third gate electrode 120b. The third impurity diffusion layer 123 functions as the source region or drain region of the third MOS transistor Tr3.

A liner film 34 made of a silicon nitride film or the like with a thickness of 10 nm to 20 nm is formed so as to cover the upper surface 50a side of the semiconductor substrate 50, the second gate electrode 120a, and the third gate electrode 120b. A deposited film 43 and a second interlayer insulating film 86 are laminated so as to cover the liner film 34.

A plurality of peripheral contact plugs 126 made of a silicide layer 125 and a metal film 41 are formed so as to penetrate the deposited film 43 and the second interlayer insulating film 86. The peripheral contact plugs 126 are each connected to the second impurity diffusion layer 122 and the third impurity diffusion layer 123.

The capacitor formation layer 2 is generally constituted by a local wiring 127, a stopper film 45, a third interlayer insulating film 46, a fourth interlayer insulating film 48, and a local contact plug 130.

The local wiring 127 is formed in the same processes as the capacitor contact pad 18 of the memory cell region 101 and is formed from the same conducting layer, on the second interlayer insulating film 86.

The local wirings 127 are connected, via the peripheral contact plug 126, to the source and drain regions (second impurity diffusion layer 122 and third impurity diffusion layer 123) of each MOS transistor (second MOS transistor Tr2 and third MOS transistor Tr3), respectively.

The stopper film 45 made of a silicon oxide film or the like and the third interlayer insulating film 46 made of a silicon oxide film or the like with a thickness of approximately 1 μm to 2 μm are laminated in this sequence so as to cover the upper surface of the local wiring 127. The fourth interlayer insulating film 48 that is made of a silicon oxide film or the like is formed so as to cover the third interlayer insulating film 46.

The plurality of local contact plugs 130 that are made of a metal film such as tungsten are formed so as to penetrate the fourth interlayer insulating film 48, the third interlayer insulating film 46, and the stopper film 45. The local contact plug 130 is connected to the local wiring 127.

The wiring layer 3 is provided on the capacitor formation layer 2. In the present embodiment, the first wiring 106, the second wiring 109, and the third wiring 112 are provided as a three-layer metal wiring.

The first wiring 106 is formed on the fourth interlayer insulating film 48. The fifth interlayer insulating film 107 is formed so as to cover over the first wiring 106 and the fourth interlayer insulating film 48.

A first contact plug 131 that is made of a metal film such as tungsten is formed so as to pass through the fifth interlayer insulating film 107 and also be connected to the first wiring 106.

The second wiring 109 is formed over the fifth interlayer insulating film 107. The sixth interlayer insulating film 110 is formed so as to cover over the second wiring 109 and the fifth interlayer insulating film 107. A second contact plug 132 that is made of a metal film such as tungsten is formed so as to penetrate the sixth interlayer insulating film 110 and also be connected to the second wiring 109.

The third wiring 112 is formed over the sixth interlayer insulating film 110. The protective film 113 is formed so as to cover the sixth interlayer insulating film 110. The upper surface 112a of the third wiring 112 is exposed from the aperture 113a provided in the protective film 113, and functions as a bonding pad.

Because at least one of the bit line 15 and the capacitor contact plug 19 is formed so as to overlap with a part of the buried insulating film 11 in the semiconductor device 100 of the present embodiment, the degree of integration of the semiconductor device 100 is improved.

Additionally, the upper surface 9a of the first word line 9 is positioned lower than the upper surface 50a of the semiconductor substrate 50 and also the buried insulating film 11 made of silicon nitride is formed on the upper surface 9a of the first word line 9. Therefore, shorts between the first word line 9 and, the bit line 15 and the contact plug (capacitor contact plug 19) are prevented. For this reason, failures of the semiconductor device 1 are prevented. Thus, operational failures of the semiconductor device 1 are prevented, and the reliability of the semiconductor device 100 is improved.

A method of forming the semiconductor device 100 of the first embodiment will be described, with references made to the drawings. First, an example of the method for forming the semiconductor device 100 shown in FIG. 1 to FIG. 4 will be described based on FIG. 5A to FIG. 53B. The memory cell regions 101 and the peripheral circuit region 102, unless otherwise noted, are formed in the same processes. The cross-sectional views of the memory cell regions 101 and the peripheral circuit region 102 are presented in differing scales. FIGS. 3A, 5A, 7A, 9A, 12A, 14A, 16A, 18A, 19A, 21A, 22A, 25A, 27A, 29A, 31A, 34A, 36A, 38A, 39A, 41A, 42A, 44A, 46A, 47A, 48A, 50A, 52A, and 53A are fragmentary cross sectional elevation views, taken along the A-A' line of FIG. 2, illustrating the semiconductor device in steps involved in the method of forming the semiconductor device in accordance with the first embodiment of the present invention. FIGS. 3B, 5B, 7B, 9B, 12B, 14B, 16B, 18B, 19B, 21B, 22B, 25B, 27B, 29B, 31B, 34B, 36B, 38B, 39B, 41B, 42B, 44B, 46B, 47B, 48B, 50B, 52B, and 53B are fragmentary cross sectional elevation views, taken along the B-B' line of FIG. 2, illustrating the semiconductor device in steps involved in the method of forming the semiconductor device in accordance with the first embodiment of the present invention.

Figure 5A:
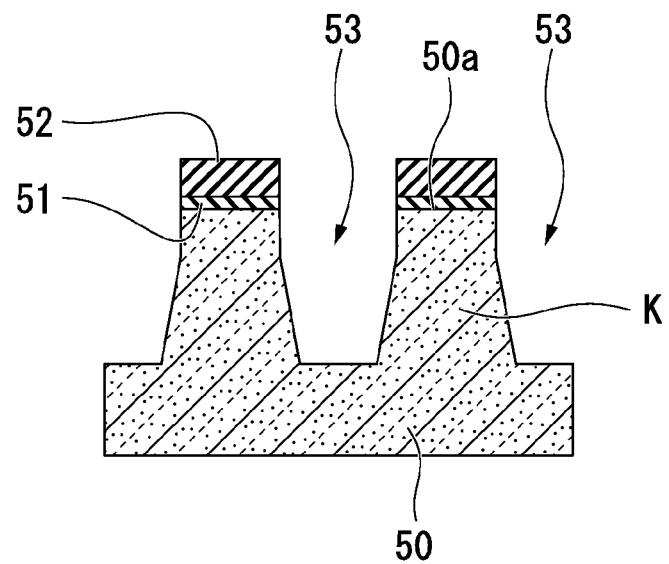
FIG. 5A is a fragmentary cross sectional elevation view, taken along the A-A' line of FIG. 2, illustrating the semiconductor device in a step involved in a method of forming the semiconductor device in accordance with one embodiment of the present invention.
Figure 5B:
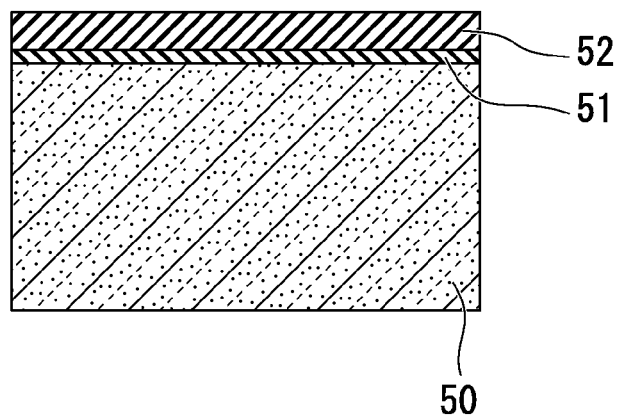
FIG. 5B is a fragmentary cross sectional elevation view, taken along the B-B' line of FIG. 2, illustrating the semiconductor device in a step involved in the method of forming the semiconductor device in accordance with one embodiment of the present invention.

First, as shown in FIG. 5A and FIG. 5B, an element isolation groove 53 is formed in the memory cell region 101 for the purpose of delineating the active region K. First, a silicon oxide film 51 and a silicon nitride ($Si_3N_4$) film 52 are laminated in this sequence so as to cover the upper surface 50a of the semiconductor substrate 50 in the memory cell region 101 and the peripheral circuit region 102.

As shown in FIG. 5A, photolithography and dry etching process are performed to pattern the silicon nitride film 52. Using the above-noted silicon nitride film 52 as a mask, the silicon oxide film 51 and the semiconductor substrate 50 are etched so as to form the element separation groove 53. The element separation groove 53 is formed, for example, as a line pattern groove that extends in a prescribed direction that sandwiches the active region K having the shape of bands as shown in FIG. 2 on both sides when the semiconductor substrate 50 is seen in plan view. When this is done, the upper surface 50a of the region that will be the active region K is covered by the silicon nitride film 52.

Figure 6:
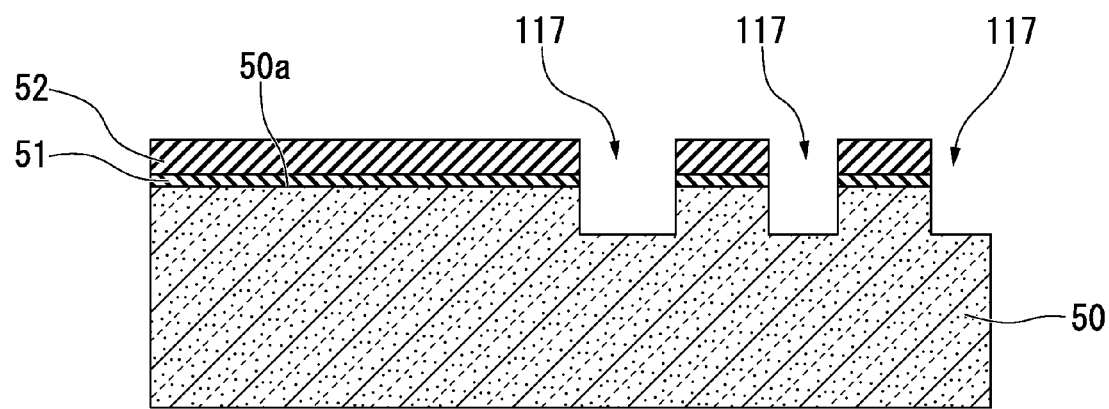
FIG. 6 is a fragmentary cross sectional elevation view illustrating the semiconductor device in a step involved in the method of forming the semiconductor device in accordance with one embodiment of the present invention.

While forming the element isolation groove 53, as shown in FIG. 6, the silicon nitride film 52 is used as a mask to etch the silicon oxide film 51 in the peripheral circuit region 102 and the semiconductor substrate 50. By this etching process, the element isolation groove 117 is formed in the semiconductor substrate 50 of the peripheral circuit region 102.

The element isolation groove 117 is formed so as to delineate the region (active region) for the formation of the MOS transistors, to be discussed later (second MOS transistor Tr2 and third MOS transistor Tr3). When this is done, the region that will be the MOS transistor formation region is covered by the silicon nitride film 52 that is for use as a mask.

Figure 7A:
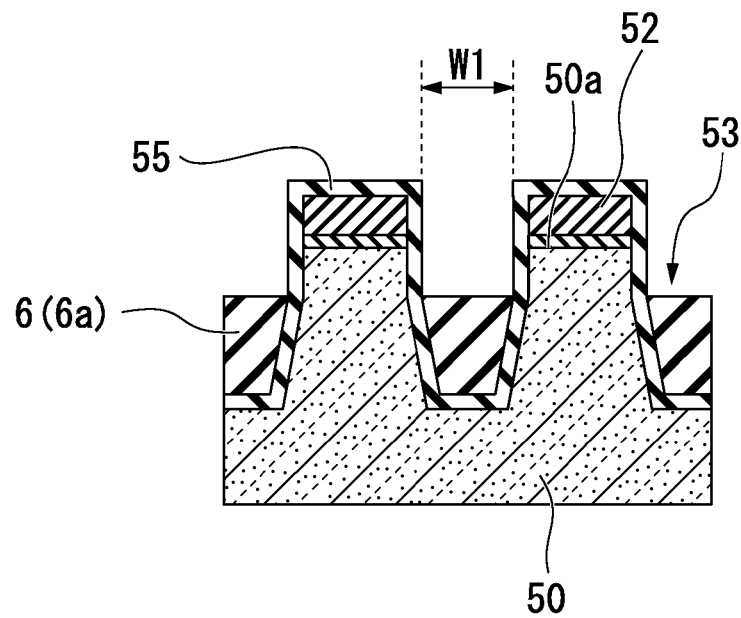
FIG. 7A is a fragmentary cross sectional elevation view, taken along the A-A' line of FIG. 2, illustrating the semiconductor device in a step, subsequent to the step of FIG. 5A, involved in the method of forming the semiconductor device in accordance with one embodiment of the present invention.
Figure 7B:
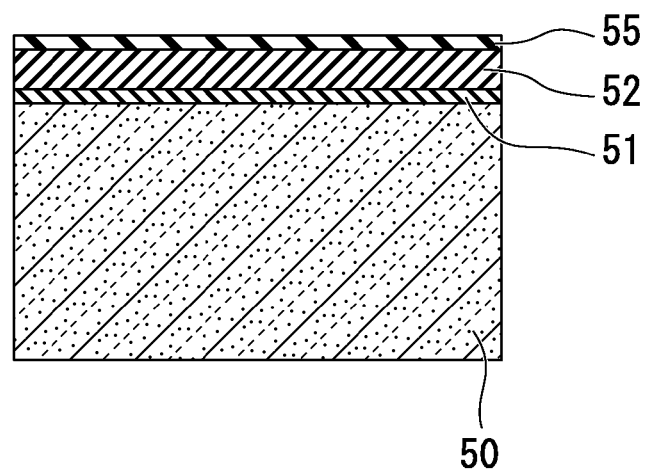
FIG. 7B is a fragmentary cross sectional elevation view, taken along the B-B' line of FIG. 2, illustrating the semiconductor device in a step, subsequent to the step of FIG. 5B, involved in the method of forming the semiconductor device in accordance with one embodiment of the present invention.
Figure 8:
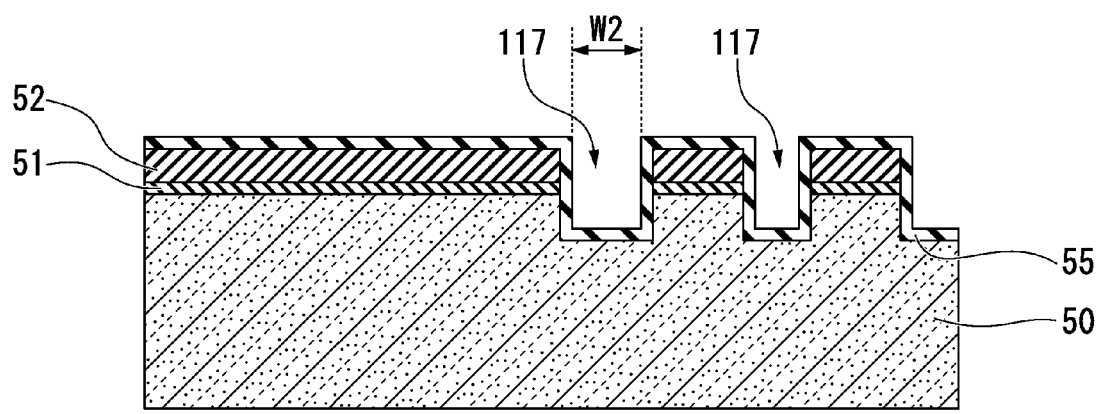
FIG. 8 is a fragmentary cross sectional elevation view illustrating the semiconductor device in a step, subsequent to the step of FIG. 6, involved in the method of forming the semiconductor device in accordance with one embodiment of the present invention.

As shown in FIG. 7A, FIG. 7B, and FIG. 8, the silicon oxide film 55 is formed by thermal oxidation so as to cover the inner wall surface of the element isolation groove 53, and the inner wall surfaces of the silicon nitride film 52 and the element isolation groove 117. When this is done, the conditions for forming the silicon oxide film 55 are adjusted so that the inner part of the element isolation groove 117 is not completely filled by the silicon nitride film 55.

As shown in FIG. 7A and FIG. 7B, a silicon nitride film 6a is deposited so as to completely fill the inside of the element isolation groove 53 of the memory cell region 101. A wet etching process is performed so as to leave the silicon nitride film 6a only at the bottom side of the inside of the element separation groove 53. By this etching process, an element isolation insulating film 6 made of the silicon nitride film 6a that is filled to a position slightly lower than the upper surface 50a of the semiconductor substrate 50 is formed. In this case, the width of the element isolation groove 53 of the memory cell region 101 is taken as W1.

When this is done, as shown in FIG. 8, the element isolation groove 117 in the peripheral circuit region 102 is formed so as to be sufficiently wider than the width W1 of the element isolation groove 53 of the memory cell region 101 shown in FIG. 7A.

For this reason, because the silicon nitride film 6a is buried within the element isolation groove 117 in the peripheral circuit region 102 so as to have a gap, the dry etching process performed as noted above removes all of the silicon nitride film 6a that had been buried.

Figure 9A:
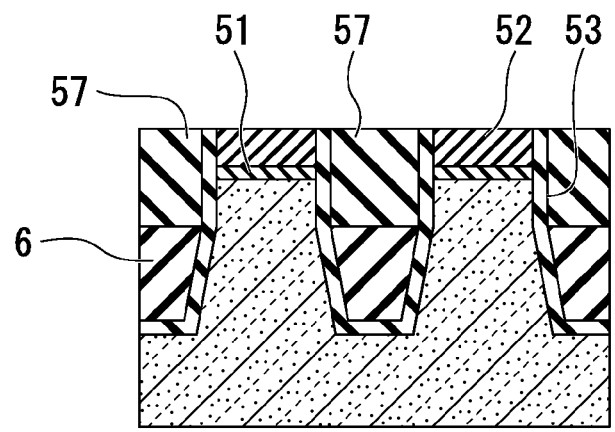
FIG. 9A is a fragmentary cross sectional elevation view, taken along the A-A' line of FIG. 2, illustrating the semiconductor device in a step, subsequent to the step of FIG. 7A, involved in the method of forming the semiconductor device in accordance with one embodiment of the present invention.
Figure 9B:
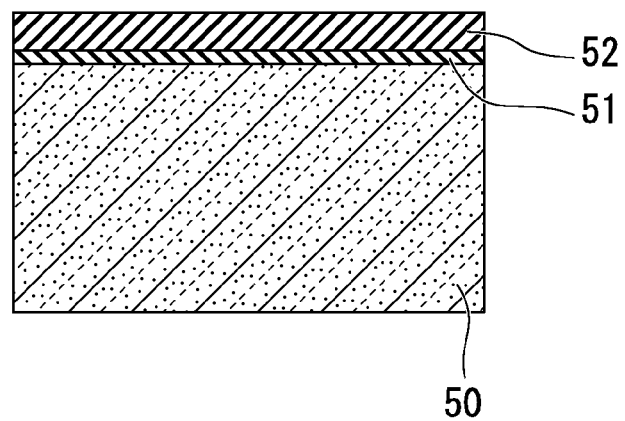
FIG. 9B is a fragmentary cross sectional elevation view, taken along the B-B' line of FIG. 2, illustrating the semiconductor device in a step, subsequent to the step of FIG. 7B, involved in the method of forming the semiconductor device in accordance with one embodiment of the present invention.
Figure 10:
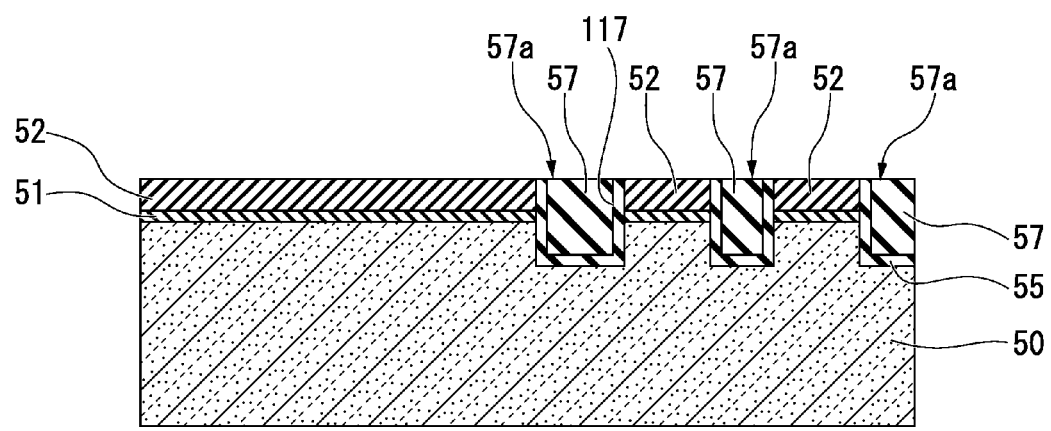
FIG. 10 is a fragmentary cross sectional elevation view illustrating the semiconductor device in a step, subsequent to the step of FIG. 8, involved in the method of forming the semiconductor device in accordance with one embodiment of the present invention.

As shown in FIG. 9A, FIG. 9B, and FIG. 10, CVD is used to deposit a silicon oxide film 57 so as to fill inside the element isolation groove 53 of the memory cell region 101 (above the element isolation insulating film 6) and the inside of the element isolation groove 117 in the peripheral circuit region 102.

As shown in FIG. 9A and FIG. 9B, CMP (chemical mechanical polishing) processing is performed until the silicon nitride film 52 used as a mask is exposed, and the silicon oxide film 57 surface is planarized.

By this CMP processing, as shown in FIG. 10, the silicon oxide film 57 surface is planarized even in the peripheral circuit region 102, and the silicon oxide film 57 remains on the inside of the element isolation groove 117. The silicon oxide film 57 that remains on the inside of the element isolation groove 117 is made the element isolator 57a.

Figure 11:
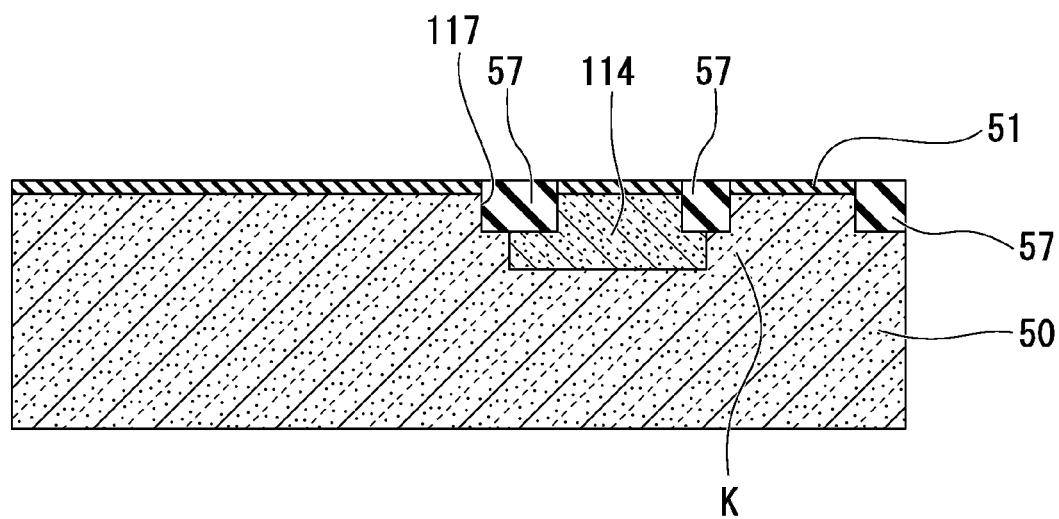
FIG. 11 is a fragmentary cross sectional elevation view illustrating the semiconductor device in a step, subsequent to the step of FIG. 10, involved in a method of forming the semiconductor device in accordance with one embodiment of the present invention.

As shown in FIG. 11, a first impurity diffusion layer 114 that functions as an n-type well is formed on the surface layer part of the active region K of the peripheral circuit region 102.

By a wet etching process, one part of the silicon oxide film 57 and the silicon nitride film 52 used as a mask are removed. When this is done, the etching conditions are adjusted so that the upper surface of the silicon oxide film 57 (element separator 57a) is substantially leveled with the position of the upper surface of the silicon oxide film 51. In subsequent peripheral circuit region 102 cross-sectional views, as a simplification, only the silicon oxide film 57 is shown inside the element separation groove 117.

Using a photoresist film (not shown) as a mask, ion implantation of the surface of the semiconductor substrate 50 is done with an n-type impurity (phosphorus or the like), to form the first impurity diffusion layer 114. The first impurity diffusion layer 114 becomes the n-type well region in which the p-channel MOS transistor (second MOS transistor Tr2) is formed in a subsequent process step. When this is done, in the same manner, the regions other than the first impurity diffusion layer 114 in the peripheral circuit region 102 and the memory cell region 101 may be subjected to ion implantation with a p-type impurity such as boron (B), so as to form a p-type well.

Figure 12A:
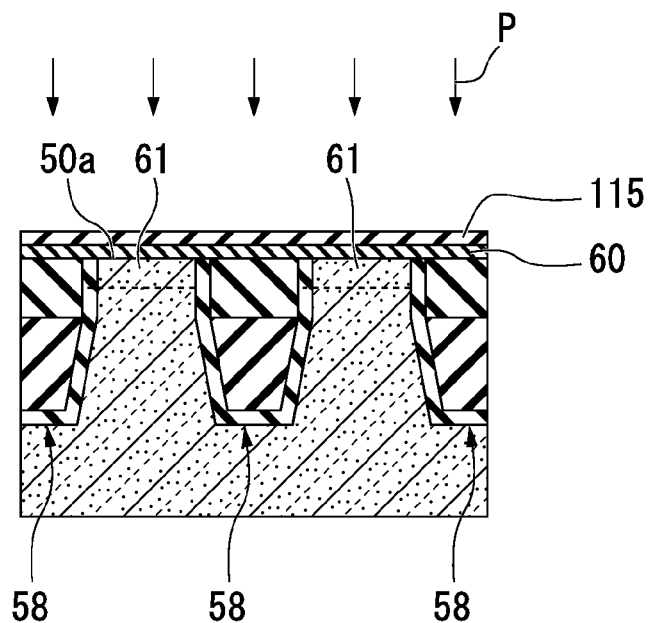
FIG. 12A is a fragmentary cross sectional elevation view, taken along the A-A' line of FIG. 2, illustrating the semiconductor device in a step, subsequent to the step of FIG. 9A, involved in the method of forming the semiconductor device in accordance with one embodiment of the present invention.
Figure 12B:
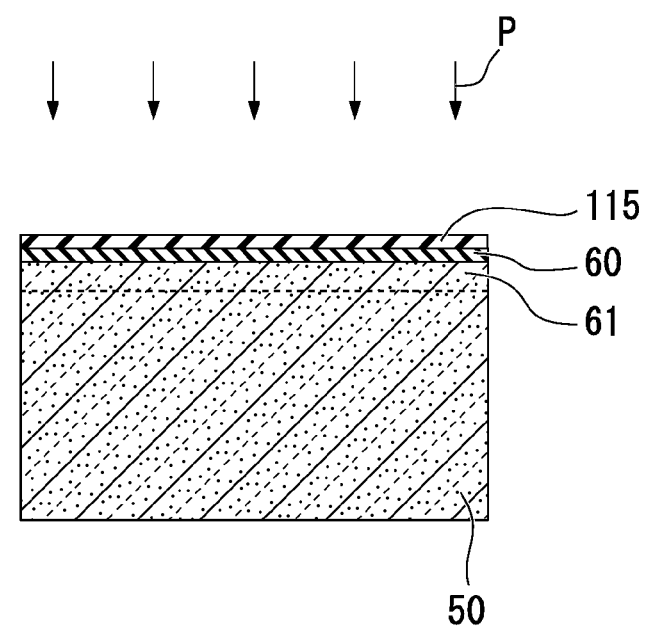
FIG. 12B is a fragmentary cross sectional elevation view, taken along the B-B' line of FIG. 2, illustrating the semiconductor device in a step, subsequent to the step of FIG. 9B, involved in the method of forming the semiconductor device in accordance with one embodiment of the present invention.
Figure 13:
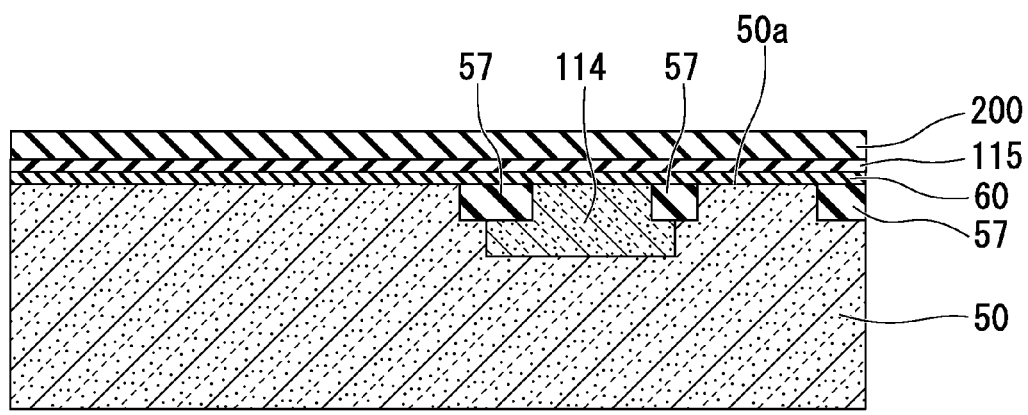
FIG. 13 is a fragmentary cross sectional elevation view illustrating the semiconductor device in a step, subsequent to the step of FIG. 11, involved in the method of forming the semiconductor device in accordance with one embodiment of the present invention.

As shown in FIG. 12A, FIG. 12B, and FIG. 13, the first gate polysilicon film 115 is formed.

A wet etching process is performed to remove the silicon oxide film 51 on the surface of the memory cell region 101 and the peripheral circuit region 102 of the semiconductor substrate 50, and expose the upper surface 50a of the semiconductor substrate 50. The surface of a line-shaped active region K is exposed in the memory cell region 101. An element isolation groove 58 that delineates the memory cell region 101 is formed by the silicon nitride film 6 and the silicon oxide film 57 that were left in the inside of the element separation groove 53.

A peripheral gate insulating film 60 is formed by thermal oxidation so as to cover the upper surface 50a of the semiconductor substrate 50. The peripheral gate insulating film 60 functions as a gate insulating film (second gate insulating film 60a and third gate insulating film 60b) of the MOS transistors (second MOS transistor Tr2 and third MOS transistor Tr3) disposed in the peripheral circuit region 102.

A first gate polysilicon film 115 made of a non-doped polysilicon film with a thickness of approximately 20 nm to 30 nm is formed by CVD so as to cover the peripheral gate insulating film 60.

The peripheral circuit region 102 is covered with a photoresist film 200 as shown in FIG. 13. Ion implantation is performed with phosphorus as an n-type low-concentration impurity to pass through the first gate polysilicon film 115 in the surface layer part of the active region K of the memory cell region 101, as shown in FIG. 12A and FIG. 12B. By this ion implantation, an n-type low-concentration impurity diffusion layer 61 is formed in the surface layer part of the active region K of the memory cell region 101. The dose concentration of ions when performing the ion implantation is, for example, in the range from $5 \times 10^{12}$ atom/cm$^2$ to $1 \times 10^{13}$ atom/cm$^2$. The low-concentration impurity diffusion layer 61 functions as the source and drain regions of the buried-gate MOS transistor (first MOS transistor Tr1) that are disposed in the memory cell region 101.

With the peripheral circuit region 102 masked by the photoresist film 200, a dry etching process is performed to remove the first gate polysilicon film 115 on the memory cell region 101. The photoresist film 200 is removed after the dry etching.

Figure 14A:
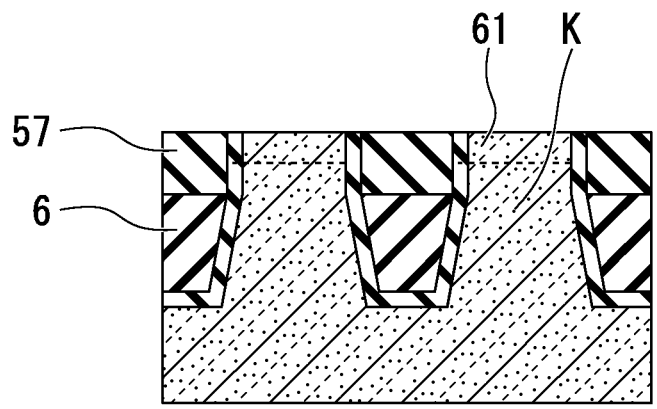
FIG. 14A is a fragmentary cross sectional elevation view, taken along the A-A' line of FIG. 2, illustrating the semiconductor device in a step, subsequent to the step of FIG. 12A, involved in the method of forming the semiconductor device in accordance with one embodiment of the present invention.
Figure 14B:
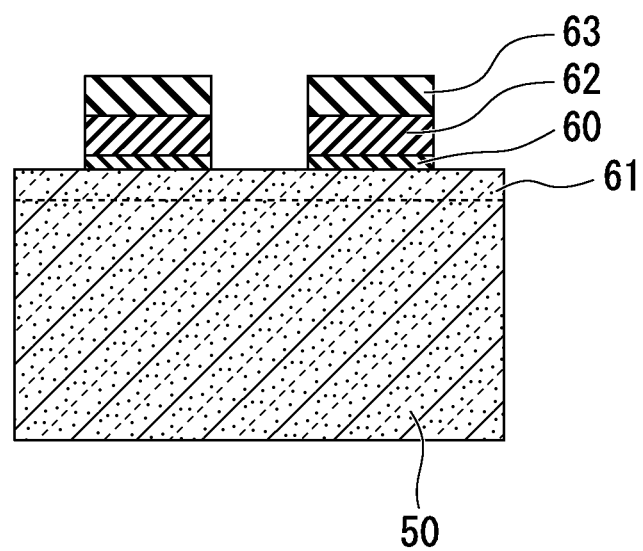
FIG. 14B is a fragmentary cross sectional elevation view, taken along the B-B' line of FIG. 2, illustrating the semiconductor device in a step, subsequent to the step of FIG. 12B, involved in the method of forming the semiconductor device in accordance with one embodiment of the present invention.
Figure 15:
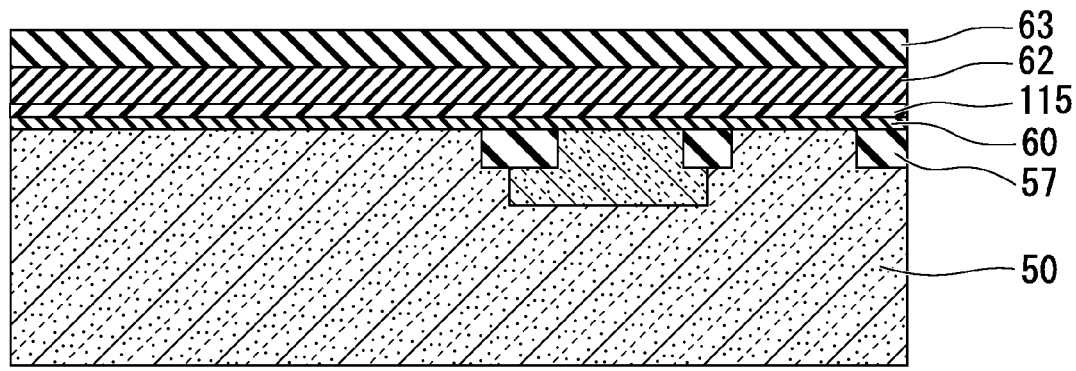
FIG. 15 is a fragmentary cross sectional elevation view illustrating the semiconductor device in a step, subsequent to the step of FIG. 13, involved in the method of forming the semiconductor device in accordance with one embodiment of the present invention.

A silicon oxide film 62 for use as a mask and a carbon film (amorphous carbon film) 63 are deposited in sequence in the peripheral circuit region 102 and the memory cell region 101. As shown in FIG. 14A and FIG. 14B, the silicon oxide film 62 and the carbon film 63 are patterned into a pattern for formation of a groove 65 in the memory cell region 101. When this is done, as shown in FIG. 14B, patterning of the silicon oxide film 62 and the carbon film 63 is not done in the peripheral circuit region 102. Therefore, the semiconductor substrate 50 in the peripheral circuit region 102 is covered by the peripheral gate insulating film 60, the first gate polysilicon film 115, the silicon oxide film 62, and the carbon film 63.

Figure 16A:
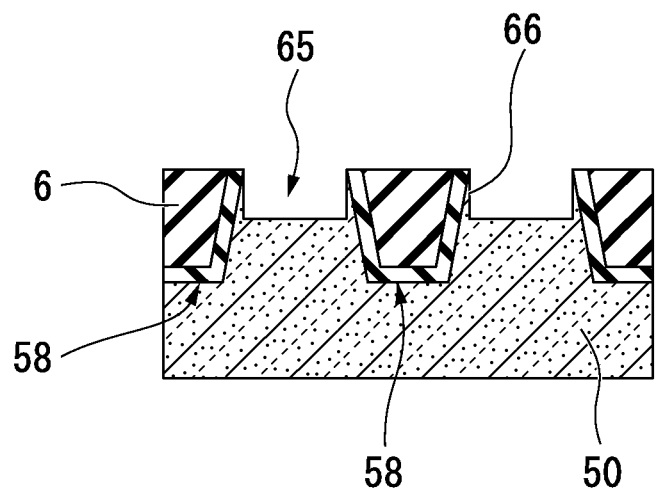
FIG. 16A is a fragmentary cross sectional elevation view, taken along the A-A' line of FIG. 2, illustrating the semiconductor device in a step, subsequent to the step of FIG. 14A, involved in the method of forming the semiconductor device in accordance with one embodiment of the present invention.
Figure 16B:
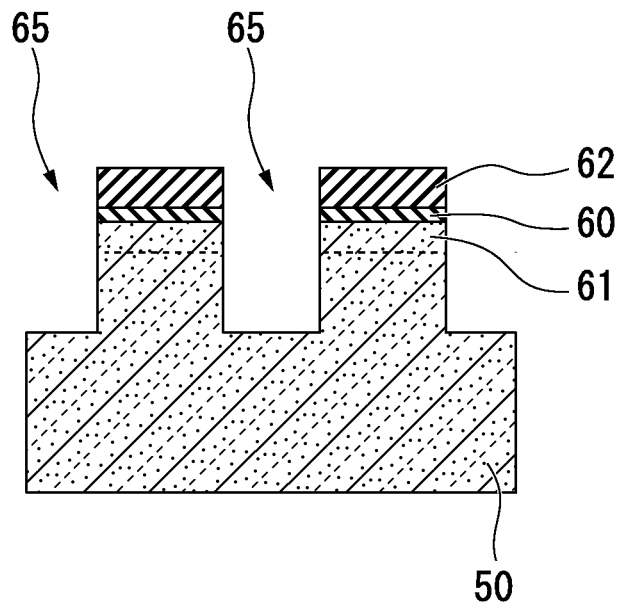
FIG. 16B is a fragmentary cross sectional elevation view, taken along the B-B' line of FIG. 2, illustrating the semiconductor device in a step, subsequent to the step of FIG. 14B, involved in the method of forming the semiconductor device in accordance with one embodiment of the present invention.

As shown in FIG. 16A and FIG. 16B, the semiconductor substrate 50 in the memory cell region 101 is etched so as to form a plurality of grooves 65 that are mutually adjacent. The grooves 65 are formed in a line pattern that extends in a prescribed direction (Y direction in FIG. 2) that intersects with the active region K.

When this is done, the upper surface of the isolation region 58 positioned within the groove 65 is also etched, and forms a shallow groove at a position that is lower than the upper surface of the semiconductor substrate 50. By controlling the etching conditions so that the etching rate of the silicon oxide film is slower than the etching rate of the semiconductor substrate 50, the groove 65 has a relatively deep groove in which the semiconductor substrate 50 is etched and a relative shallow groove in which the isolation region 58 is etched. The relatively deep groove and the relative shallow groove are continuous. That is, the groove 65 is a groove with a step on the bottom part thereof. As a result, as shown in FIG. 16A, in the side surface part of the groove 65 that makes contact with the isolation region 58, a thin-film of silicon remains as a side wall 66, this functioning as a recess-type cell transistor channel region.

It is also possible to etch the semiconductor substrate 50 deeper than the element isolator 58, and in this case a recess-type transistor in which the location of formation of a channel region differs from that of the above-described cell transistor can be provided.

Figure 17:
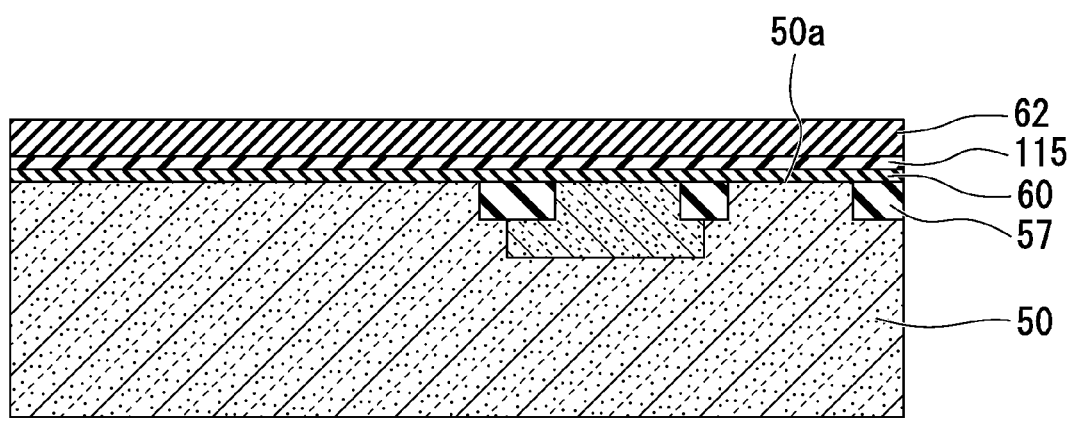
FIG. 17 is a fragmentary cross sectional elevation view illustrating the semiconductor device in a step, subsequent to the step of FIG. 15, involved in the method of forming the semiconductor device in accordance with one embodiment of the present invention.

As shown in FIG. 16A, FIG. 16B, and FIG. 17, the carbon film 63 in the memory cell region 101 and in the peripheral circuit region 102 is removed. By removing the carbon film 63, as shown in FIG. 17, the upper surface 50a of the semiconductor substrate 50 in the peripheral circuit region 102 is in the condition of being covered by the peripheral gate insulating film 60, the first gate polysilicon film 115, and the silicon oxide film 62.

Figure 18A:
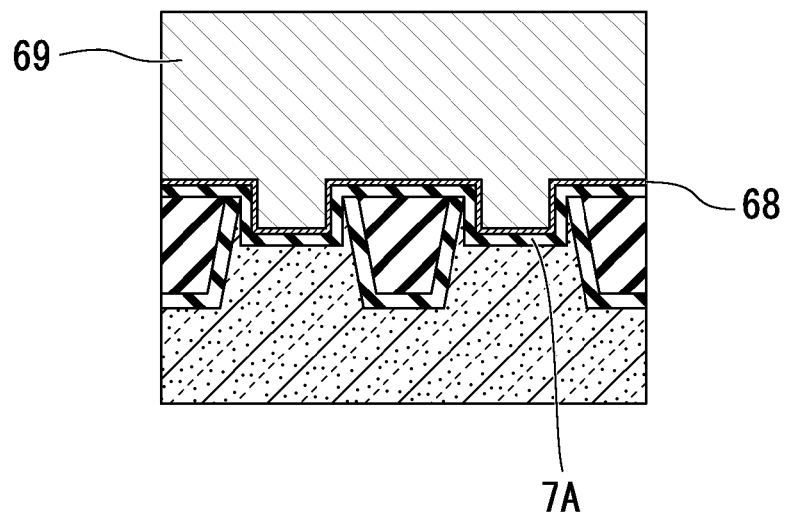
FIG. 18A is a fragmentary cross sectional elevation view, taken along the A-A' line of FIG. 2, illustrating the semiconductor device in a step, subsequent to the step of FIG. 16A, involved in the method of forming the semiconductor device in accordance with one embodiment of the present invention.
Figure 18B:
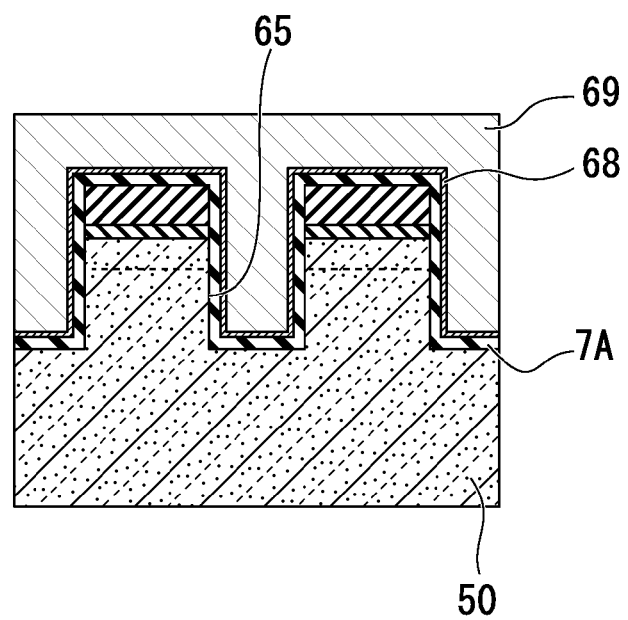
FIG. 18B is a fragmentary cross sectional elevation view, taken along the B-B' line of FIG. 2, illustrating the semiconductor device in a step, subsequent to the step of FIG. 16B, involved in the method of forming the semiconductor device in accordance with one embodiment of the present invention.

As shown in FIG. 18A and FIG. 18B, a cell gate insulating film 7A made of a silicon oxide film with a thickness of approximately 4 nm to 7 nm is formed by thermal oxidation so as to cover the part of the semiconductor substrate 50 in which a silicon surface is exposed. By doing this, the cell gate insulating film 7A in the memory cell region 101 is formed so as to cover the inside surface of the groove 65. The cell gate insulating film 7A functions as the first gate insulating film 7A of the buried-gate MOS transistor (first MOS transistor Tr1) that is disposed in the memory cell region 101.

An inner surface layer 8 made of a titanium nitride (TiN) and a tungsten (W) layer 69 are sequentially deposited onto the memory cell region 101 and onto the peripheral circuit region 102. When this is done, the tungsten layer 69 in the memory cell region 101 is formed to a film thickness that completely fills the inside of the groove 65.

Figure 19A:
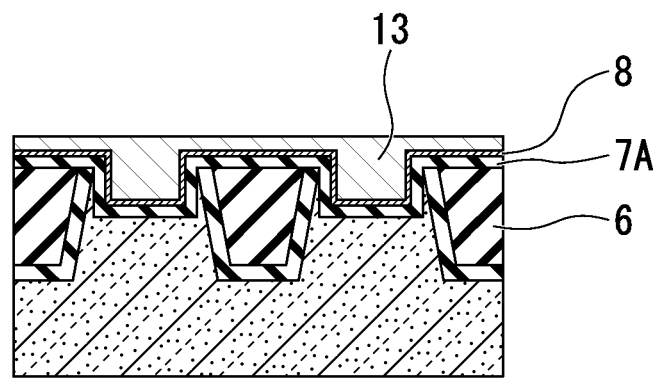
FIG. 19A is a fragmentary cross sectional elevation view, taken along the A-A' line of FIG. 2, illustrating the semiconductor device in a step, subsequent to the step of FIG. 18A, involved in a method of forming the semiconductor device in accordance with one embodiment of the present invention.
Figure 19B:
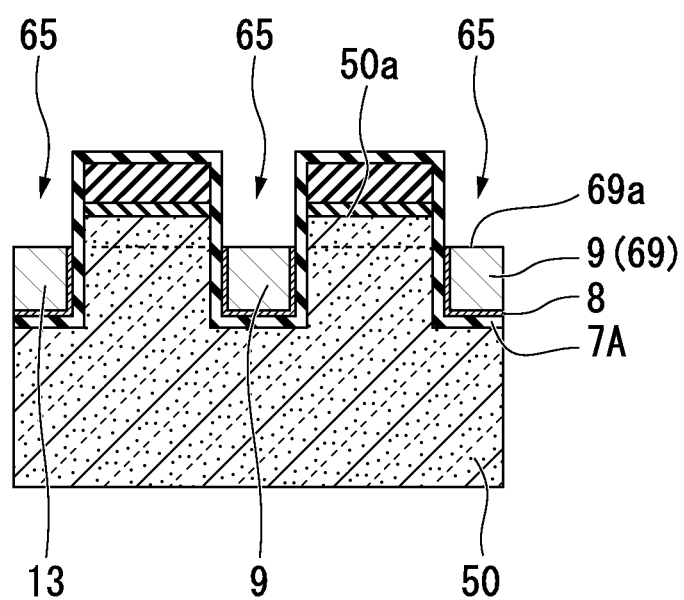
FIG. 19B is a fragmentary cross sectional elevation view, taken along the B-B' line of FIG. 2, illustrating the semiconductor device in a step, subsequent to the step of FIG. 18B, involved in the method of forming the semiconductor device in accordance with one embodiment of the present invention.

As shown in FIG. 19A and FIG. 19B, the upper surface 69a of the tungsten layer 69 is etched back up to a position that is lower than the upper surface 50a of the semiconductor substrate 50. When this is done, the etch-back conditions are adjusted so that the inner surface layer 8 and the tungsten layer 69 remain in the bottom part of the groove 65. By this etch-back process, a first word line 9 and a second word line 13 made of the tungsten layer 69 are formed on the inside of the groove 65 and have a structure that serves as well as a part of the gate electrode.

Figure 20:
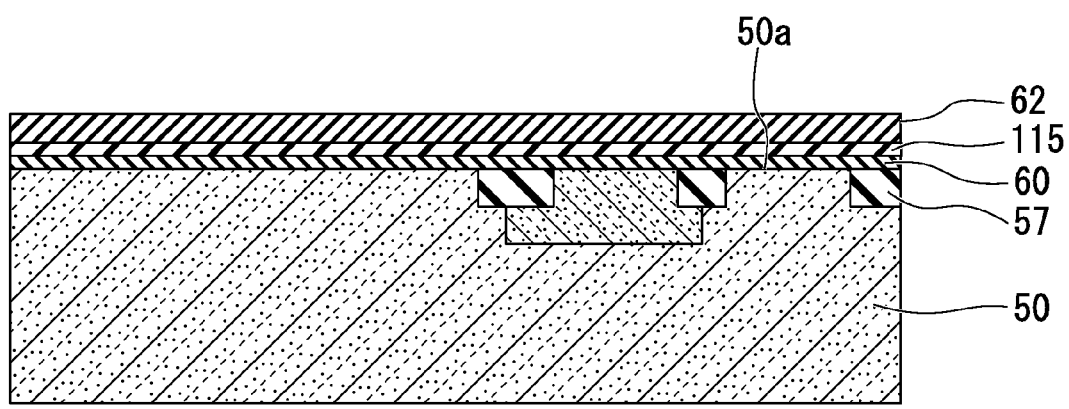
FIG. 20 is a fragmentary cross sectional elevation view illustrating the semiconductor device in a step, subsequent to the step of FIG. 17, involved in the method of forming the semiconductor device in accordance with one embodiment of the present invention.

When this is done, as shown in FIG. 20, because the upper surface 50a of the semiconductor substrate 50 in the peripheral circuit region 102 is planar, the inner surface layer 8 and the tungsten layer 69 are completely removed at the time of the etching back process described in FIGS. 19A and 19B.

Figure 21A:
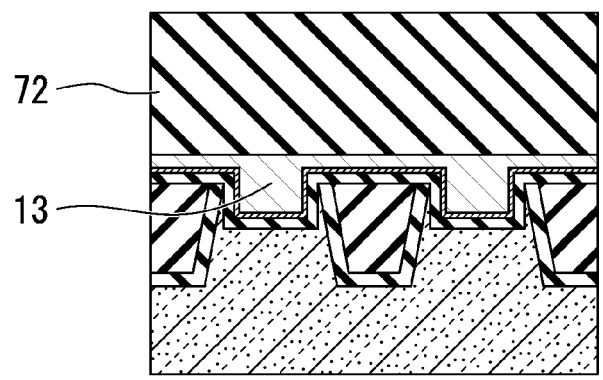
FIG. 21A is a fragmentary cross sectional elevation view, taken along the A-A' line of FIG. 2, illustrating the semiconductor device in a step, subsequent to the step of FIG. 19A, involved in the method of forming the semiconductor device in accordance with one embodiment of the present invention.
Figure 21B:
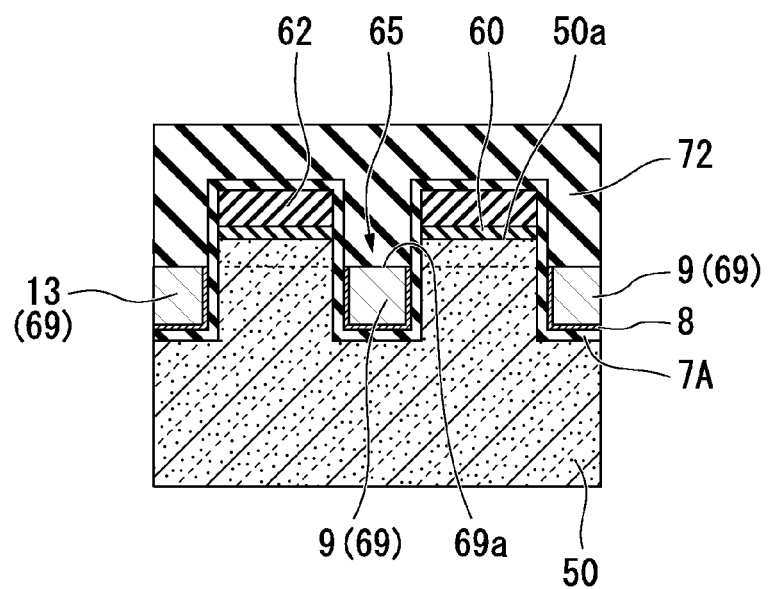
FIG. 21B is a fragmentary cross sectional elevation view, taken along the B-B' line of FIG. 2, illustrating the semiconductor device in a step, subsequent to the step of FIG. 19B, involved in the method of forming the semiconductor device in accordance with one embodiment of the present invention.

As shown in FIG. 21A and FIG. 21B, a silicon nitride ($Si_3N_4$) film 72 is formed so as to cover the upper surfaces of the first word line 9 and the second word line 13 (upper surface 69*a* of the tungsten layer 69) and also so as to fill the inside of the groove 65. When this is done, it is preferable that the method of forming the silicon nitride film 72 be LP-CVD (low-pressure CVD) that uses dichlorosilane ($SiH_2Cl_2$) and ammonia ($NH_3$) as material gases. By forming the silicon nitride film 72 using such a method, it is possible to prevent the occurrence of voids within the groove 65.

Figure 22A:
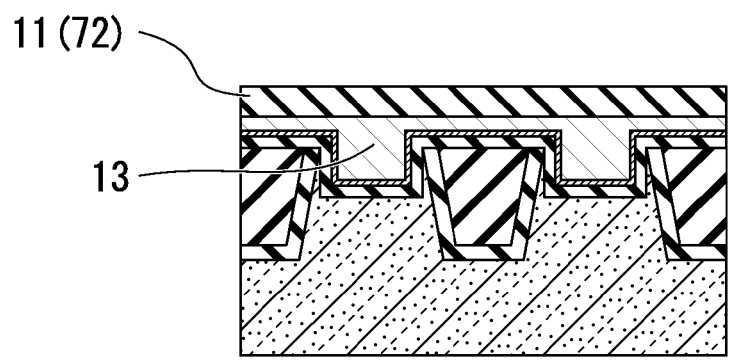
FIG. 22A is a fragmentary cross sectional elevation view, taken along the A-A' line of FIG. 2, illustrating the semiconductor device in a step, subsequent to the step of FIG. 21A, involved in the method of forming the semiconductor device in accordance with one embodiment of the present invention.
Figure 22B:
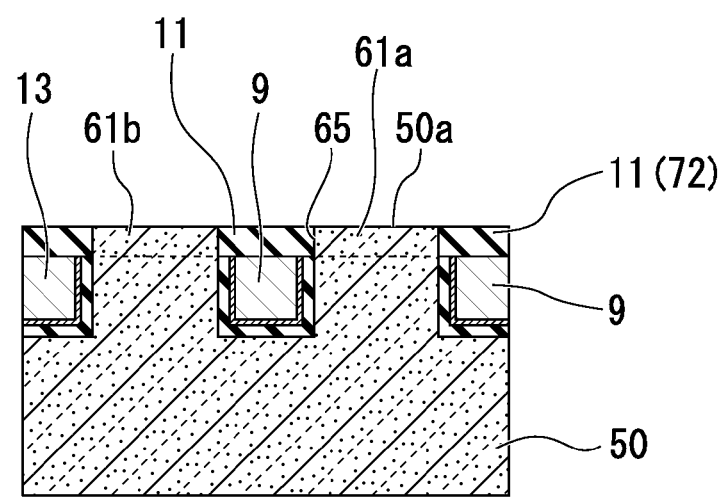
FIG. 22B is a fragmentary cross sectional elevation view, taken along the B-B' line of FIG. 2, illustrating the semiconductor device in a step, subsequent to the step of FIG. 21B, involved in the method of forming the semiconductor device in accordance with one embodiment of the present invention.
Figure 23:
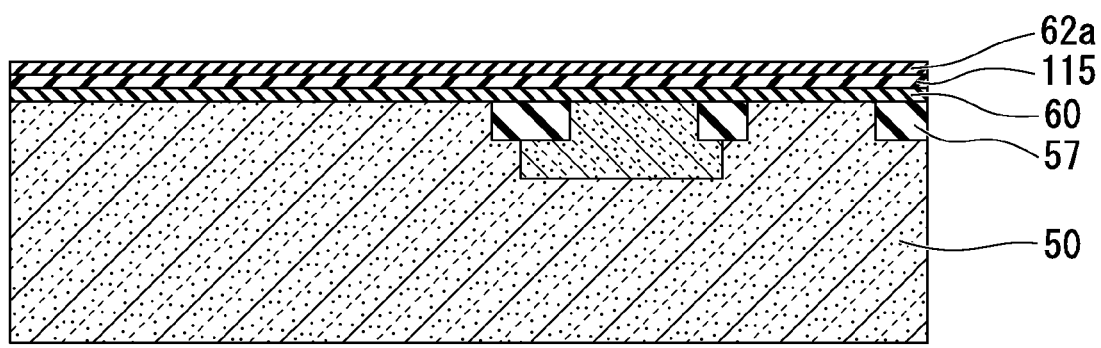
FIG. 23 is a fragmentary cross sectional elevation view illustrating the semiconductor device in a step, subsequent to the step of FIG. 20, involved in the method of forming the semiconductor device in accordance with one embodiment of the present invention.

As shown in FIG. 22A and FIG. 22B, the silicon nitride film 72 in the region that is not covered by the silicon oxide film 62 as a mask is etched back to form a buried insulating film 11 made of the silicon nitride film 72. When this is done, the etch back amount is adjusted so that the upper surface of the silicon nitride film 72 is substantially leveled with the upper surface 50*a* of the semiconductor substrate 50. By this etching back process, as shown in FIG. 23, all of the silicon nitride film 72 in the peripheral circuit region 102 is removed. A part of the silicon oxide film 62 used as a mask is also removed, and a thinned silicon oxide film 62*a* remains in the peripheral circuit region 102.

Figure 24:
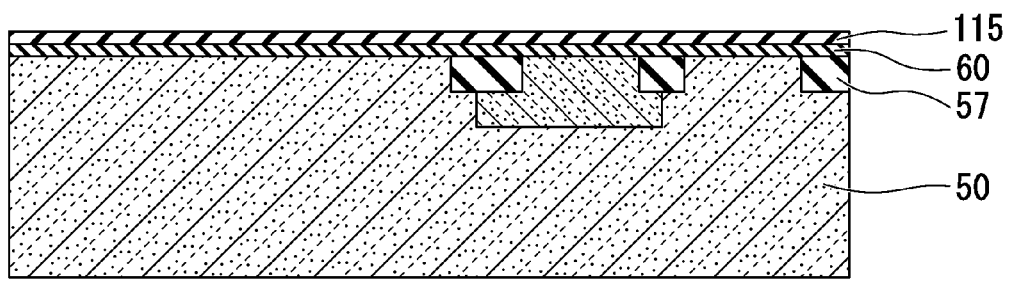
FIG. 24 is a fragmentary cross sectional elevation view illustrating the semiconductor device in a step, subsequent to the step of FIG. 23, involved in the method of forming the semiconductor device in accordance with one embodiment of the present invention.

As shown in FIG. 24, the thinned silicon oxide film 62*a* that remains in the memory cell region 101 and in the peripheral circuit region 102 is removed by wet etching. The first gate polysilicon film 115 is exposed in the peripheral circuit region 102.

By the above processes, a buried insulating film 11 that covers the upper surface of the first word line 9 and the upper surface of the second word line 13 in the memory cell region 101, and that has a constitution of burying the upper region of the groove 65 is formed by a silicon nitride film.

Figure 25A:
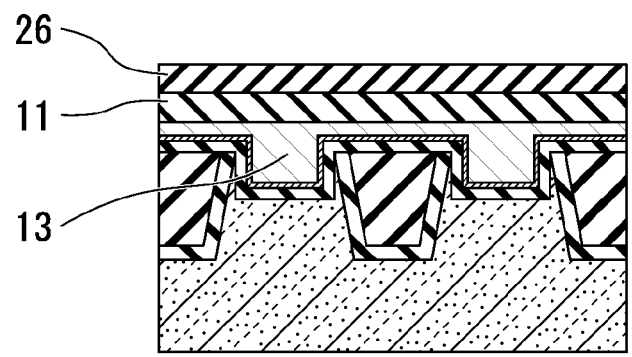
FIG. 25A is a fragmentary cross sectional elevation view, taken along the A-A' line of FIG. 2, illustrating the semiconductor device in a step, subsequent to the step of FIG. 22A, involved in the method of forming the semiconductor device in accordance with one embodiment of the present invention.
Figure 25B:
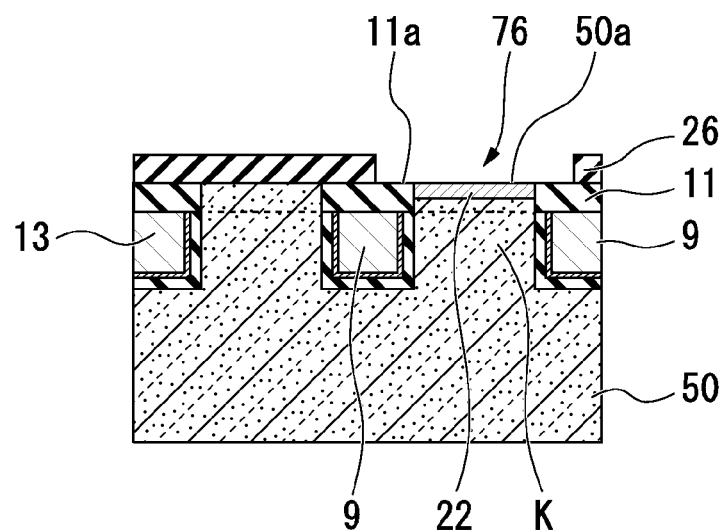
FIG. 25B is a fragmentary cross sectional elevation view, taken along the B-B' line of FIG. 2, illustrating the semiconductor device in a step, subsequent to the step of FIG. 22B, involved in the method of forming the semiconductor device in accordance with one embodiment of the present invention.
Figure 26:
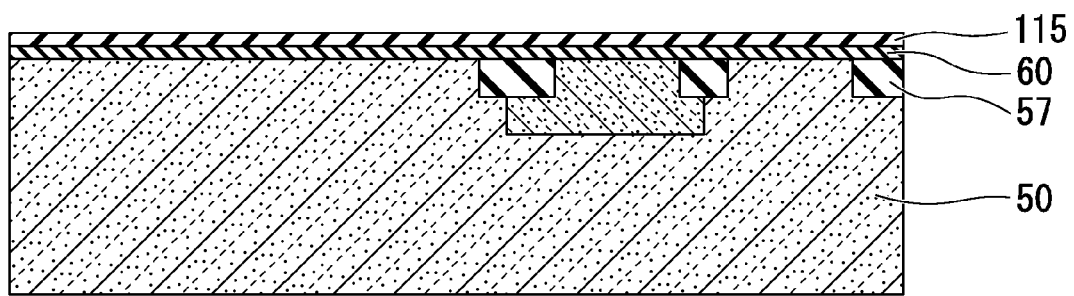
FIG. 26 is a fragmentary cross sectional elevation view illustrating the semiconductor device in a step, subsequent to the step of FIG. 24, involved in the method of forming the semiconductor device in accordance with one embodiment of the present invention.

As shown in FIG. 25A and FIG. 25B, a first interlayer insulating film 26 is formed in the memory cell region 101 and the peripheral circuit region 102, for example made of a silicon oxide film and with a thickness of approximately 40 nm to 50 nm.

As shown in FIG. 25B, part of the first interlayer insulating film 26 in the memory cell region 101 is removed to form a first contact aperture 76.

When this is done, the first contact aperture 76, similar to the case shown in FIG. 2, is formed as a line aperture pattern extending in the same direction (Y direction in FIG. 2) as the first word line 9.

By the formation of the aperture pattern, the upper surface 50*a* of the semiconductor substrate 50 is exposed in the part of the intersection between the pattern of the first contact aperture 76 and the active region K. The exposed region is taken as the bit line connection region. When this is done, part of the upper surface 11*a* of the buried insulating film 11 is exposed at the bottom part of the first contact aperture 76.

Ion implantation is performed of an n-type impurity (arsenic, phosphorus or the like) into the surface layer part of the active region K that is exposed from the bottom part of the first contact aperture 76, to form an n-type first high-concentration impurity diffusion layer 22. When this is done, an example that can be given of the ion implantation dose amount is in the range from $1 \times 10^{14}$ to $5 \times 10^{14}$ atoms/$cm^2$. The ion implantation may be performed before removing the photoresist mask film for forming the first contact aperture 76. The n-type first high-concentration impurity diffusion layer 22 functions as the source or drain region of a recess-type cell transistor and also has the function of reducing the connection resistance of the bit lines formed in subsequent process steps.

At this point, a silicon surface (the upper surface 50*a* of the semiconductor substrate 50) is exposed at the bottom part of the first contact aperture 76 in the memory cell region 101. Also, the first gate polysilicon film 115 is exposed in the peripheral circuit region 102. Wet etching process using dilute hydrofluoric acid (HF) as the chemical is performed to remove the natural oxidized film, thereby exposing a clean silicon surface (upper surface 50*a*) of the semiconductor substrate 50.

By this etching process, the surface of the first gate polysilicon film 115 is also cleaned.

When doing this wet etching process, because the buried insulating film 11 is formed by the silicon nitride film in the present embodiment, the buried insulating film 11 is not etched, and it is possible to prevent the exposure of the upper surfaces of the first word line 9 and the second word line 13.

Figure 27A:
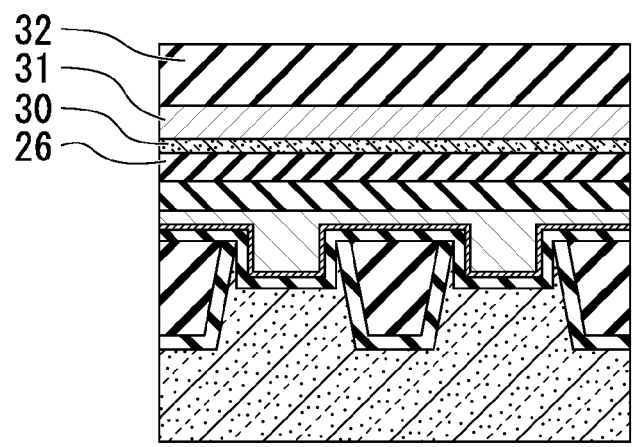
FIG. 27A is a fragmentary cross sectional elevation view, taken along the A-A' line of FIG. 2, illustrating the semiconductor device in a step, subsequent to the step of FIG. 25A, involved in the method of forming the semiconductor device in accordance with one embodiment of the present invention.
Figure 27B:
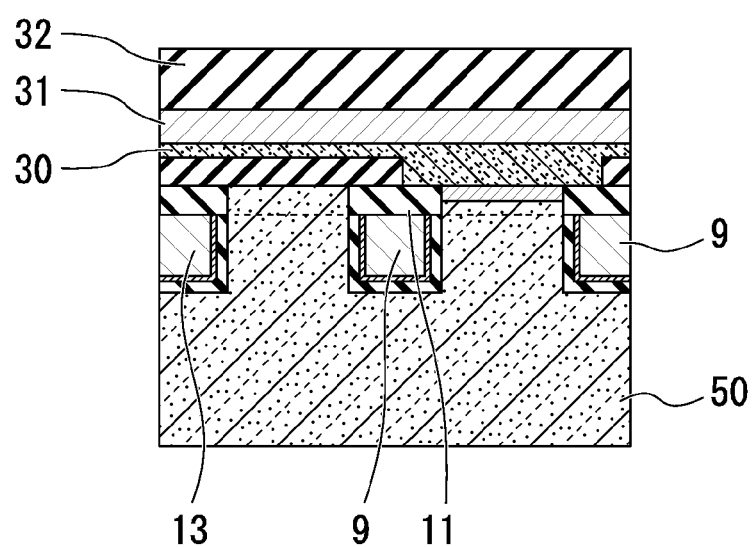
FIG. 27B is a fragmentary cross sectional elevation view, taken along the B-B' line of FIG. 2, illustrating the semiconductor device in a step, subsequent to the step of FIG. 25B, involved in the method of forming the semiconductor device in accordance with one embodiment of the present invention.
Figure 28:
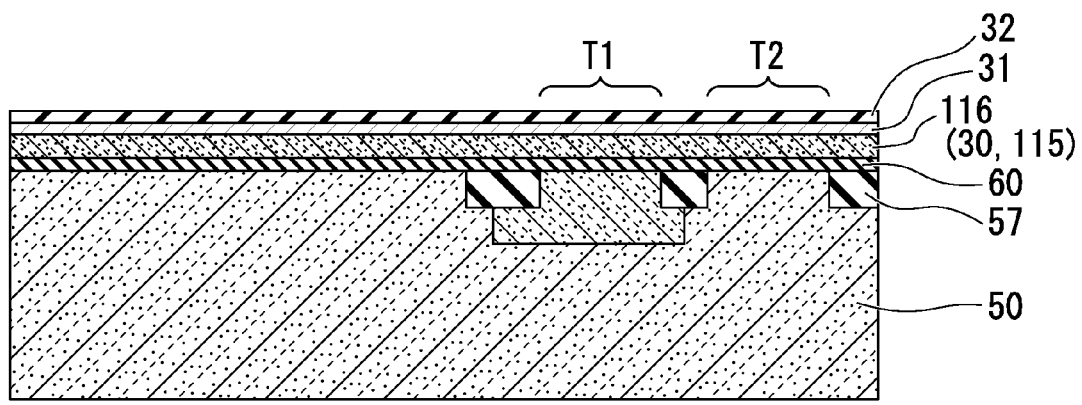
FIG. 28 is a fragmentary cross sectional elevation view illustrating the semiconductor device in a step, subsequent to the step of FIG. 26, involved in the method of forming the semiconductor device in accordance with one embodiment of the present invention.

As shown in FIG. 27A, FIG. 27B, and FIG. 28, a bottom part conducting film 30 made of a polysilicon film that substantially does not include an impurity, is formed in the memory cell region 101 and the peripheral circuit region 102. By the formation of this bottom part conducting film 30, as shown in FIG. 28, the first gate polysilicon film 115 and bottom part conducting film 30 are integrated in the peripheral circuit region 102, to form the second gate polysilicon film 116.

As shown in FIG. 28, using a photoresist film (not shown) as a mask, a p-type impurity such as boron is ion implanted into the second gate polysilicon film 116 over the region T1 that forms the p-channel MOS transistor (second MOS transistor Tr2) in the peripheral circuit region 102.

In the same manner, an n-type impurity such as phosphorus is ion implanted into the second gate polysilicon film 116 over the region T2 that forms the n-channel MOS transistor (third MOS transistor Tr3).

In this manner, by performing ion implantation with ions having differing conductivity types over each of the regions (T1 and T2) of the second gate polysilicon film 116, the conductivity type of the second gate electrode 120*a* of the second MOS transistor Tr2 formed over the peripheral circuit region 102 becomes p-type, and the conductivity type of the third gate electrode 120*b* of the third MOS transistor Tr3 formed over the peripheral circuit region 102 becomes n-type. For this reason, the transistor characteristics are improved.

When performing ion implantation of the n-type impurity into the second gate polysilicon film 116, ion implantation of an n-type impurity into the bottom part conducting film 30 on the memory cell region 101 may be simultaneously done. By ion implantation of an n-type impurity into the bottom part conducting film 30, the resistance of the bit line formed in the memory cell region 101 can be reduced.

A metal film 31 of a tungsten film or the like and a silicon nitride film 32 are sequentially deposited over the bottom part conducting film 30 (second gate polysilicon film 116) in the memory cell region 101 and the peripheral circuit region 102.

Figure 29A:
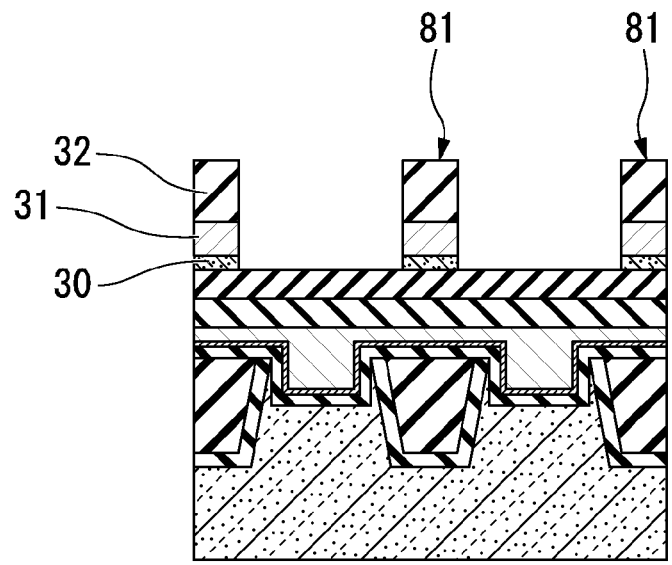
FIG. 29A is a fragmentary cross sectional elevation view, taken along the A-A' line of FIG. 2, illustrating the semiconductor device in a step, subsequent to the step of FIG. 27A, involved in the method of forming the semiconductor device in accordance with one embodiment of the present invention.
Figure 29B:
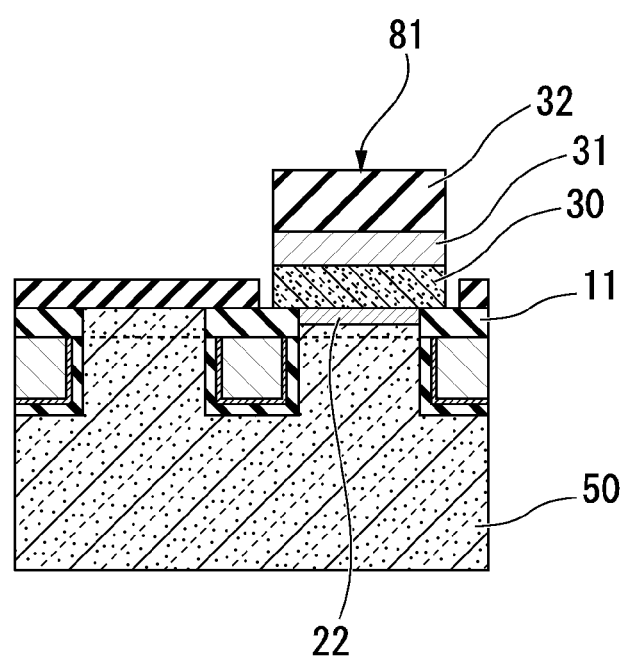
FIG. 29B is a fragmentary cross sectional elevation view, taken along the B-B' line of FIG. 2, illustrating the semiconductor device in a step, subsequent to the step of FIG. 27B, involved in the method of forming the semiconductor device in accordance with one embodiment of the present invention.
Figure 30:
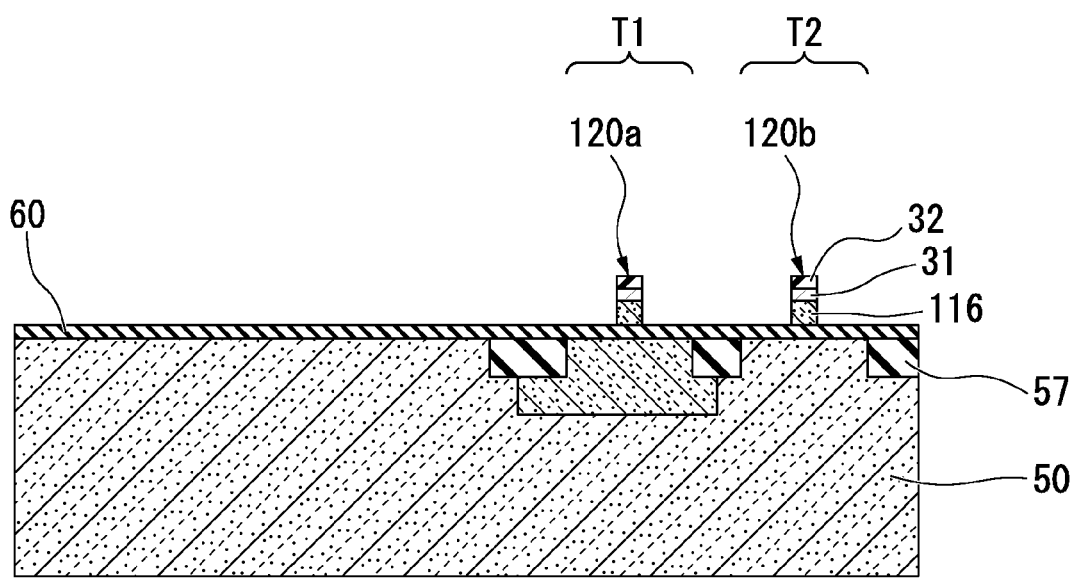
FIG. 30 is a fragmentary cross sectional elevation view illustrating the semiconductor device in a step, subsequent to the step of FIG. 28, involved in the method of forming the semiconductor device in accordance with one embodiment of the present invention.

As shown in FIG. 29A, FIG. 29B, and FIG. 30, the laminated film of the bottom part conducting film 30, the metal film 31, and the silicon nitride film 32 in the memory cell region 101 and the peripheral circuit region 102 are patterned to a prescribed shape, so as to form a line-shaped bit line 15 that extends in a direction (the X direction for the case of the structure shown in FIG. 2) that intersects with the first word line 9 in the memory cell region 101. Although the bit line 15 shown, in FIGS. 29A and 29B, as shown in FIG. 2, is on a straight line that perpendicularly intersects with the first word line 9, there is no restriction to a straight line shape for the bit line 15. It may have a shape that is partially curved, a bent line, or a wave shape. The bottom part conducting film 30 below the bit line 15 is connected to the first high-concentration impurity diffusion layer 22.

By this patterning, as shown in FIG. 30, the second gate electrode 120*a* of the second MOS transistor Tr2 and the third gate electrode 120b of the third MOS transistor Tr1 are formed in the peripheral circuit region 102.

In the present embodiment, by forming the bit line 15 in the memory cell region 101 and the gate electrodes (second gate electrode 120a and third gate electrode 120b) in the peripheral circuit region 102 in the same processes, it is possible to suppress an increase in the number of manufacturing process steps.

Figure 31A:
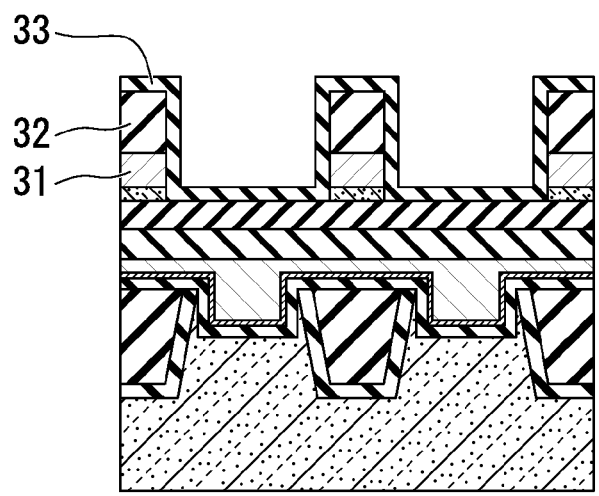
FIG. 31A is a fragmentary cross sectional elevation view, taken along the A-A' line of FIG. 2, illustrating the semiconductor device in a step, subsequent to the step of FIG. 29A, involved in the method of forming the semiconductor device in accordance with one embodiment of the present invention.
Figure 31B:
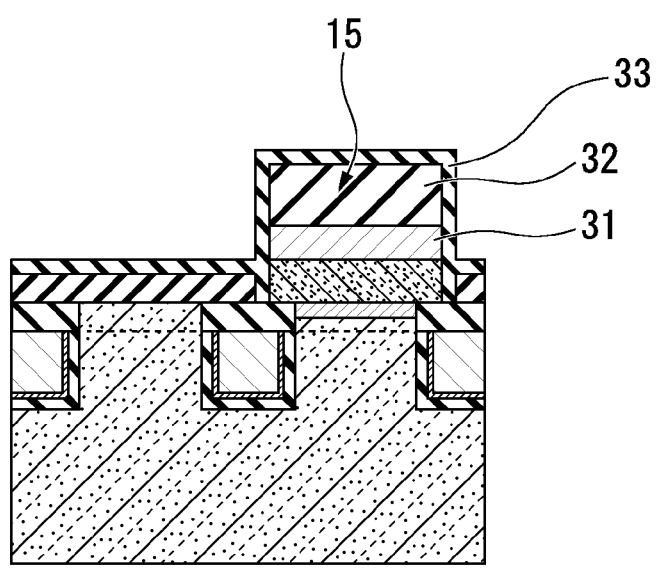
FIG. 31B is a fragmentary cross sectional elevation view, taken along the B-B' line of FIG. 2, illustrating the semiconductor device in a step, subsequent to the step of FIG. 29B, involved in the method of forming the semiconductor device in accordance with one embodiment of the present invention.

As shown in FIG. 31A and FIG. 31B, a silicon nitride film 33 is formed so as to cover the bit line 15 in the memory cell region 101 and the gate electrodes (second gate electrode 120a and third gate electrode 120b) in the peripheral circuit region 102.

Figure 32:
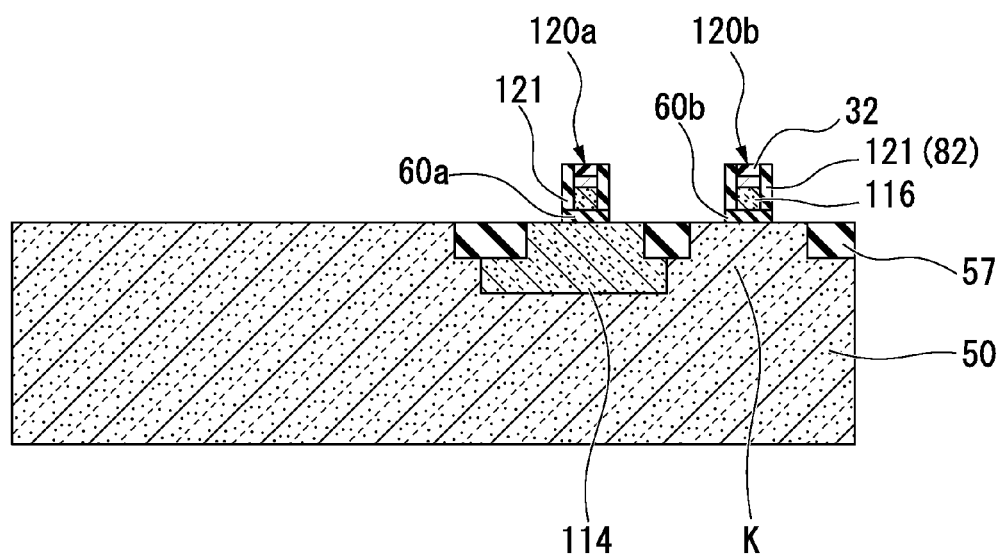
FIG. 32 is a fragmentary cross sectional elevation view illustrating the semiconductor device in a step, subsequent to the step of FIG. 30, involved in the method of forming the semiconductor device in accordance with one embodiment of the present invention.

Using a photoresist film (not shown) to mask the memory cell region 101, anisotropic dry etching process is performed. By this etching process, as shown in FIG. 32, a silicon nitride side wall 121 made of the silicon nitride film 33 is formed on the side surface of the gate electrodes (second gate electrode 120a and third gate electrode 120b) in the peripheral circuit region 102. When this is done, the film thickness of the silicon nitride side wall 121 can be adjusted in accordance with the desired characteristics of the MOS transistors. A low-concentration impurity diffusion layer (LDD layer) may be formed inside the active region K at both sides of the gate electrodes by ion implantation before the forming of the silicon nitride side wall 121.

Figure 33:
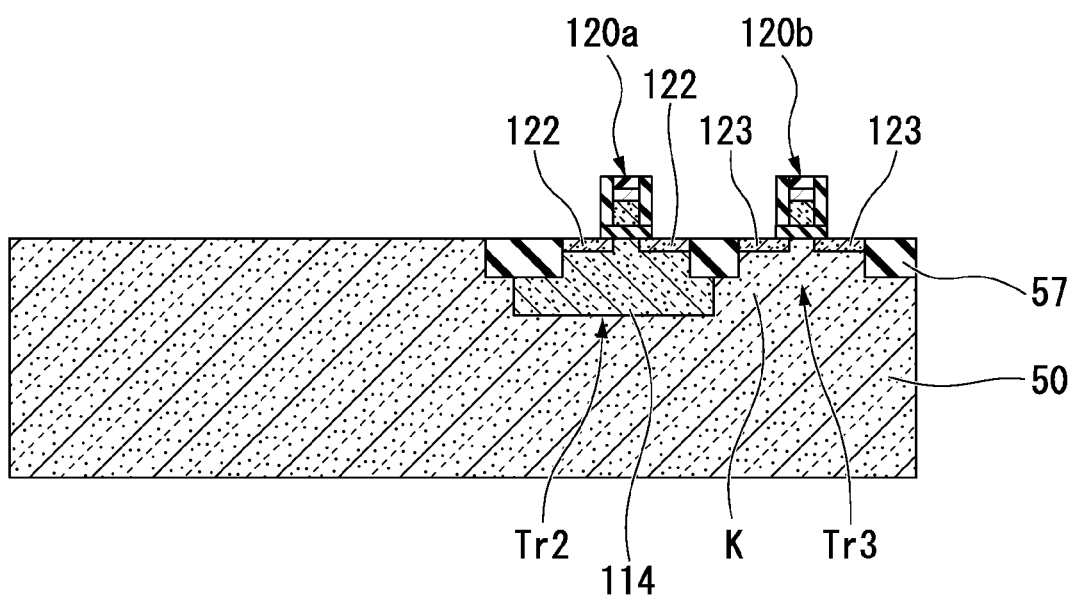
FIG. 33 is a fragmentary cross sectional elevation view illustrating the semiconductor device in a step, subsequent to the step of FIG. 32, involved in the method of forming the semiconductor device in accordance with one embodiment of the present invention.

Using a photoresist film (not shown) as a mask, ion implantation is performed of the peripheral circuit region 102 to form in the surface layer part of the active region, as shown in FIG. 33, second impurity diffusion layers 122 and third impurity diffusion layers 123. The second impurity diffusion layers 122 are regions in which a p-type impurity is diffused and function as the source and drain regions of the second MOS transistor Tr2. The third impurity diffusion layers 123 are regions in which an n-type impurity is diffused and function as the source and drain regions of the third MOS transistor Tr3.

Figure 34A:
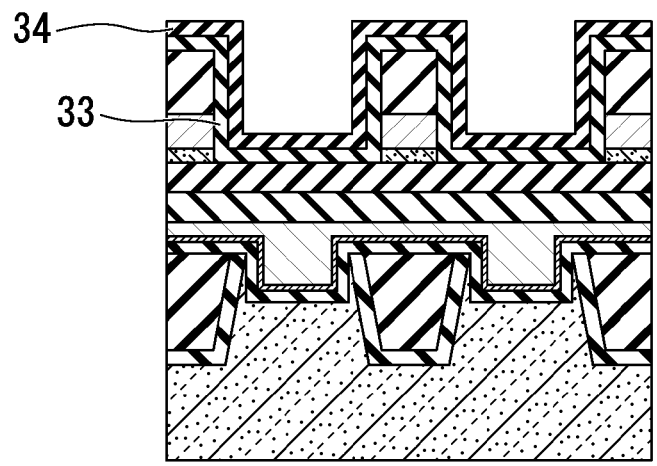
FIG. 34A is a fragmentary cross sectional elevation view, taken along the A-A' line of FIG. 2, illustrating the semiconductor device in a step, subsequent to the step of FIG. 31A, involved in the method of forming the semiconductor device in accordance with one embodiment of the present invention.
Figure 34B:
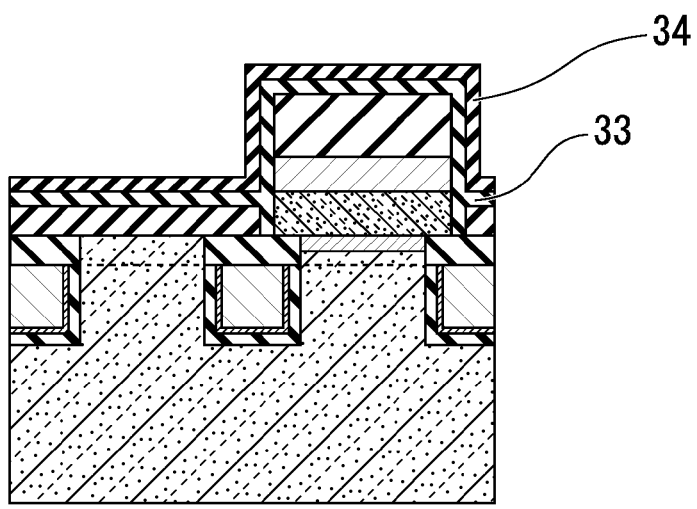
FIG. 34B is a fragmentary cross sectional elevation view, taken along the B-B' line of FIG. 2, illustrating the semiconductor device in a step, subsequent to the step of FIG. 31B, involved in the method of forming the semiconductor device in accordance with one embodiment of the present invention.
Figure 35:
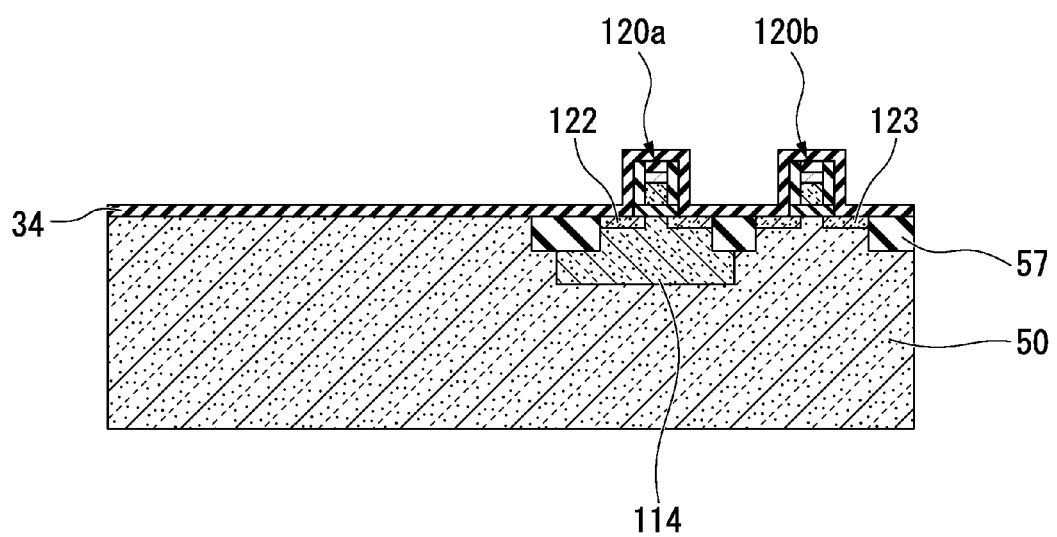
FIG. 35 is a fragmentary cross sectional elevation view illustrating the semiconductor device in a step, subsequent to the step of FIG. 33, involved in the method of forming the semiconductor device in accordance with one embodiment of the present invention.

As shown in FIG. 34A, FIG. 34B, and FIG. 35, a liner film 34 made of a silicon nitride film or the like with a thickness of 10 nm to 20 nm is formed so as to cover the memory cell region 101 and the peripheral circuit region 102. By forming the liner film 34 made of a film that resists oxidation, it is possible to prevent damage by oxidation in the annealing process of the SOD film, which will be described later, of the lower layer elements that have already been formed.

Figure 36A:
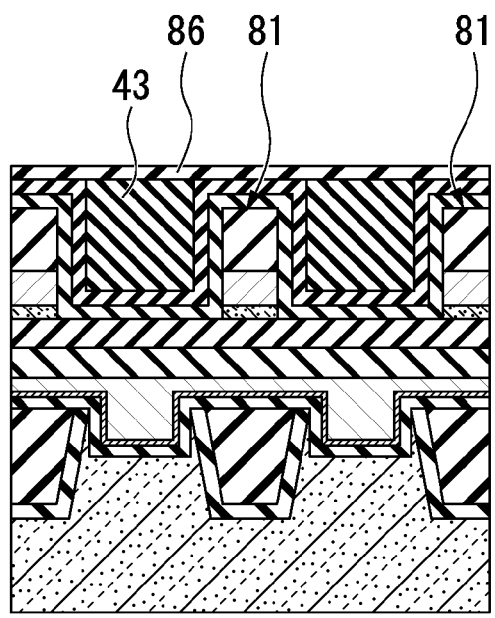
FIG. 36A is a fragmentary cross sectional elevation view, taken along the A-A' line of FIG. 2, illustrating the semiconductor device in a step, subsequent to the step of FIG. 34A, involved in the method of forming the semiconductor device in accordance with one embodiment of the present invention.
Figure 36B:
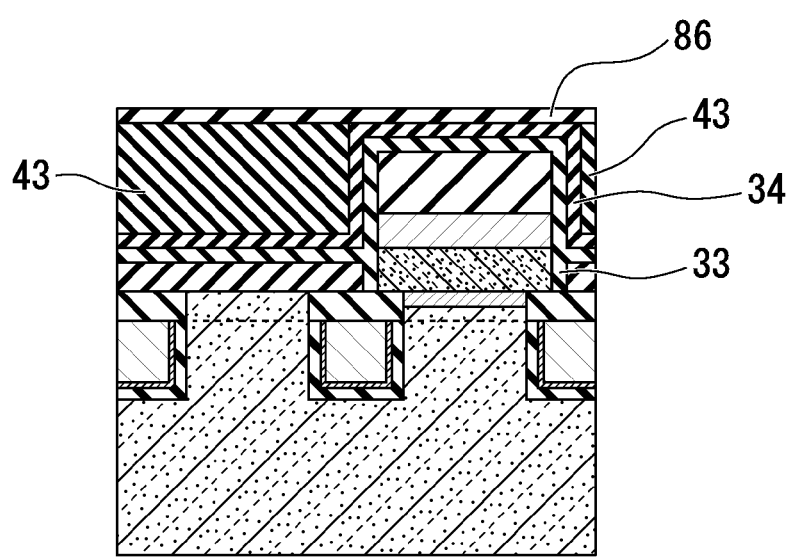
FIG. 36B is a fragmentary cross sectional elevation view, taken along the B-B' line of FIG. 2, illustrating the semiconductor device in a step, subsequent to the step of FIG. 343, involved in the method of forming the semiconductor device in accordance with one embodiment of the present invention.
Figure 37:
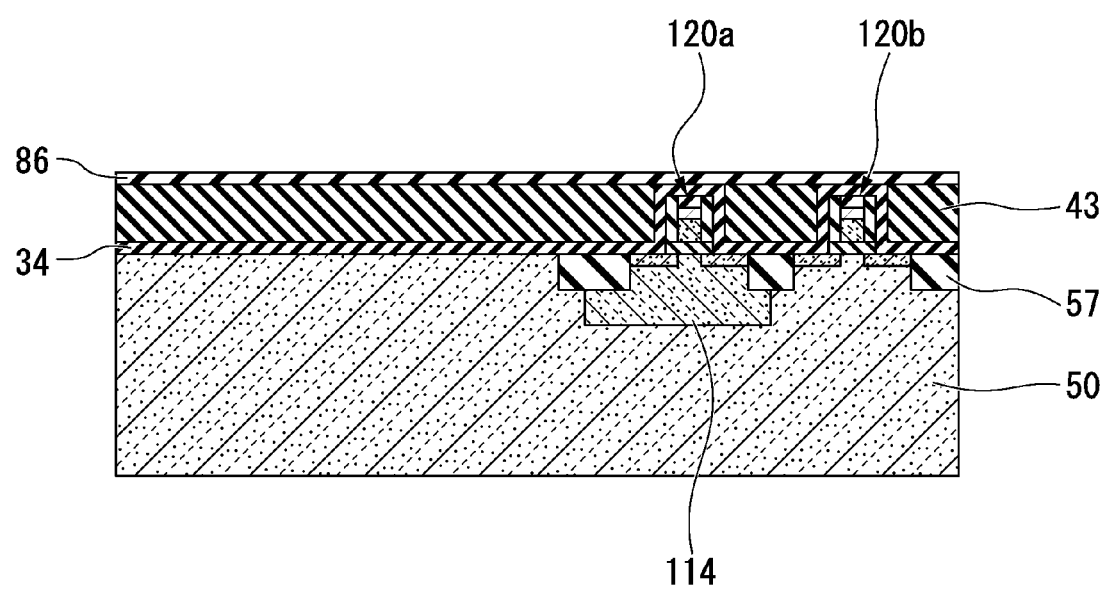
FIG. 37 is a fragmentary cross sectional elevation view illustrating the semiconductor device in a step, subsequent to the step of FIG. 35, involved in the method of forming the semiconductor device in accordance with one embodiment of the present invention.

As shown in FIGS. 36A, 36B, and FIG. 37, an SOD film which is a coating film is deposited by spinning, so as to fill between bit lines 15 in the memory cell region 101 and between the second gate electrode 120a and the third gate electrode 120b in the peripheral circuit region 102. An example of an SOD film is a polysilizane. Next, annealing processing is performed in a high-temperature steam ($H_2O$) atmosphere, to modify the SOD film to be a solid deposited film 43. Next, CMP processing is performed until the upper surface of the liner film 34 in the memory cell region 101 is exposed, and the surface of the deposited film 43 is planarized.

A second interlayer insulating film 86 made of a silicon oxide film is formed by CVD so as to cover the memory cell region 101 and the peripheral circuit region 102.

Figure 38A:
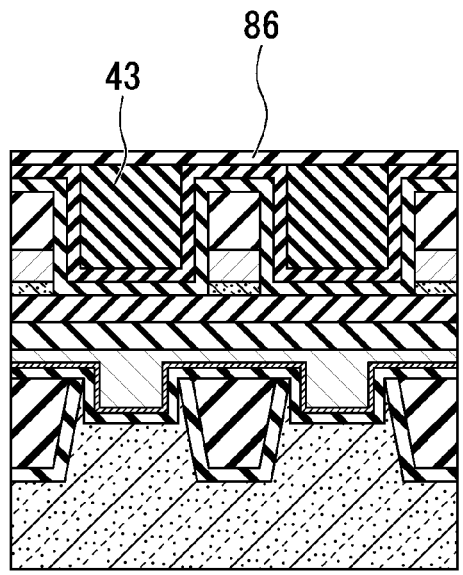
FIG. 38A is a fragmentary cross sectional elevation view, taken along the A-A' line of FIG. 2, illustrating the semiconductor device in a step, subsequent to the step of FIG. 36A, involved in the method of forming the semiconductor device in accordance with one embodiment of the present invention.
Figure 38B:
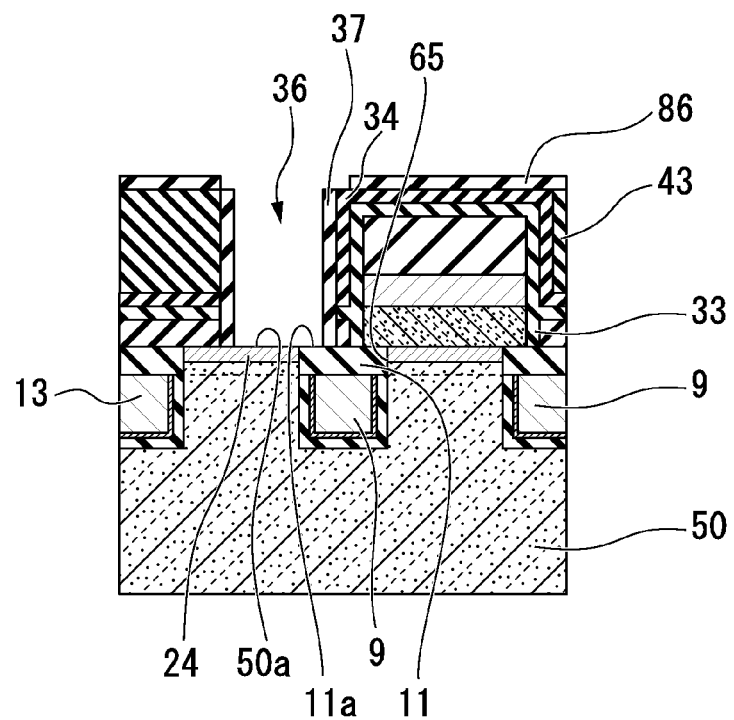
FIG. 38B is a fragmentary cross sectional elevation view, taken along the B-B' line of FIG. 2, illustrating the semiconductor device in a step, subsequent to the step of FIG. 36B, involved in the method of forming the semiconductor device in accordance with one embodiment of the present invention.

Photolithography and dry etching process are performed to form a connection hole (second contact aperture) 36 as shown in FIG. 38A and FIG. 38B. When this is done, the position of forming a second contact aperture 36, in the case of the structure that was described based on FIG. 2, is the position corresponding to the capacitor contact plug formation region 17 of FIG. 2. In this case, the second contact aperture 36 can be formed using the SAC (self-alignment contact) that uses the silicon nitride film 33 and the liner film 34 that had been formed on the side surface of the bit line 15 as a side wall.

By the etching process when the second contract aperture 36 is formed, the upper surface 50a of the semiconductor substrate 50 and the upper surface 11a of the buried insulating film 11 are exposed in the region of intersection between the second contact aperture 36 and the active region K shown in FIG. 2. The first word line 9 constituted to be buried into the groove 65 exists below the exposed region of the semiconductor substrate 50. Also, the buried insulating film 11 is buried into the groove 65 and formed above the first word line 9.

A side wall 37 made of a silicon nitride film is formed so as to cover the inner wall of the second contact aperture 36. An n-type impurity (phosphorus or the like) is ion implanted into the upper surface 50a of the semiconductor substrate 50 that is exposed at the bottom part of the second contact aperture 36. By this ion implantation, an n-type second high-concentration impurity diffusion layer 24 is formed in the vicinity of the upper surface 50a of the semiconductor substrate 50 exposed at the bottom part of the second contact aperture 36. An example of the ion implantation dose amount is in the range from $1 \times 10^{14}$ atoms/cm$^2$ to $5 \times 10^{14}$ atoms/cm$^2$. The second high-concentration impurity diffusion layer 24 functions as the source or drain region in the recess-type transistor of the present embodiment.

A wet etching process using dilute hydrofluoric acid (HF) as the chemical is performed to expose a clean silicon surface (upper surface 50a) of the semiconductor substrate 50. In the present embodiment, by forming the buried insulating film 11 made of a silicon nitride film so as to be buried over the first word line 9, it is possible to prevent the etching of the buried insulating film 11 at the time of the etching process.

For this reason, it is possible to prevent the exposure of the first word line 9.

Figure 39A:
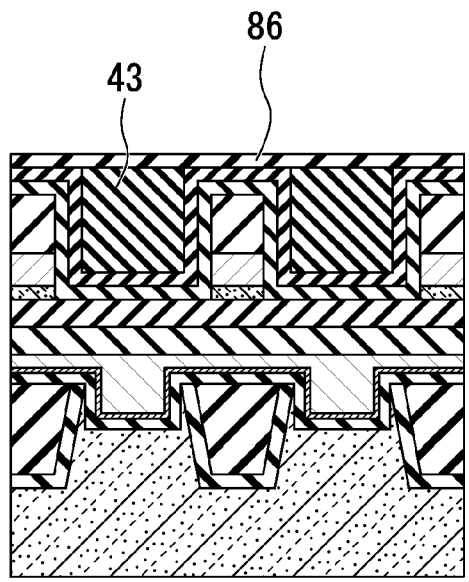
FIG. 39A is a fragmentary cross sectional elevation view, taken along the A-A' line of FIG. 2, illustrating the semiconductor device in a step, subsequent to the step of FIG. 38A, involved in the method of forming the semiconductor device in accordance with one embodiment of the present invention.
Figure 39B:
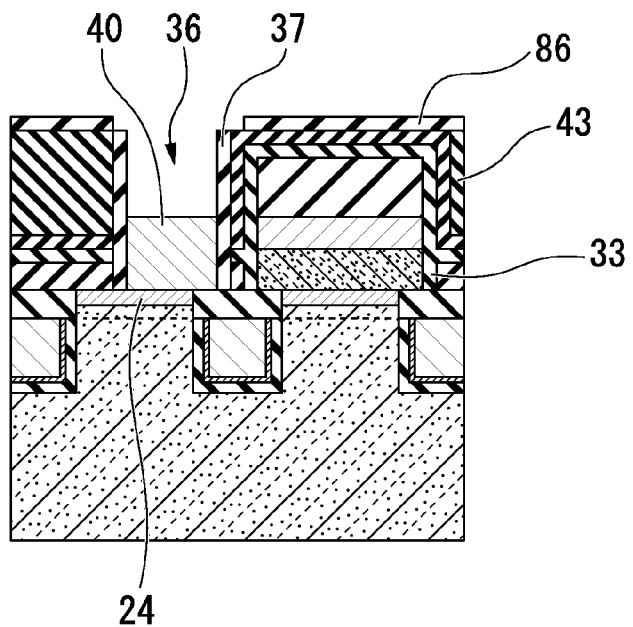
FIG. 39B is a fragmentary cross sectional elevation view, taken along the B-B' line of FIG. 2, illustrating the semiconductor device in a step, subsequent to the step of FIG. 38B, involved in the method of forming the semiconductor device in accordance with one embodiment of the present invention.

As shown in FIG. 39A and FIG. 39B, a polysilicon film that includes phosphorus is deposited so as to fill into the second contact aperture 36, and also so as to cover over the second interlayer insulating film 86. An etching process is performed so that the polysilicon film remains on the bottom part of the second contact aperture 36. By this etching process, a bottom part conducting film 40 made of a polysilicon film is formed.

Figure 40:
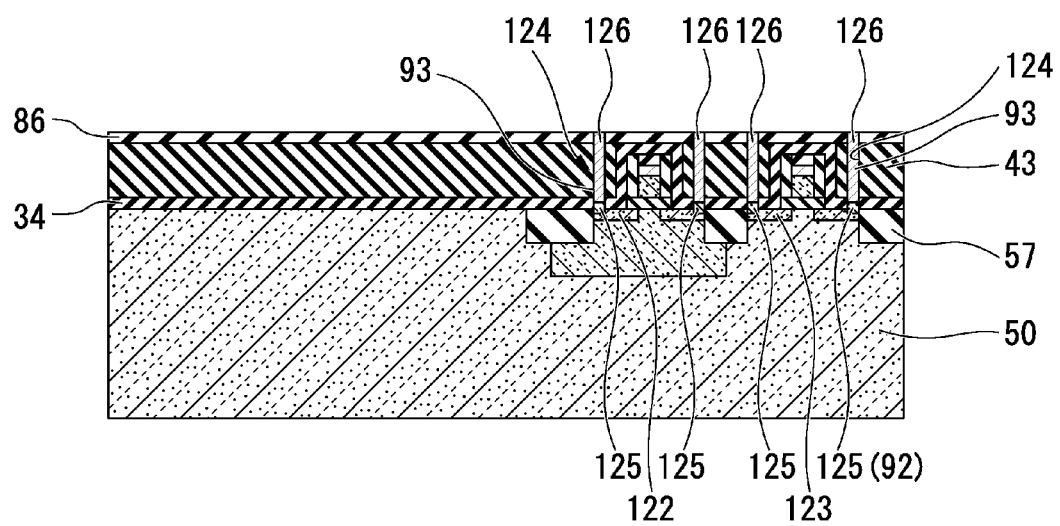
FIG. 40 is a fragmentary cross sectional elevation view illustrating the semiconductor device in a step, subsequent to the step of FIG. 37, involved in the method of forming the semiconductor device in accordance with one embodiment of the present invention.

As shown in FIG. 40, by an anisotropic dry etching process that uses a photoresist film (not shown) as a mask, a peripheral contact aperture 124 is formed so as to penetrate the second interlayer insulating film 86 and the deposited film 43 in the peripheral circuit region 102, and so as to expose the upper surface 50a of the semiconductor substrate 50. When this is done, the position of forming the peripheral contact aperture 124 is adjusted so that the second impurity diffusion layer 122 and the third impurity diffusion layer 123 are exposed at the bottom part of the peripheral contact aperture 124.

A silicide layers 125 made of cobalt silicide (CoSi) or the like are formed on parts of the bottom surfaces of the peripheral contact apertures 124, in which the second impurity diffusion layer 122 and the third impurity diffusion layer 123 are exposed.

Figure 41A:
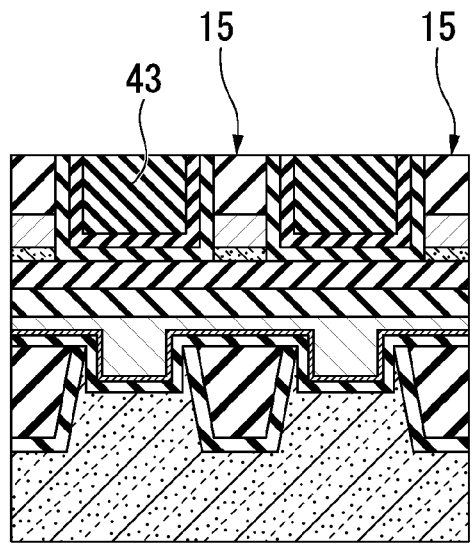
FIG. 41A is a fragmentary cross sectional elevation view, taken along the A-A' line of FIG. 2, illustrating the semiconductor device in a step, subsequent to the step of FIG. 39A, involved in the method of forming the semiconductor device in accordance with one embodiment of the present invention.
Figure 41B:
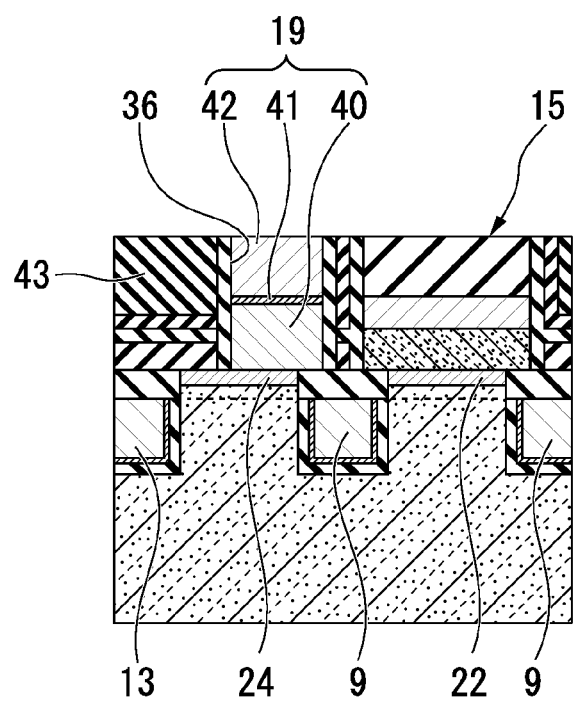
FIG. 41B is a fragmentary cross sectional elevation view, taken along the B-B' line of FIG. 2, illustrating the semiconductor device in a step, subsequent to the step of FIG. 39B, involved in the method of forming the semiconductor device in accordance with one embodiment of the present invention.

At this time, in the memory cell region 101, as shown in FIG. 41A and FIG. 41B, the silicide layer 125 is formed so as to cover the upper surface of the bottom part conducting film 40.

The metal film 42 made of tungsten or the like is formed so as to fill the inside of the peripheral contact aperture 124 in the peripheral circuit region 102 and the second contact aperture 36 in the memory cell region 101. Before the metal film 42 is formed, a barrier film such as a titanium nitride may be formed.

The CMP processing is performed to planarize the surface until the upper surface of the deposited film 43 in the memory cell region 101 and the second interlayer insulating film 86 in the peripheral circuit region 102 are exposed. The metal film 42 on the deposited film 43 and on the second interlayer insulating film 86 is removed.

By this CMP processing, a capacitor contact plug 19 of the three-layer structure made of the bottom part conducting film 40, the silicide layer 41, and the metal film 42 is formed in the memory cell region 101. Also, the peripheral contact plug 126 made of the silicide layer 41 (125) and the metal film 42 is formed in the peripheral circuit region 102. By this constitution, the peripheral contact plug 126 is conductive with the source or drain region of the transistor.

According to the present embodiment, as shown in FIG. 41B, the capacitor contact plug 19 is formed on the second high-concentration impurity diffusion layer 24 that is positioned between the adjacent first word line 9 and the second word line 13. The bit line 15 is formed on the first high-concentration impurity diffusion layer 22 that is positioned between the adjacent first word lines 9. Therefore, the capacitor contact plug 19 and the bit line 15 to be closely disposed on the first word line 9 having a groove structure. This contributes to the achievement of a microfine semiconductor device.

Figure 42A:
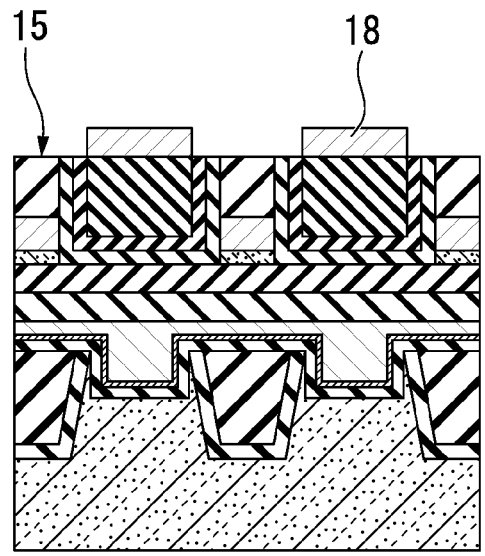
FIG. 42A is a fragmentary cross sectional elevation view, taken along the A-A' line of FIG. 2, illustrating the semiconductor device in a step, subsequent to the step of FIG. 41A, involved in the method of forming the semiconductor device in accordance with one embodiment of the present invention.
Figure 42B:
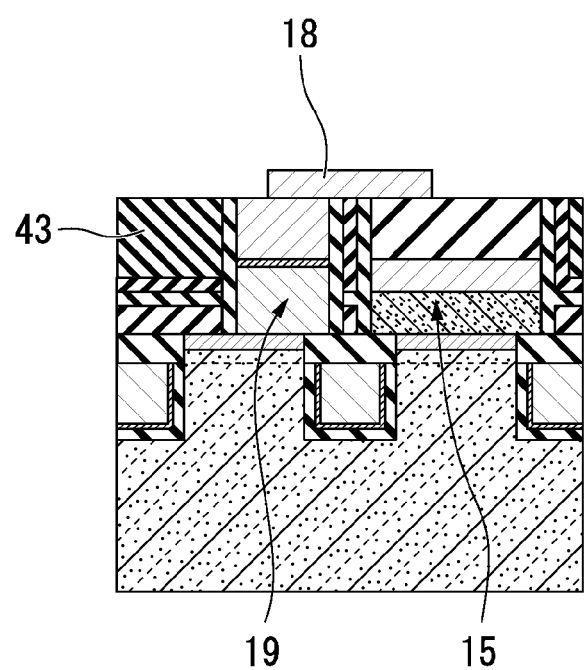
FIG. 42B is a fragmentary cross sectional elevation view, taken along the B-B' line of FIG. 2, illustrating the semiconductor device in a step, subsequent to the step of FIG. 41B, involved in the method of forming the semiconductor device in accordance with one embodiment of the present invention.
Figure 43:
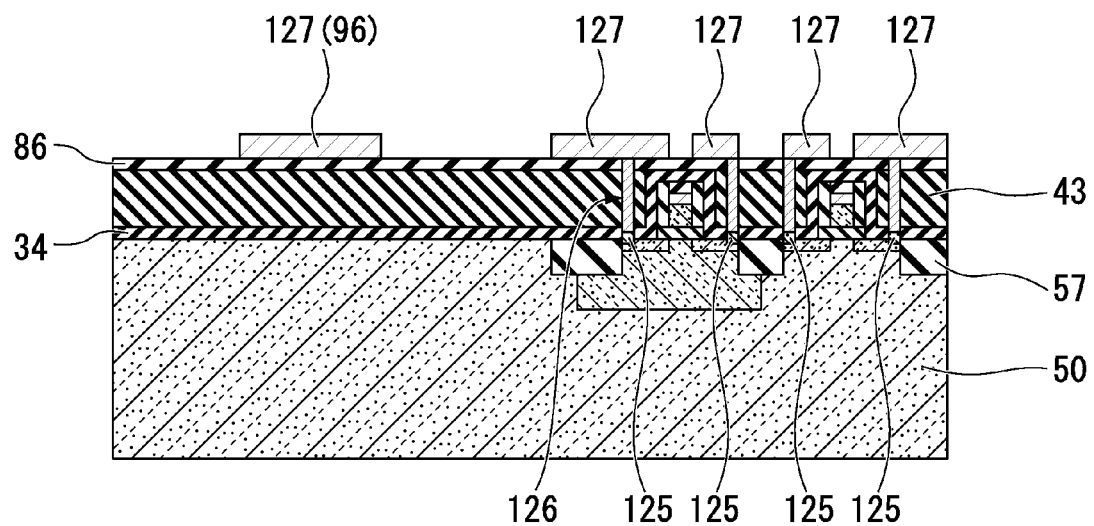
FIG. 43 is a fragmentary cross sectional elevation view illustrating the semiconductor device in a step, subsequent to the step of FIG. 40, involved in the method of forming the semiconductor device in accordance with one embodiment of the present invention.

As shown in FIG. 42A and FIG. 42B, tungsten nitride (WN) and tungsten (W) are deposited onto the memory cell region 101 and the peripheral circuit region 102 in this sequence so as to form a conductive layer made of a lamination thereof. Next, the conductive layer in the memory cell region 101 and in the peripheral circuit region 102 is simultaneously patterned. By this patterning, a capacitor contact pad 18 made of the conductive layer is formed in the memory cell region 101. As shown in FIG. 43, the local wiring 127 made of the conductive layer is formed simultaneously with the capacitor contact pad 18 in the peripheral circuit region 102.

As shown in FIG. 42A and FIG. 42B, the capacitor contact pad 18 is constituted so that it is connected to the capacitor contact plug 19. As shown in FIG. 43, the local wiring 127 is constituted so that it is connected to the peripheral contact plug 126.

The local wiring 127 may be conductive with another MOS transistor gate electrode or the like which is disposed in the peripheral circuit region 102 in a part not shown in the drawings.

Figure 44A:
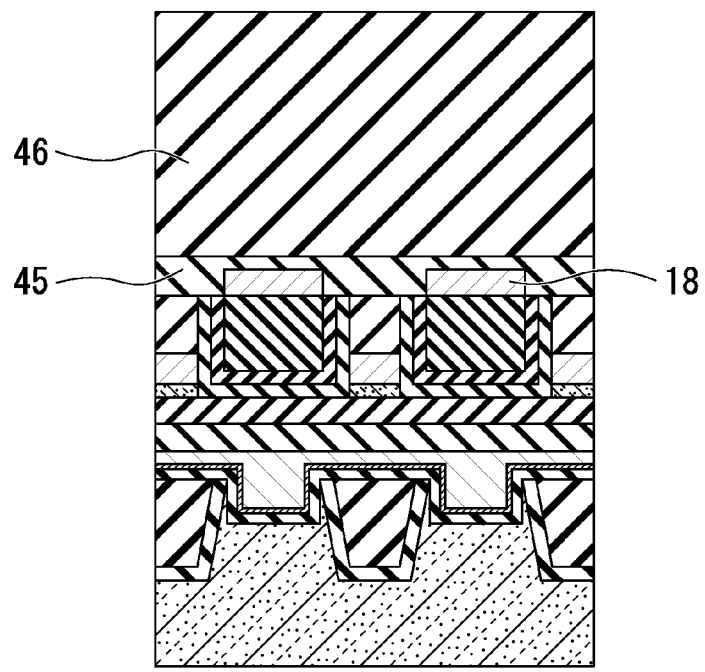
FIG. 44A is a fragmentary cross sectional elevation view, taken along the A-A' line of FIG. 2, illustrating the semiconductor device in a step, subsequent to the step of FIG. 42A, involved in the method of forming the semiconductor device in accordance with one embodiment of the present invention.
Figure 44B:
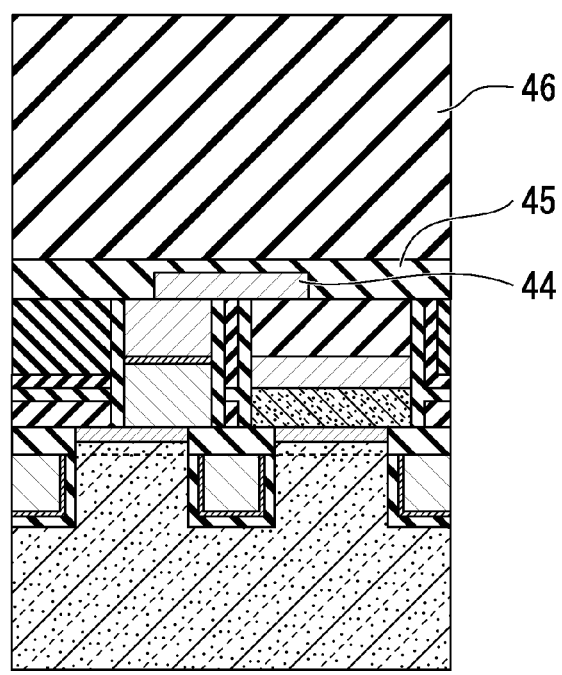
FIG. 44B is a fragmentary cross sectional elevation view, taken along the B-B' line of FIG. 2, illustrating the semiconductor device in a step, subsequent to the step of FIG. 42B, involved in the method of forming the semiconductor device in accordance with one embodiment of the present invention.
Figure 45:
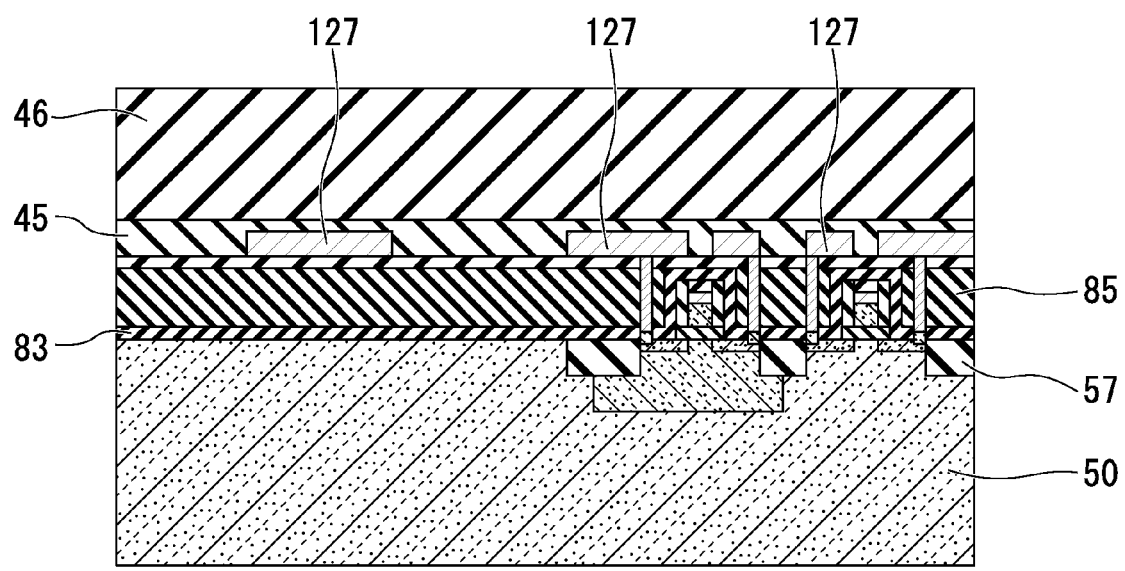
FIG. 45 is a fragmentary cross sectional elevation view illustrating the semiconductor device in a step, subsequent to the step of FIG. 43, involved in the method of forming the semiconductor device in accordance with one embodiment of the present invention.

As shown in FIG. 44A, FIG. 44B, and FIG. 45, the stopper film 45 made of a silicon nitride film and the third interlayer insulating film 46 made of a silicon oxide film or the like with a thickness of approximately 1 µm to 2 µm are laminated in this sequence so as to cover over the capacitor contact pad 18 in the memory cell region 101 and over the local wiring 127 in the peripheral circuit region 102. When this is done, the film thickness of the third interlayer insulating film 46 may be set arbitrarily according to the optimal capacitance of the capacitor placed in the memory cell region 101.

Figure 46A:
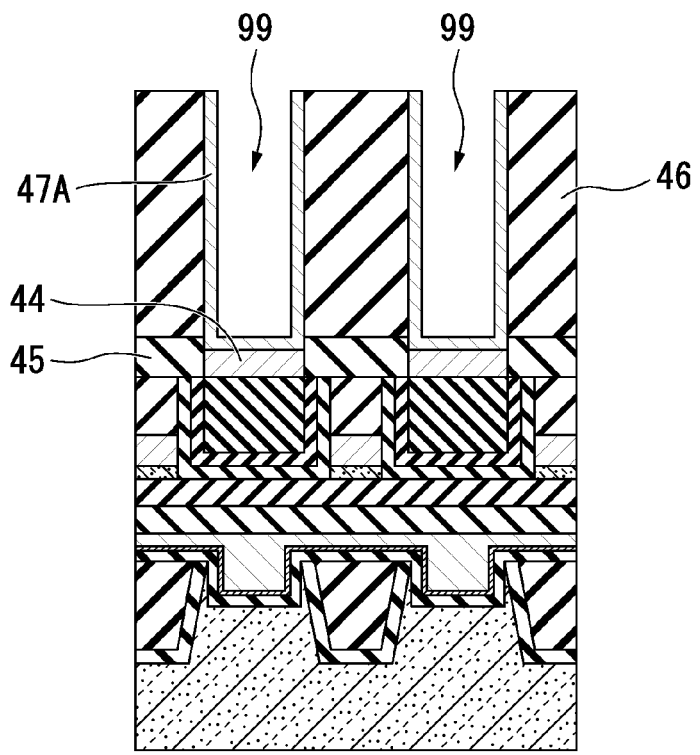
FIG. 46A is a fragmentary cross sectional elevation view, taken along the A-A' line of FIG. 2, illustrating the semiconductor device in a step, subsequent to the step of FIG. 44A, involved in the method of forming the semiconductor device in accordance with one embodiment of the present invention.
Figure 46B:
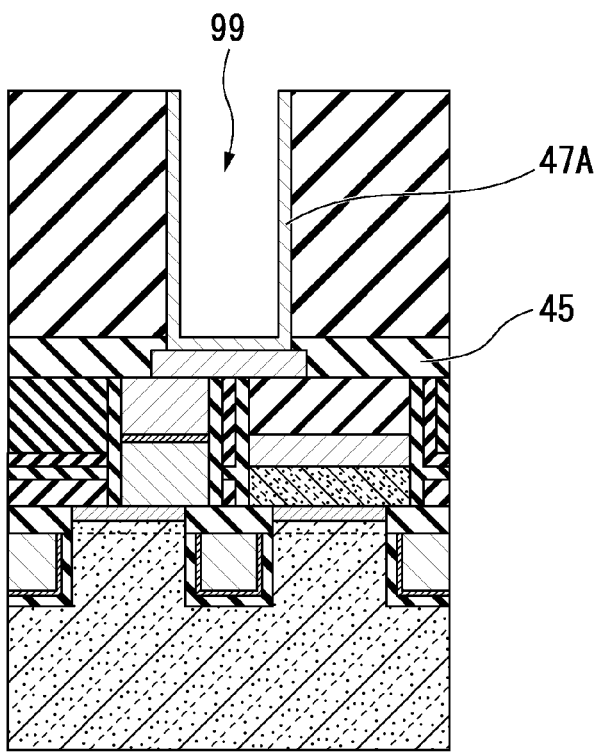
FIG. 46B is a fragmentary cross sectional elevation view, taken along the B-B' line of FIG. 2, illustrating the semiconductor device in a step, subsequent to the step of FIG. 44B, involved in the method of forming the semiconductor device in accordance with one embodiment of the present invention.

As shown in FIG. 46A and FIG. 46B, an aperture (contact aperture) 99 that penetrates the third interlayer insulating film 46 and the stopper film 45 is formed so as to expose the upper surface of the capacitor contact pad 18 in the memory cell region 101. A first electrode 47A made of titanium nitride or the like is formed so as to cover the inner wall surface of the aperture 99. The first electrode 47A functions as a lower electrode of the later-described capacitor element. The bottom part of the first electrode 47A is connected to the capacitor contact pad 18.

Figure 47A:
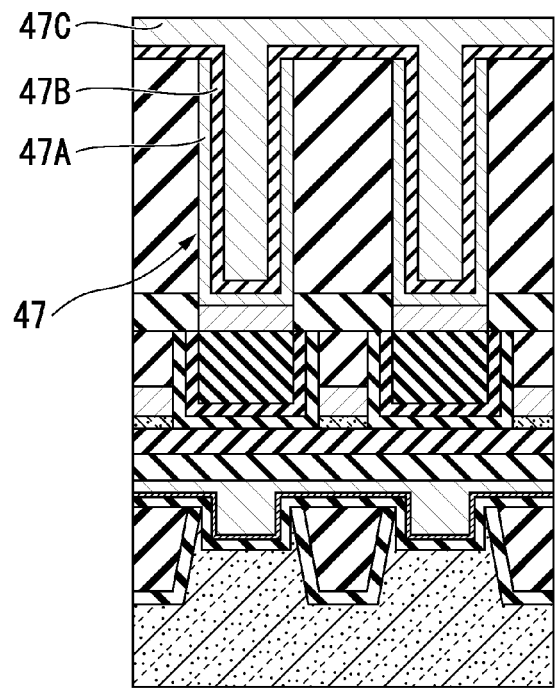
FIG. 47A is a fragmentary cross sectional elevation view, taken along the A-A' line of FIG. 2, illustrating the semiconductor device in a step, subsequent to the step of FIG. 46A, involved in the method of forming the semiconductor device in accordance with one embodiment of the present invention.
Figure 47B:
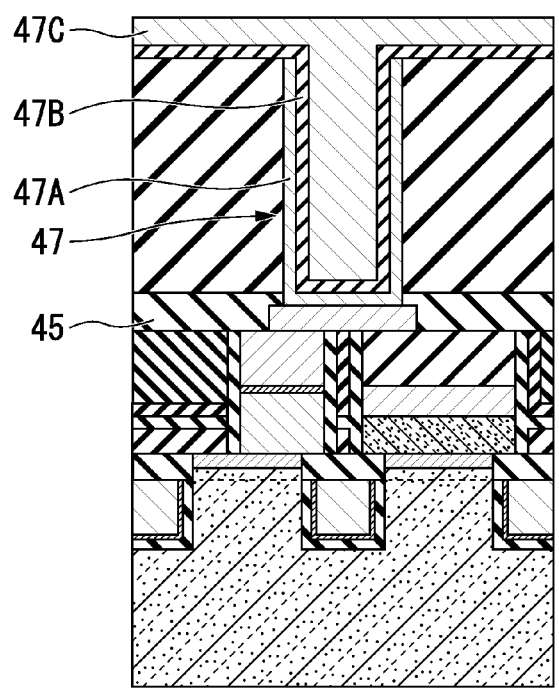
FIG. 47B is a fragmentary cross sectional elevation view, taken along the B-B' line of FIG. 2, illustrating the semiconductor device in a step, subsequent to the step of FIG. 46B, involved in the method of forming the semiconductor device in accordance with one embodiment of the present invention.

A capacitor 47 is formed as shown in FIG. 47A and FIG. 47B. First, a capacitive insulating film 47B is formed so as to cover the inner wall surface of a first electrode 47A. When this is done, zirconium oxide ($ZrO_2$), aluminum oxide ($Al_2O_3$), hafnium oxide ($HfO_2$) or laminated film thereof can be used as the capacitive insulating film 47B.

An upper electrode 47C made of titanium nitride or the like is formed so as to cover the inner wall surface of the capacitive insulating film 47B. The foregoing forms the capacitor 47.

Figure 48A:
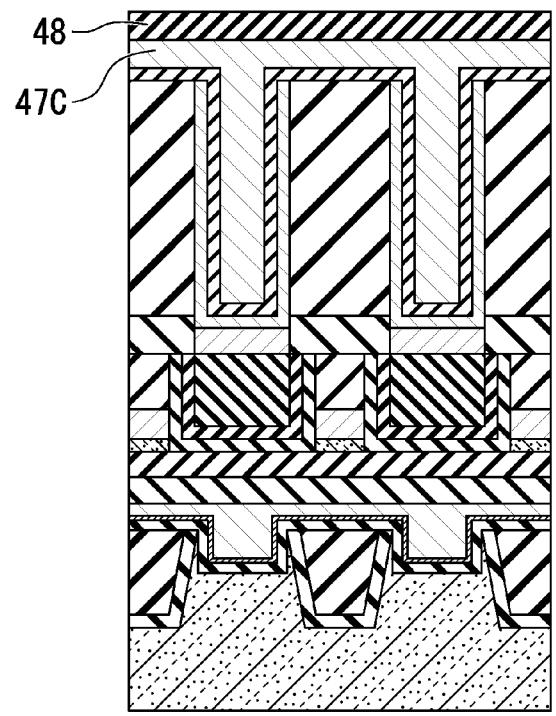
FIG. 48A is a fragmentary cross sectional elevation view, taken along the A-A' line of FIG. 2, illustrating the semiconductor device in a step, subsequent to the step of FIG. 47A, involved in the method of forming the semiconductor device in accordance with one embodiment of the present invention.
Figure 48B:
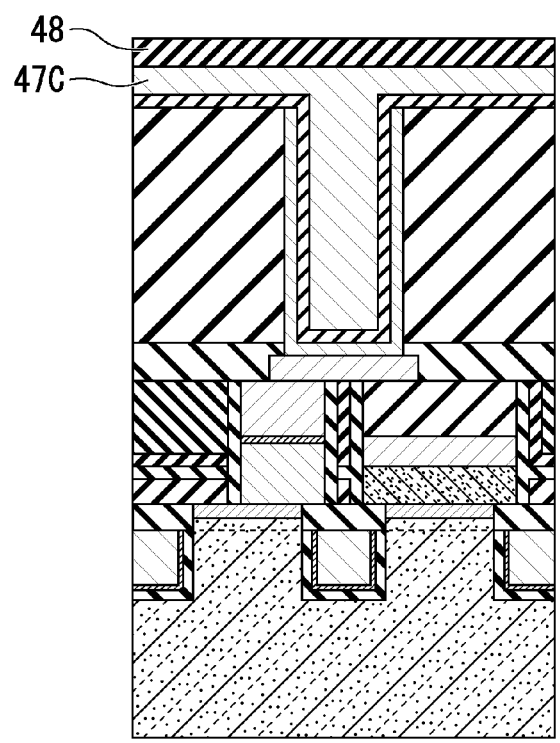
FIG. 48B is a fragmentary cross sectional elevation view, taken along the B-B' line of FIG. 2, illustrating the semiconductor device in a step, subsequent to the step of FIG. 47B, involved in the method of forming the semiconductor device in accordance with one embodiment of the present invention.
Figure 49:
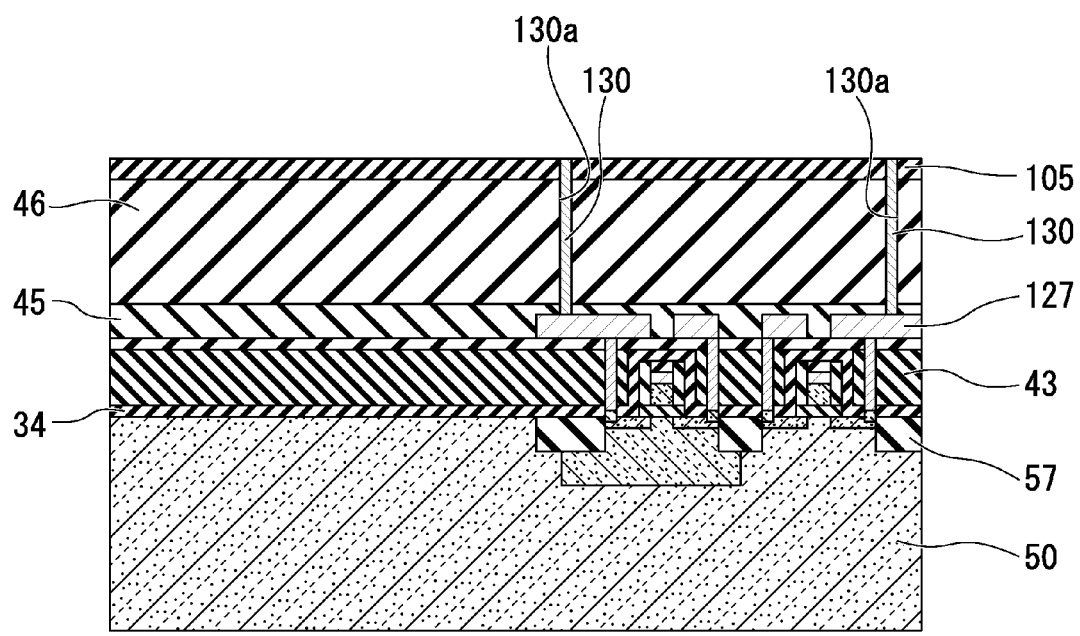
FIG. 49 is a fragmentary cross sectional elevation view illustrating the semiconductor device in a step, subsequent to the step of FIG. 45, involved in the method of forming the semiconductor device in accordance with one embodiment of the present invention.

As shown in FIG. 48A, FIG. 48B, and FIG. 49, the fourth interlayer insulating film 48 that is made of a silicon oxide film or the like is formed so as to cover over the upper electrode 47C in the memory cell region 101 and over the third interlayer insulating film 46 in the peripheral circuit region 102. After doing this, the local contact plug 130 that is connected to the local wiring 127 in the peripheral circuit region 102 is formed. The local contact plug 130 can be formed by filling with a metal film such as tungsten within a contact hole 130a that is formed so as to penetrate the stopper film 45, the third interlayer insulating film 46, and the fourth interlayer insulating film 48.

Figure 50A:
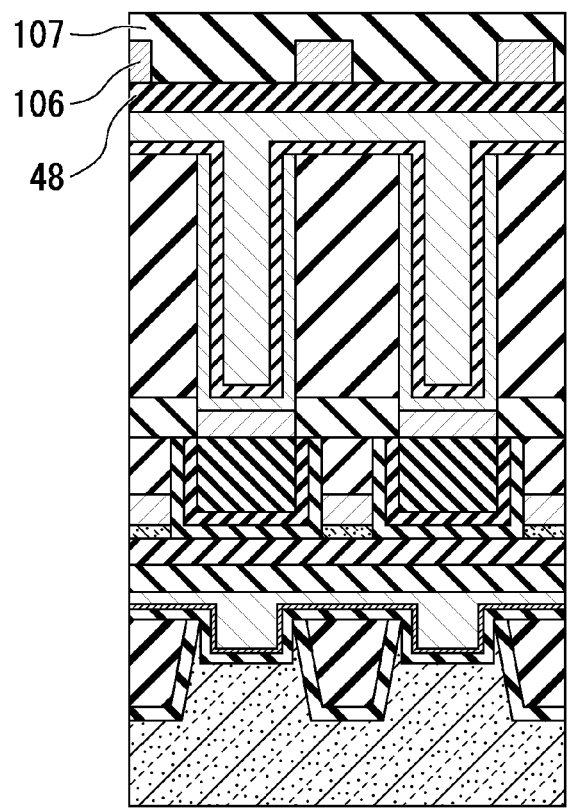
FIG. 50A is a fragmentary cross sectional elevation view, taken along the A-A' line of FIG. 2, illustrating the semiconductor device in a step, subsequent to the step of FIG. 48A, involved in the method of forming the semiconductor device in accordance with one embodiment of the present invention.
Figure 50B:
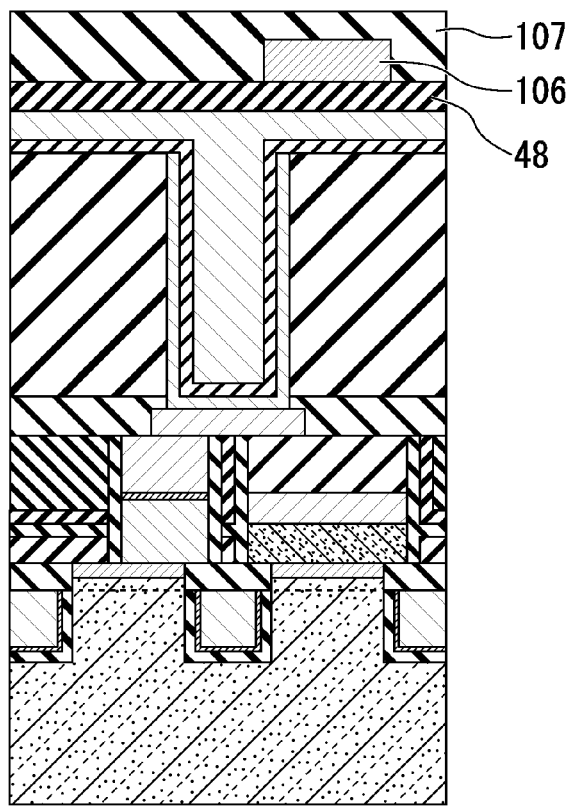
FIG. 50B is a fragmentary cross sectional elevation view, taken along the B-B' line of FIG. 2, illustrating the semiconductor device in a step, subsequent to the step of FIG. 48B, involved in the method of forming the semiconductor device in accordance with one embodiment of the present invention.
Figure 51:
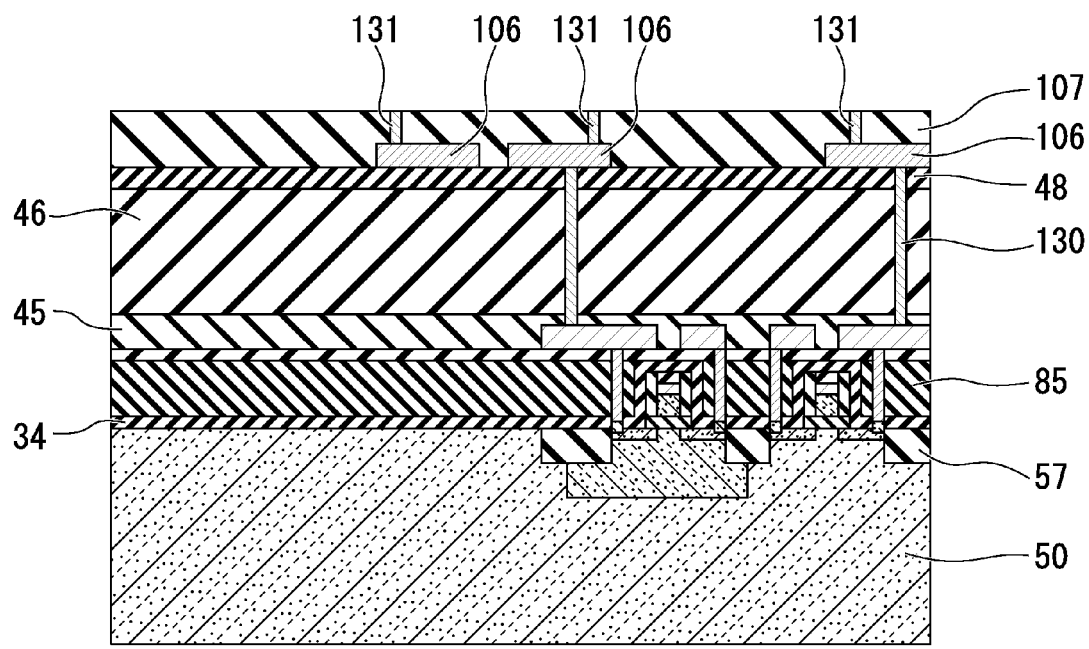
FIG. 51 is a fragmentary cross sectional elevation view illustrating the semiconductor device in a step, subsequent to the step of FIG. 49, involved in the method of forming the semiconductor device in accordance with one embodiment of the present invention.

As shown in FIG. 50A, FIG. 50B, and FIG. 51, the first wiring 106 that is made of aluminum (Al), copper (Cu) or the like is formed on the fourth interlayer insulating film 48 in the memory cell region 101 and in the peripheral circuit region 102. When this is done, as shown in FIG. 51, the first wiring 106 in the peripheral circuit region 102 is formed so as to be connected to the local contact plug 130. The fifth interlayer insulating film 107 that is made of a silicon oxide film or the like is formed so as to cover over the first wiring 106 in the memory cell region 101 and in the peripheral circuit region 102.

As shown in FIG. 51, the first contact plug 131 that is made of a metal film such as tungsten is formed so as to penetrate the fifth interlayer insulating film 107 and also so as to be connected to the first wiring 106.

Figure 52A:
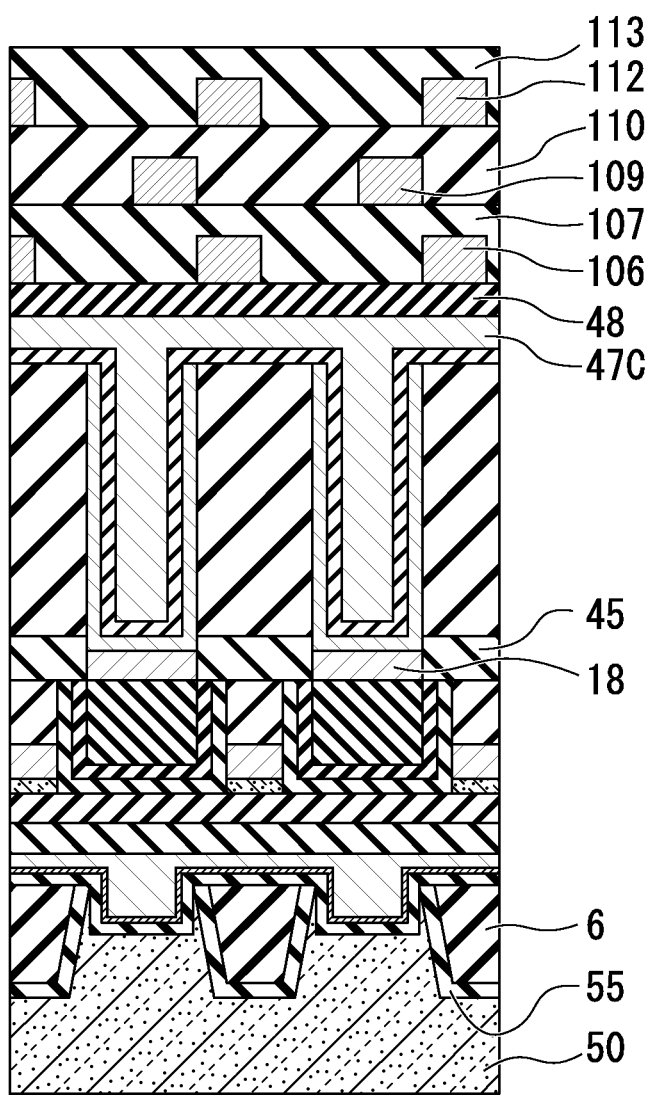
FIG. 52A is a fragmentary cross sectional elevation view, taken along the A-A' line of FIG. 2, illustrating the semiconductor device in a step, subsequent to the step of FIG. 50A, involved in the method of forming the semiconductor device in accordance with one embodiment of the present invention.
Figure 52B:
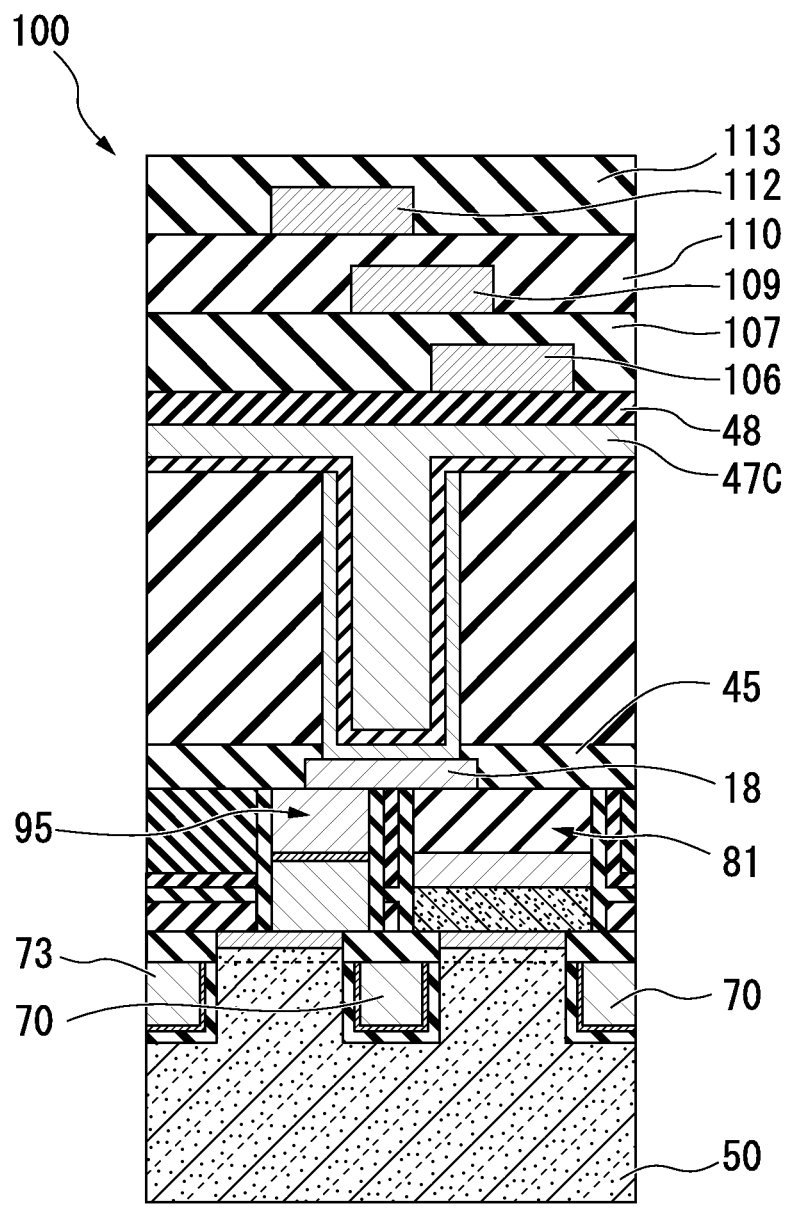
FIG. 52B is a fragmentary cross sectional elevation view, taken along the B-B' line of FIG. 2, illustrating the semiconductor device in a step, subsequent to the step of FIG. 50B, involved in the method of forming the semiconductor device in accordance with one embodiment of the present invention.

As shown in FIG. 52A and FIG. 52B, the second wiring 109 that is made of aluminum (Al), copper (Cu) or the like is formed on the fifth interlayer insulating film 107. When this is done, the second wiring 109 in the peripheral circuit region 102 is formed so as to be connected to the first contact plug 131.

The sixth interlayer insulating film 110 that is made of a silicon oxide film or the like is formed so as to cover the second wiring 109 in the memory cell region 101 and in the peripheral circuit region 102.

The third wiring 112 is formed on the interlayer insulating film 110. The third wiring 112 is the uppermost wiring layer and serves also as a pad for the purpose of bonding at the time of assembling the semiconductor chip. It is thus preferable that a metal film such as copper that tends to be naturally oxidized is avoided for use as the material of the third wiring 112. Aluminum, for example, can be used for the third wiring 112.

When this is done, the third wiring 112 is formed so as to be connected to the second contact plug 132. The protective film 113 made of a silicon oxynitride (SiON) film or the like is formed so as to cover the third wiring 112. The protective film 113 in the peripheral circuit region 102 is partially removed to expose the upper surface 112a of the third wiring 112. The exposed third wiring 112 functions as a bonding pad.

The foregoing completes the memory cell region 101 having a structure shown in FIG. 2 and FIG. 3, and the semiconductor device 100 providing the peripheral circuit region 102 shown in FIG. 4.

According to a method of forming the semiconductor device 100 of the first embodiment, after burying the word lines (the first word line 9 and the second word line 13) into the semiconductor substrate 50, the buried insulating film 11 made of silicon nitride is formed so as to bury the upper surface 69a of the word line. Because the silicon nitride tends not to be etched by hydrogen fluoride, when the first contact aperture 76 exposing the upper surface 11a of the buried insulating film 11 and the second contact aperture 36 are formed, it is possible to prevent the etching of the buried insulating film 11. It is thus possible to prevent the exposure of the upper surfaces of the word lines (the first word line 9 and the second word line 13). It is thus possible to prevent shorts between the word line and the capacitor contact plug 19 and between the word line and the bit line 15.

By preventing shorts between the word line and the capacitor contact plug 19 and between the word line and the bit line 15, it is possible to prevent the occurrence of operational failures of the semiconductor device 100. For this reason, the reliability of the semiconductor device 100 as well as manufacturing yield can be improved.

The silicon oxide film 62 is used as a part of a masking layer for forming the groove 65 for the purpose of burying the word line, thereby facilitating the processing in the case in which the buried insulating film 11 is formed using a silicon nitride film.

By simultaneously patterning the conductive layer formed in the memory cell region 101 and in the peripheral circuit region 102, it is possible to form the capacitor contact pad 18 in the memory cell region 101 and the local wiring 127 in the peripheral circuit region 102 simultaneously. The increase of manufacturing process steps can thus be suppressed.

Second Embodiment

Figure 56A:
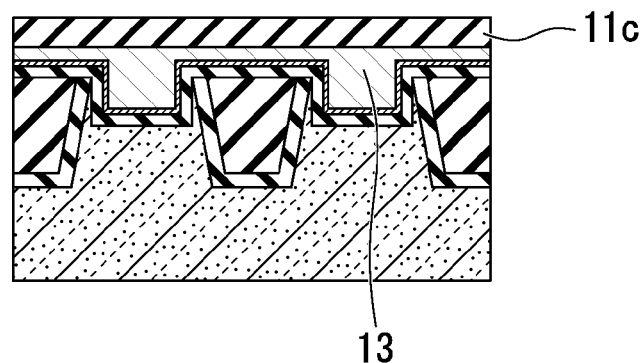
FIG. 56A is a fragmentary cross sectional elevation view, taken along the A-A' line of FIG. 2, illustrating the semiconductor device in a step, subsequent to the step of FIG. 55B, involved in the method of forming the semiconductor device in accordance with another embodiment of the present invention.
Figure 56B:
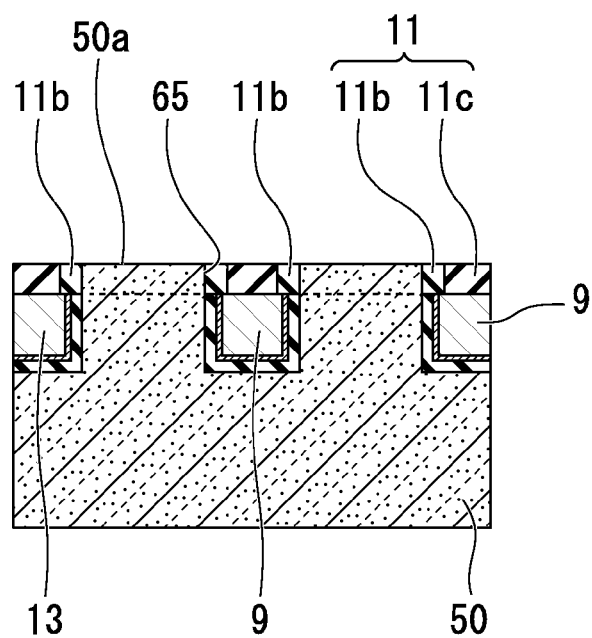
FIG. 56B is a fragmentary cross sectional elevation view, taken along the B-B' line of FIG. 2, illustrating the semiconductor device in a step, subsequent to the step of FIG. 55B, involved in the method of forming the semiconductor device in accordance with another embodiment of the present invention.

Referring to FIGS. 56A and 56B, one example of the semiconductor device 100 according to the second embodiment will be described. According to semiconductor device 100 of the second embodiment, the buried insulating film 11 is made of first buried insulating films 11b and a second buried insulating film 11c. The description regarding the parts that are the same as in the first embodiment will, therefore, be omitted. In FIGS. 56A and 56B, only the buried insulating film 11 will be described as being a part of the semiconductor device 100 and the peripheral region thereof according to the second embodiment.

As shown in FIG. 56A and FIG. 56B, the buried insulating film 11 is constituted by the first buried insulating films 11b covering the inner wall surfaces of groove 65 and the second buried insulating film 11c burying over the word lines on the inside of the groove 65 (the first word line 9 and the second word line 13). The second buried insulating film 11c is positioned between the first buried insulating films 11b. The first buried insulating film 11b and the second buried insulating film 11c are, for example, constituted of silicon nitride film that is formed by, for example, LP-CVD. The first buried insulating film 11b is formed with a thickness that does not fill into the inner side of the groove 65, such as approximately 10 nm.

Referring to FIG. 53 to FIG. 56, one example of a method of forming the semiconductor device 100 according to the second embodiment will be described. Because the method of forming the semiconductor device 100 according to the second embodiment is the same up until the process shown by FIG. 19, which is the first embodiment, the description up until the process shown by FIG. 19 will be omitted.

The first word line 9 and the second word line 13 are formed in the same manner as in the method for forming the semiconductor device 100 of the first embodiment.

Figure 53A:
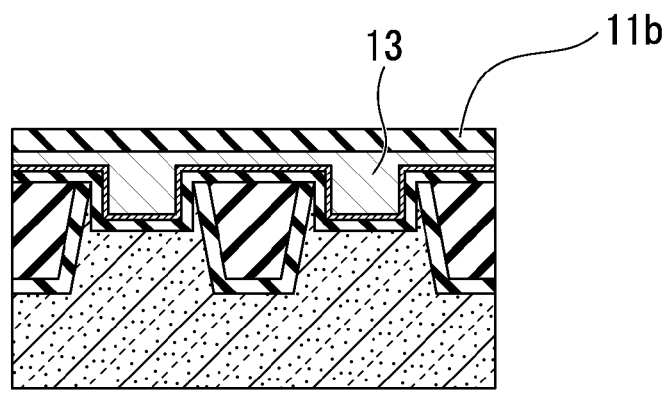
FIG. 53A is a fragmentary cross sectional elevation view, taken along the A-A' line of FIG. 2, illustrating the semiconductor device in a step involved in a method of forming the semiconductor device in accordance with another embodiment of the present invention.
Figure 53B:
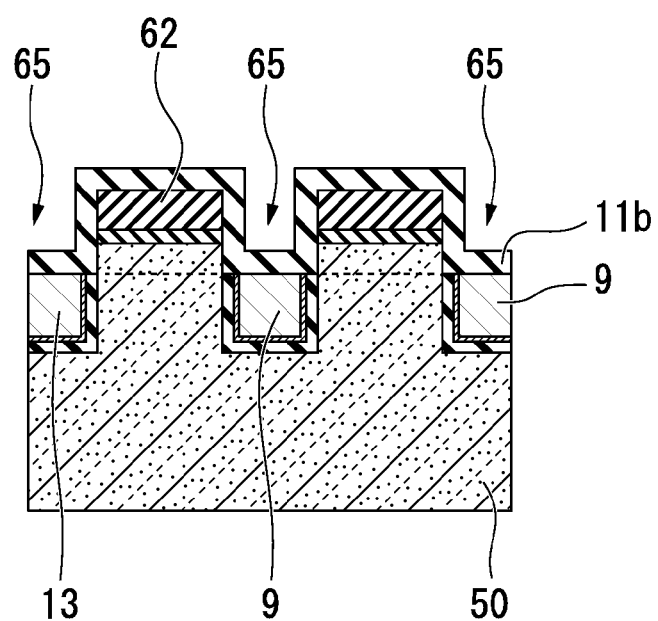
FIG. 53B is a fragmentary cross sectional elevation view, taken along the B-B' line of FIG. 2, illustrating the semiconductor device in a step involved in the method of forming the semiconductor device in accordance with another embodiment of the present invention.

As shown in FIG. 53A and FIG. 53B, the first buried insulating film 11b made of silicon nitride is formed by LP-CVD, for example, with a thickness of approximately 10 nm so as to cover the upper surfaces of the word lines (the first word line 9 and the second word line 13) and on the inner wall surface of the groove 65. When this is done, a film thickness of the first buried insulating film 11b is adjusted so that the inner part of the groove 65 is not filled completely.

Figure 54A:
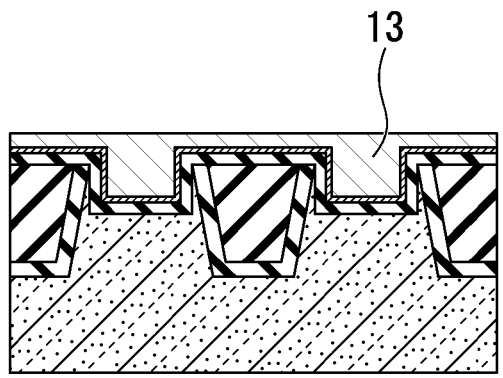
FIG. 54A is a fragmentary cross sectional elevation view, taken along the A-A' line of FIG. 2, illustrating the semiconductor device in a step, subsequent to the step of FIG. 53B, involved in a method of forming the semiconductor device in accordance with another embodiment of the present invention.
Figure 54B:
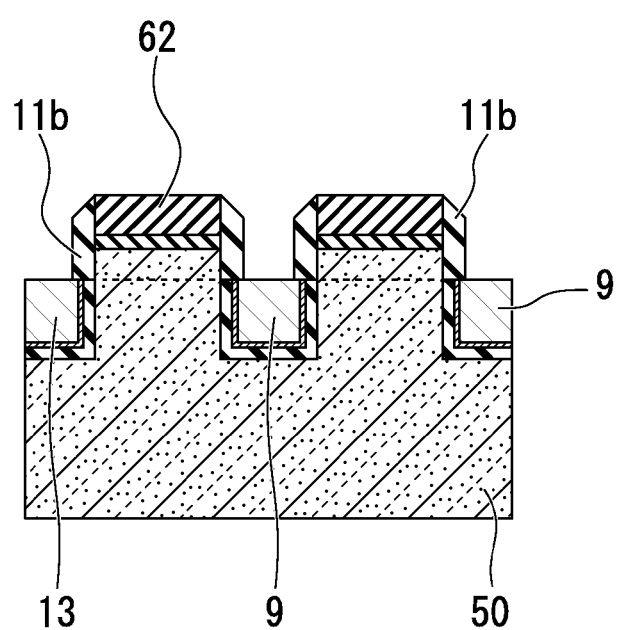
FIG. 54B is a fragmentary cross sectional elevation view, taken along the B-B' line of FIG. 2, illustrating the semiconductor device in a step, subsequent to the step of FIG. 53B, involved in the method of forming the semiconductor device in accordance with another embodiment of the present invention.

As shown in FIG. 54A and FIG. 54B, etching back of the first buried insulating film 11b is performed, and the side-wall shaped first buried insulating film 11b is left on the inner wall surface of the groove 65. By this etching back process, the film thickness of the upper part of the first buried insulating film 11b becomes thinner than that of the lower part thereof, and thins toward the upper direction. This etching back process exposes the upper surfaces of the word lines (the first word line 9 and the second word line 13).

Figure 55A:
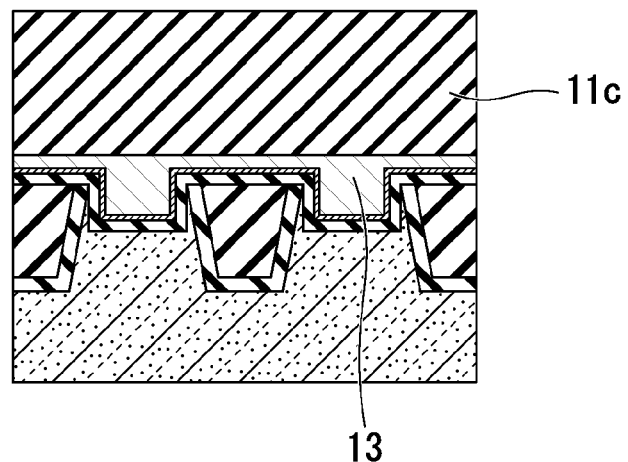
FIG. 55A is a fragmentary cross sectional elevation view, taken along the A-A' line of FIG. 2, illustrating the semiconductor device in a step, subsequent to the step of FIG. 54B, involved in the method of forming the semiconductor device in accordance with another embodiment of the present invention.
Figure 55B:
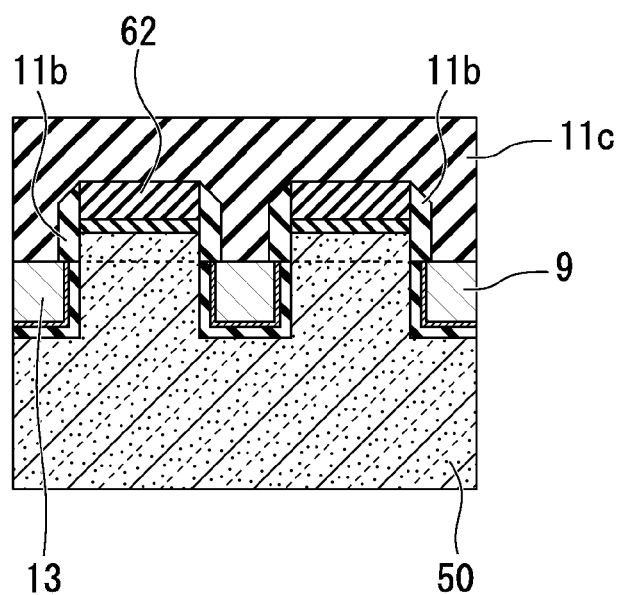
FIG. 55B is a fragmentary cross sectional elevation view, taken along the B-B' line of FIG. 2, illustrating the semiconductor device in a step, subsequent to the step of FIG. 54B, involved in the method of forming the semiconductor device in accordance with another embodiment of the present invention.

As shown in FIG. 55A and FIG. 55B, the second buried insulating film 11c made of silicon nitride is formed by LP-CVD to fill the inner part of the groove 65. By doing this, the upper surfaces of the word lines (the first word line 9 and the second word line 13) are constituted so as to be buried by the second buried insulating film 11c.

As shown in FIGS. 56A and 56B, the second buried insulating film 11c is etched back. When this is done, the etch back amount is adjusted so that the upper surface of the second buried insulating film 11c is substantially leveled with the upper surface 50a of the semiconductor substrate 50. By the foregoing, the buried insulating film 11 made of the first buried insulating film 11b to cover the inner wall surface of the groove 65 and the second buried insulating film 11c to bury over the word lines (the first word line 9 and the second word line 13) of the inner side of the groove 65 are formed.

Because the subsequent steps are similar to the first embodiment, the description of the method for manufacturing is omitted.

According to a method of forming the semiconductor device 100 of the second embodiment, after forming the first buried insulating film 11b so as to cover the inner wall of the groove 65, the first buried insulating film 11b is etched back, thereby enabling formation of the first buried insulating film 11b with a shape in which film thickness is thinner toward the upper direction. By doing this, it is possible to prevent occlusion of the upper part of the groove 65 when the second buried insulating film 11c is filled into the groove 65. For this reason, even if advances in microfine structure of the semiconductor device 100 make the aspect ratio of the groove 65 increases, it is possible to easily bury the second buried insulating film 11c within the groove 65 without the occurrence of voids within the inner part thereof.

Although, in the above embodiments, the case of the formation of DRAM (the semiconductor device 100) has been described, the present invention is not limited to a DRAM, and can be applied if the semiconductor device has a memory cell having a constitution in which the word line is buried into the semiconductor substrate. Specifically, for example, up until the formation of the capacitor contact plug 19 may be the same as in the first embodiment, and a memory element instead of the capacitor 8 is connected to the capacitor contact plug 19. For example, an element in which a phase change material such as chalcogenide may be interposed between electrodes and used as the memory element. By forming the semiconductor device using such an element, it is possible to form a phase change memory (PRAM). An element in which a resistance change material layer having a resistance value that changes by the application of voltage is interposed between electrodes can be used thereby enabling formation of a variable resistance memory (ReRAM).

Third Embodiment

Figure 57:
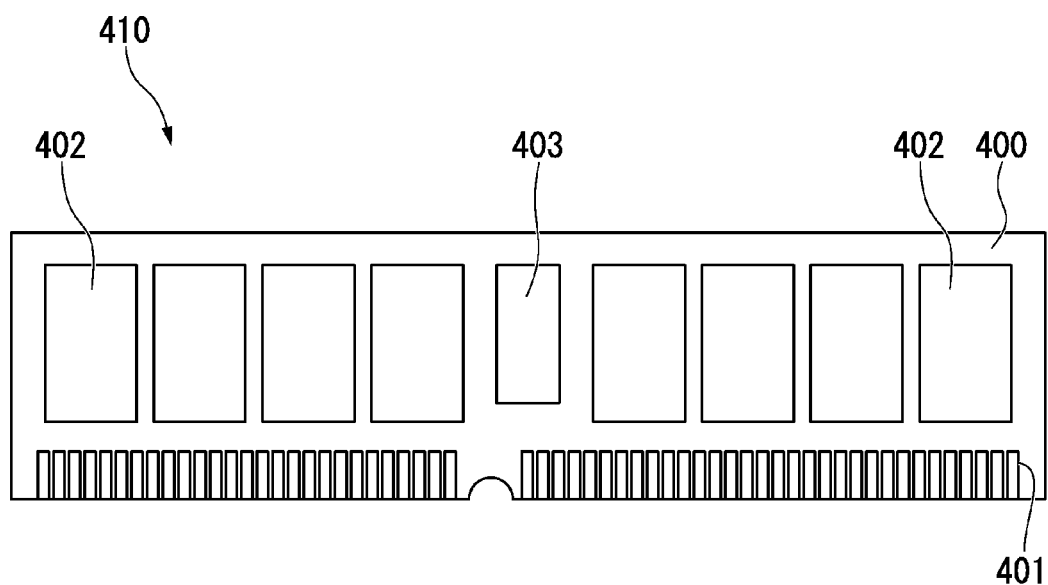
FIG. 57 is a conceptual diagram of a semiconductor device including a memory module in accordance with still another embodiment of the present invention.

Referring to FIG. 57, a memory module having a DRAM according to the present embodiment will be described. FIG. 57 is a schematic plan view of a semiconductor memory module 410.

The semiconductor memory module 410 may include, but is not limited to, packages 402 including DRAM chips, an interface chip 403, and input/output terminals 401. Each constituent element will be described in detail hereinafter.

In the semiconductor memory module 410 of the present embodiment, for example, eight packages 402 and one interface chip 403 are mounted on a printed circuit board 400. The interface chip 403 may not be mounted on the printed board 400.

The package 402 is a package that incorporates a semiconductor chip operating as a DRAM, and that is mounted on the printed board 400. An example of the package type is a BOA structure. The package is formed by a widely known means using a fragmented semiconductor chip.

The printed board 400 is provided with a plurality of input/output terminals (I/O terminals) 401 for the purpose of electrically connecting the package 402 to an external device. By this constitution, for example, the external memory controller inputs and outputs data to and from each package 402 via the input/output terminals.

The interface chip 403 is a chip for controlling input and output of data to and from each of the packages 402. The interface chip 403 adjusts the timing of a clock signal and a command address signal supplied from the outside of the semiconductor memory module 410 and forms and supplies a signal waveform to each package 402.

The semiconductor memory module 410 of the present embodiment uses an integrated semiconductor device (package 402) according to the first and second embodiments with a high level of integration. It is thus possible not only to meet the requirements for microstructures but also to achieve mass data storage.

Figure 58:
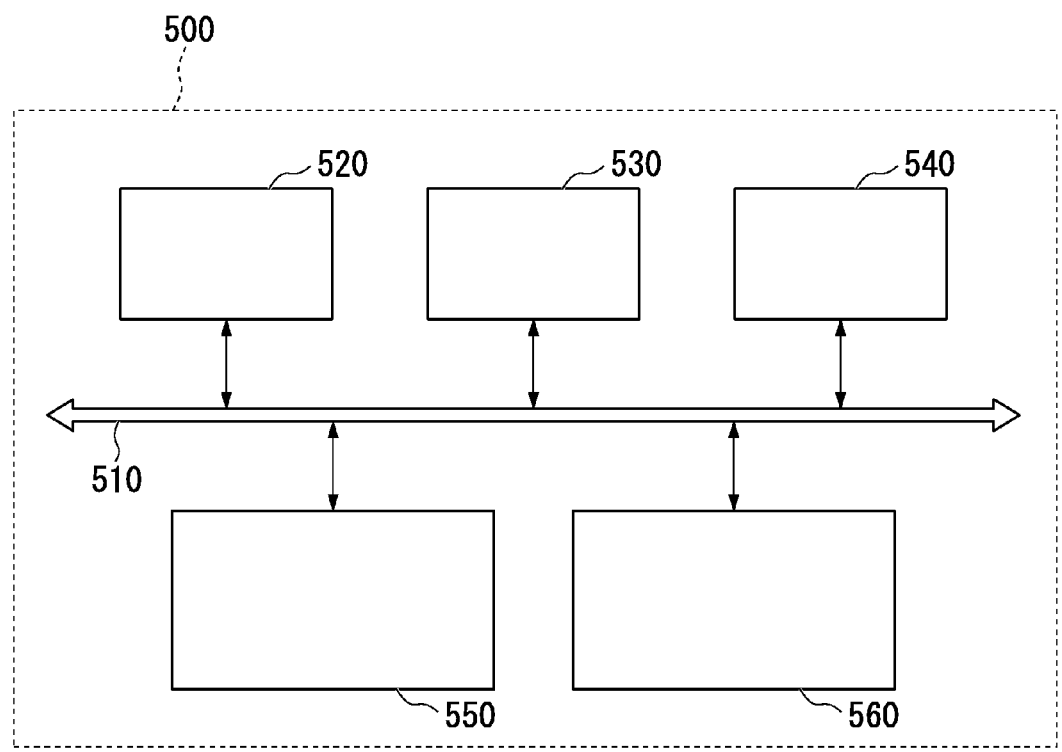
FIG. 58 is a schematic block diagram illustrating a configuration of a data processing system having a DRAM in accordance with still another embodiment of the present invention.

A data processing system 500 applied to the present embodiment will be described, referring to FIG. 58. FIG. 58 is a simplified block diagram of the data processing system 500 of the present embodiment. The data processing system 500 is one example of a system having the above-noted semiconductor devices 100 and 410.

The data processing system 500 includes a data processor 520 and a DRAM memory module 530 to which the above-noted present embodiment is applied.

Although the data processor 520 is mutually connected to the above-noted DRAM memory module 530 via a system bus 501, it may be connected by a local bus without the intervening system bus 501. Although one system bus 501 is illustrated in FIG. 58, it may be connected serially or in parallel, via a connector or the like, if necessary.

Examples of the data processor 520 include a MPU (microprocessing unit) or a DSP (digital signal processor). The DRAM memory module 530 has the semiconductor devices 100 and 410 that are formed using the present embodiment.

In the data processing system 500, if necessary, a non-volatile storage device 550, an input/output device 560, and a ROM (read only memory) 540 are connected to a system bus 510, although this is not an essential constituent element.

The ROM 540 is used as storage of fixed data. A hard disk, an optical drive, an SSD (solid state drive) or the like can be used as the non-volatile storage device 550. The input/output device 560 includes, for example, a display device such as a liquid-crystal display, or a data input device such as a keyboard. The input/output device 560 encompasses the case of having only an input device and the case of having only an output device.

As shown in FIG. 58, although the number of each constituent element is only one for the purpose of simplification, the number of each constituent element is not particularly limited, and encompasses the case of at least one or more. Although the data processing system 500 includes, for example, a computer system, it is not necessarily limited to this.

The semiconductor memory module 410 of the present embodiment can achieve high-speed data processing by virtue of having the semiconductor devices 100 and 410 that use the present embodiment.

Specifically, in the semiconductor device 100 according to the present embodiment, because at least one of the bit line 15 and the capacitor contact plug 19 is formed so as to overlap with a part of the buried insulating film 11, the level of integration of the semiconductor device 100 is improved. Because the DRAM package 402 having the semiconductor device 100 having a high level of integration is provided in the semiconductor memory module 410 according to the present embodiment, it is possible to form the data processing system 500 with a large memory capacity as well as high performance. Because the reliability of the semiconductor device 100 according to the present embodiment is improved, it is possible to suppress the occurrence of operational failures of the data processing system 500.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

The term "configured" is used to describe a component, section or part of a device includes hardware that is constructed to carry out the desired function.

Furthermore, the particular features, structures, or characteristics may be combined in any suitable manner in one or more embodiments.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A semiconductor device comprising:
   an active semiconductor region;
   a groove selectively formed to cross the active semiconductor region so that first and second portions sandwiching the groove are defined in the active semiconductor region;
   source and drain regions formed in the first and second portions, respectively;

a word line partially filling the groove with an intervention of a gate insulating film between the word line and the groove;
a buried insulating film filling the groove to cover the word line;
a bit line elongated in a direction crossing the word line, the bit line including a portion that is formed over and electrically connected with one of the source and drain regions;
a contact plug formed over and electrically connected with the other of the source and drain regions so that a gap is formed over the buried insulating film and between the contact plug and the portion of the bit line;
a capacitor formed over and electrically connected with the contact plug; and
first, second and third insulating films in the gap, the first insulating film being sandwiched between the second and third insulating films, the second insulating film being in contact with the portion of the bit line and penetrating through the first insulating film to contact the third insulating film, and the third insulating film contacting the contact plug and the first insulating film;
wherein each of the buried insulating film and the second and third insulating films comprises a silicon nitride film, and
wherein the first insulating film is different in material from the silicon nitride film.

2. The semiconductor device according to claim 1, wherein each of the bit line and the contact plug comprises a plurality of conductive layers.

3. The semiconductor device according to claim 2, further comprising:
a first conductive layer of the bit line being in direct contact with one of the source and drain regions;
a first conductive layer of the contact plug being in direct contact with the other of the source and drain regions.

4. The semiconductor device according to claim 3, wherein the first conductive layer of the contact plug is substantially equal in material to the first conductive layer of the bit line.

5. The semiconductor device according to claim 4, wherein each of the first conductive layers of the bit line and the contact plug comprises an impurity doped silicon film.

6. The semiconductor device according to claim 3, wherein a second conductive layer of the bit line stacked on the first conductive layer of the bit line is substantially equal in material to a second conductive layer of the contact plug stacked on the first conductive layer of the contact plug.

7. The semiconductor device according to claim 6, wherein each of the second conductive layers of the bit line and the contact plug comprises a tungsten film.

8. The semiconductor device according to claim 6, further comprising:
a silicide layer intervening between the first and second conductive layers of the contact plug.

9. The semiconductor device according to claim 6, further comprising:
a mask insulating film stacked on the second conductive layer of the bit line being substantially equal in width to the bit line, the mask insulating film comprising a silicon nitride film.

10. The semiconductor device according to claim 9, wherein the capacitor partially overlaps the portion of the bit line with an intervention of the mask insulating film therebetween.

11. The semiconductor device according to claim 1, wherein each of the bit line and the contact plug partially overlaps the buried insulating film.

12. A semiconductor device comprising:
an active semiconductor region;
a groove crossing the active semiconductor region to define source and drain regions;
a word line partially filling the groove with an intervening gate insulating film between the word line and the groove;
a buried insulating film filling the groove and covering the word line;
a bit line elongated in a direction crossing the word line, the bit line including a portion that is formed over and electrically connected with one of the source and drain regions;
a contact plug formed over and electrically connected with the other of the source and drain regions so that a gap is formed over the buried insulating film and between the contact plug and the portion of the bit line;
a capacitor formed over and electrically connected with the contact plug; and
first, second and third insulating films in the gap, the first insulating film being sandwiched between the second and third insulating films, the second insulating film penetrating through a gap in the first insulating film to contact the third insulating film so as to form an H-shaped configuration;
wherein each of the buried insulating film and the second and third insulating films comprises a silicon nitride film, and
wherein the first insulating film is different in material from the silicon nitride film.

13. The semiconductor device according to claim 12, wherein each of the bit line and the contact plug comprises a plurality of conductive layers.

14. The semiconductor device according to claim 13, further comprising:
a first conductive layer of the bit line being in direct contact with one of the source and drain regions;
a first conductive layer of the contact plug being in direct contact with the other of the source and drain regions.

15. The semiconductor device according to claim 14, wherein the first conductive layer of the contact plug is substantially equal in material to the first conductive layer of the bit line.

16. The semiconductor device according to claim 15, wherein each of the first conductive layers of the bit line and the contact plug comprises an impurity doped silicon film.

17. The semiconductor device according to claim 14, wherein a second conductive layer of the bit line stacked on the first conductive layer of the bit line is substantially equal in material to a second conductive layer of the contact plug stacked on the first conductive layer of the contact plug.

18. The semiconductor device according to claim 17, wherein each of the second conductive layers of the bit line and the contact plug comprises a tungsten film.

19. The semiconductor device according to claim 17, further comprising:
a silicide layer intervening between the first and second conductive layers of the contact plug.

20. The semiconductor device according to claim 17, further comprising:
a mask insulating film stacked on the second conductive layer of the bit line being substantially equal in width to the bit line, the mask insulating film comprising a silicon nitride film.

* * * * *